US012568648B2

(12) United States Patent
Lu et al.

(10) Patent No.: US 12,568,648 B2
(45) Date of Patent: Mar. 3, 2026

(54) BACKSIDE SOURCE/DRAIN CONTACTS AND METHODS OF FORMING THE SAME

(71) Applicant: Taiwan Semiconductor Manufacturing Co., Ltd., Hsinchu (TW)

(72) Inventors: Wei Hao Lu, Taoyuan (TW); Li-Li Su, Chubei (TW); Chien-I Kuo, Taibao (TW); Yee-Chia Yeo, Hsinchu (TW); Wei-Yang Lee, Taipei (TW); Yu-Xuan Huang, Hsinchu (TW); Ching-Wei Tsai, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 724 days.

(21) Appl. No.: 17/557,983

(22) Filed: Dec. 21, 2021

(65) Prior Publication Data

US 2022/0359679 A1       Nov. 10, 2022

Related U.S. Application Data

(60) Provisional application No. 63/184,569, filed on May 5, 2021.

(51) Int. Cl.
*H10D 30/62* (2025.01)
*H01L 21/02* (2006.01)
(Continued)

(52) U.S. Cl.
CPC ..... *H10D 30/6729* (2025.01); *H01L 21/0259* (2013.01); *H10D 30/031* (2025.01);
(Continued)

(58) Field of Classification Search
None
See application file for complete search history.

(56) References Cited

U.S. PATENT DOCUMENTS 9,209,247 B2    12/2015  Colinge et al.
9,236,267 B2    1/2016   De et al.
(Continued)

FOREIGN PATENT DOCUMENTS

CN        110349968 A     10/2019
CN        110556424 A     12/2019
(Continued)

*Primary Examiner* — Kretelia Graham
*Assistant Examiner* — William Henry Anderson
(74) *Attorney, Agent, or Firm* — Slater Matsil, LLP

(57) ABSTRACT

A semiconductor device, includes a device layer comprising: a channel region; a gate stack over and along sidewalls of the channel region and a first insulating fin; and an epitaxial source/drain region adjacent the channel region, wherein the epitaxial source/drain region extends through the first insulating fin. The semiconductor device further includes a front-side interconnect structure on a first side of the device layer; and a backside interconnect structure on a second side of the device layer opposite the first side of the device layer. The backside interconnect structure comprises a backside source/drain contact that is electrically connected to the epitaxial source/drain region.

20 Claims, 72 Drawing Sheets

(51) Int. Cl.

| | |
|---|---|
| *H10D 30/01* | (2025.01) |
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |
| *H01L 23/528* | (2006.01) |

(52) U.S. Cl.

CPC ......... *H10D 30/62* (2025.01); *H10D 30/6713* (2025.01); *H10D 30/6735* (2025.01); *H10D 30/6757* (2025.01); *H10D 62/118* (2025.01); *H10D 64/01* (2025.01); *H10D 64/017* (2025.01); *H10D 64/251* (2025.01); *H10D 64/254* (2025.01); *H10D 84/0158* (2025.01); *H10D 84/038* (2025.01); *H10D 84/834* (2025.01); *H01L 23/5286* (2013.01); *H10D 30/6219* (2025.01); *H10D 84/83* (2025.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,780,210 | B1 | 10/2017 | Goktepeli et al. |
| 10,734,412 | B2 | 8/2020 | Glass et al. |
| 11,315,837 | B2 | 4/2022 | Lee et al. |
| 11,581,414 | B2 * | 2/2023 | Liaw ................. H10D 84/0151 |
| 11,610,983 | B2 | 3/2023 | Chiang et al. |
| 11,721,628 | B2 | 8/2023 | Kim et al. |
| 11,837,639 | B2 | 12/2023 | Choi |
| 12,199,097 | B2 * | 1/2025 | Jhan .................... H10D 62/121 |
| 12,317,548 | B2 | 5/2025 | Lin et al. |
| 2019/0067450 | A1 * | 2/2019 | Ching ............. H01L 21/31051 |
| 2019/0115424 | A1 | 4/2019 | Park et al. |
| 2019/0157310 | A1 * | 5/2019 | Glass .................. H10D 64/254 |
| 2019/0252261 | A1 * | 8/2019 | Wang ................. H01L 29/7851 |
| 2019/0305111 | A1 * | 10/2019 | Subramanian ..... H10D 84/0158 |
| 2020/0058649 | A1 * | 2/2020 | Ching ................. H10D 84/013 |
| 2020/0212192 | A1 | 7/2020 | Xie et al. |
| 2021/0028112 | A1 * | 1/2021 | Kim ................. H01L 29/41791 |
| 2021/0028281 | A1 * | 1/2021 | Kim ................. H01L 29/66795 |
| 2021/0407993 | A1 * | 12/2021 | Ju ........................ H10D 62/121 |
| 2022/0173097 | A1 * | 6/2022 | Yang ................. H10D 84/834 |
| 2022/0231158 | A1 | 7/2022 | Chang et al. |

FOREIGN PATENT DOCUMENTS

| | | |
|---|---|---|
| CN | 112289774 A | 1/2021 |
| KR | 20190015269 A | 2/2019 |
| KR | 20190024564 A | 3/2019 |
| KR | 20190036533 A | 4/2019 |
| KR | 20200138679 A | 12/2020 |
| KR | 20210012084 A | 2/2021 |
| KR | 20210045906 A | 4/2021 |
| TW | 202042399 A | 11/2020 |
| TW | 202113965 A | 4/2021 |
| TW | 202117853 A | 5/2021 |

* cited by examiner

BACKSIDE SOURCE/DRAIN CONTACTS AND METHODS OF FORMING THE SAME

PRIORITY CLAIM AND CROSS-REFERENCE

This application claims the benefit of U.S. Provisional Application No. 63/184,569, filed on May 5, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
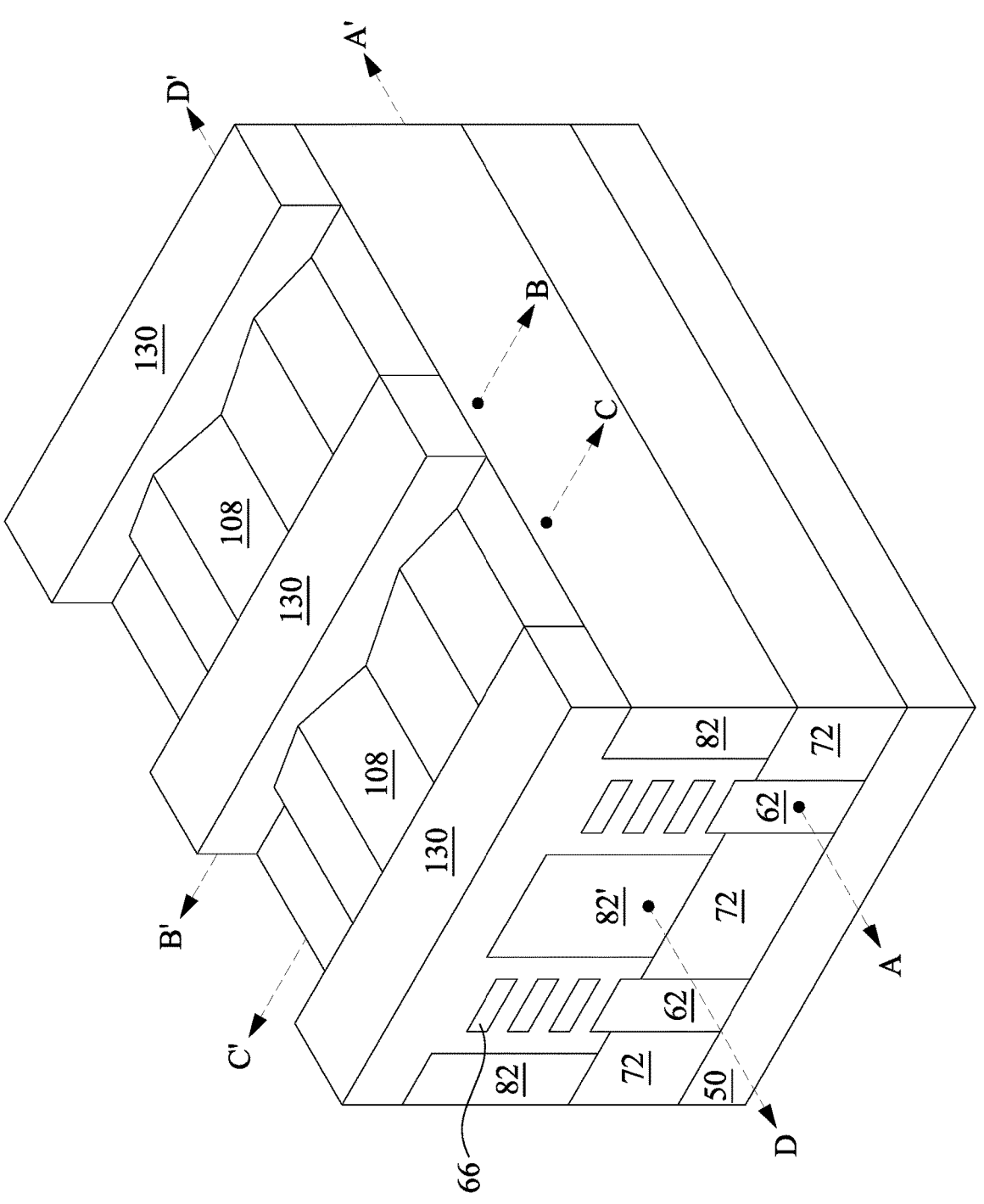
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, backside source/drain contacts are made to electrically connect source/drain regions with an interconnect structure on a backside of a semiconductor chip. The backside interconnect structure may be routed for power supply lines and electrical ground lines with improved electrical performance. Insulating fins may be disposed between source/drain regions for source/drain profile control and to keep adjacent source/drain regions separate. Further, select insulating fins may be at least partially removed prior to forming the source/drain regions so that merged source/drain regions may also be formed. As a result, device resistance can be reduced even when the backside contact has a relatively limited contact area. For example, total resistance of a transistor device while in an "on" state may be denoted as $R_{on}$, which includes channel resistance ($R_{ch}$) and external resistance ($R_p$). $R_p$ includes metal resistance ($R_{im1}$), contact resistance ($R_{cnt}$), source/drain resistance ($R_{epi}$), spreading resistance ($R_{sp}$), and extension resistance ($R_{ext}$). By providing merged source/drain regions with increased epitaxial volume, not only can $R_{epi}$ be reduced, but more efficient current pathways may also be provided, thereby also reducing $R_{cnt}$. As a result, device resistance can be reduced without needing to increase a backside source/drain contact area.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 130 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 130. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth to prevent coalescing of some of the epitaxial source/drain regions 108 during epitaxial growth. For example, the insulating fins 82 may be formed at cell boundaries to separate the epitaxial source/drain regions 108 of adjacent cells. Select insulating fins 82 (labeled 82') may be patterned to allow merged epitaxial source/drain regions 108 to form, thereby reducing device resistance as explained in greater detail below.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nano-FET. Cross-section B-B' is along a longitudinal axis of a gate structure 130 and in a direction, for example, perpendicular to a direction of current flow between the epitaxial source/drain regions 108 of a nano-FET. Cross-section C-C' is parallel to cross-section B-B' and extends through epitaxial source/drain regions 108 of the nano-FETs. Subsequent figures refer to these reference cross-sections for clarity. Cross-section D-D' is parallel to cross-section A-A' and is along a longitudinal axis of a patterned insulating fin 82'.

Figure 2:
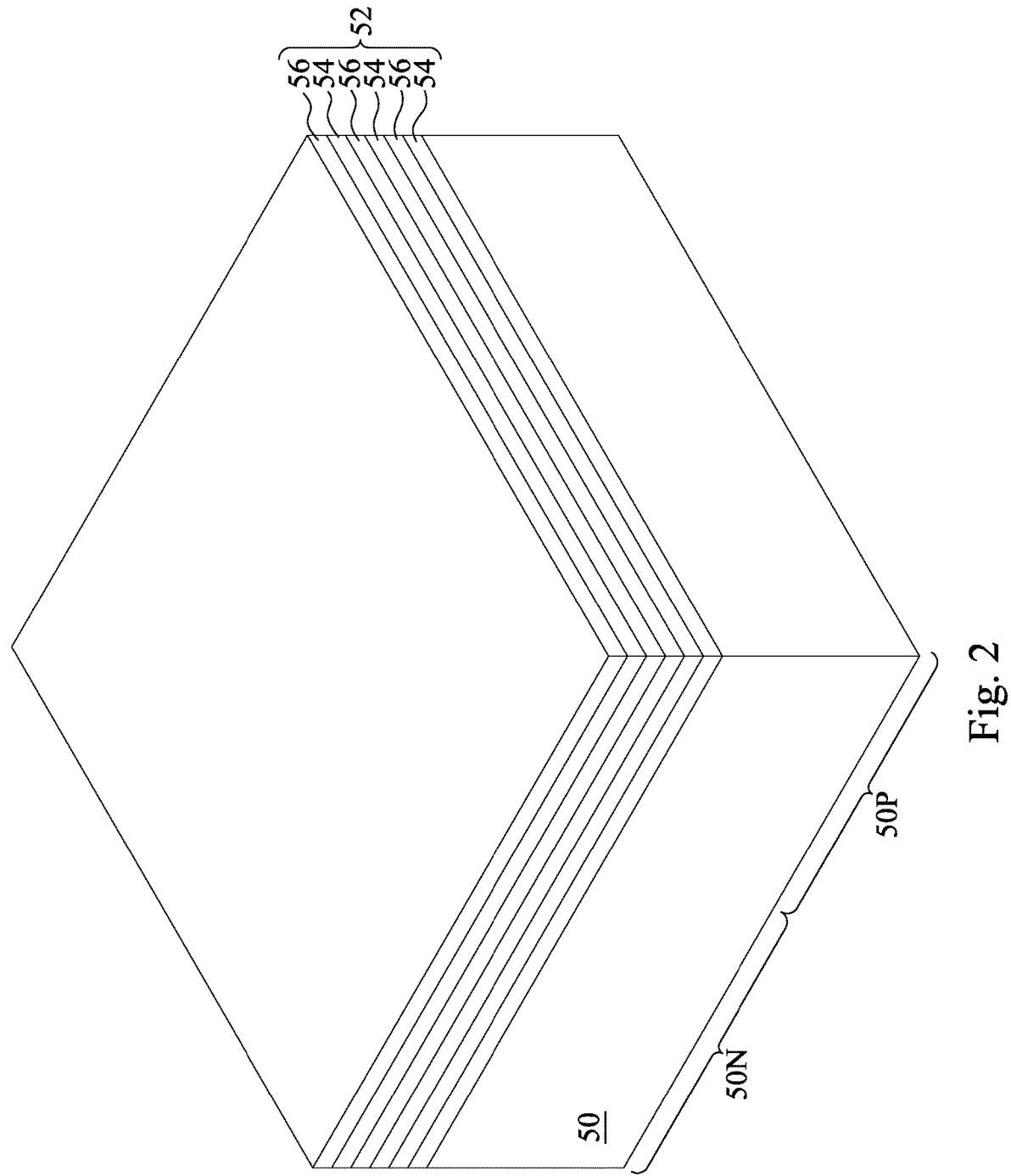
FIGS. 2, 3, 4, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 13D, 14A, 14B, 14C, 15A, 15B, 15C, 16A, 16B, 16C, 17A, 17B, 17C, 18A, 18B, 18C, 18D, 18E, 19A, 19B, 19C, 20A, 20B, 20C, 21A, 21B, 21C, 22A, 22B, 22C, 23A, 23B, 23C, 24A, 24B, 24C, 25A, 25B, and 25C are cross-sectional views of intermediate stages in the manufacturing of nano-FETs, in accordance with some embodiments.
Figure 3:
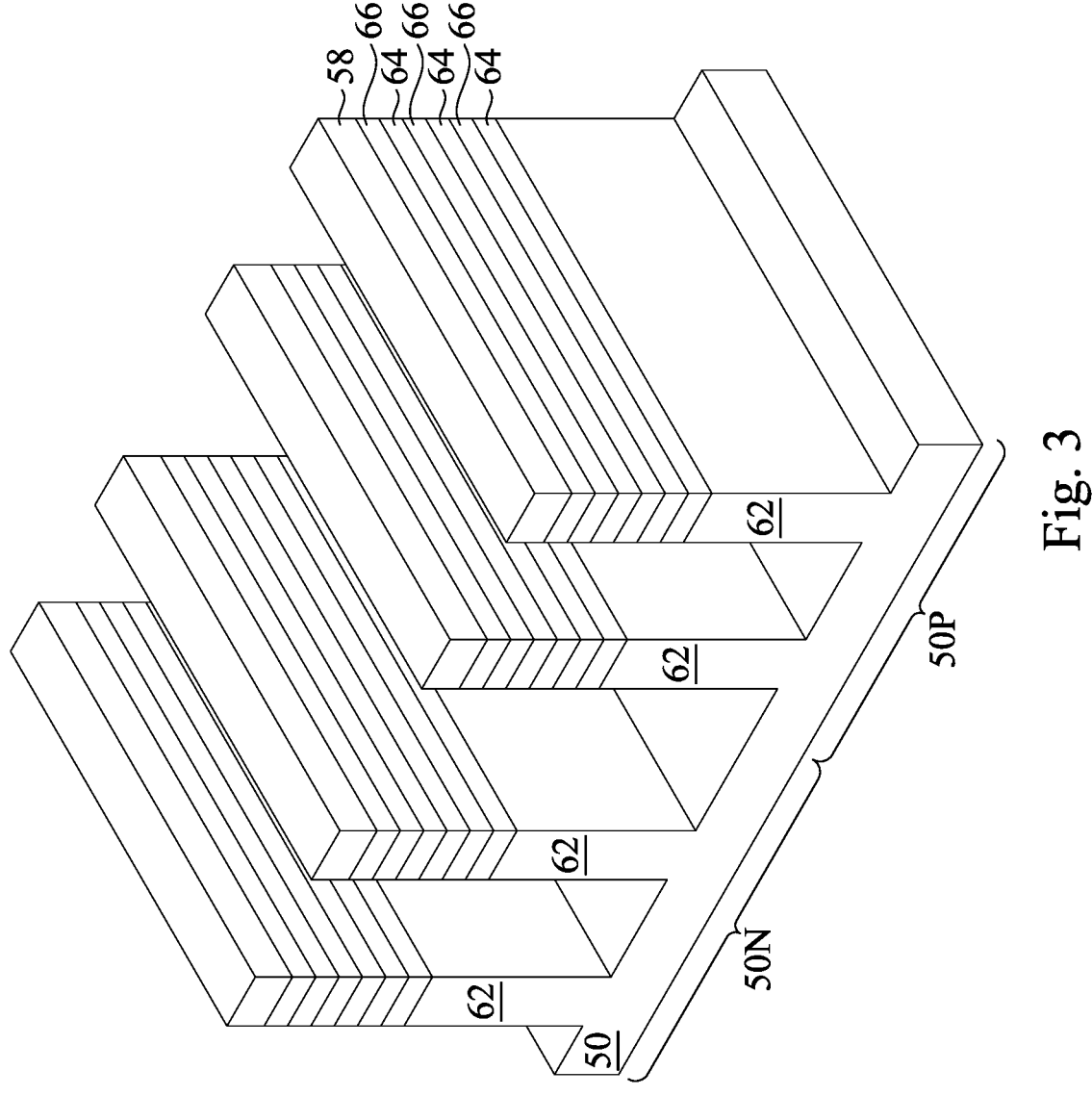
Figure 4:
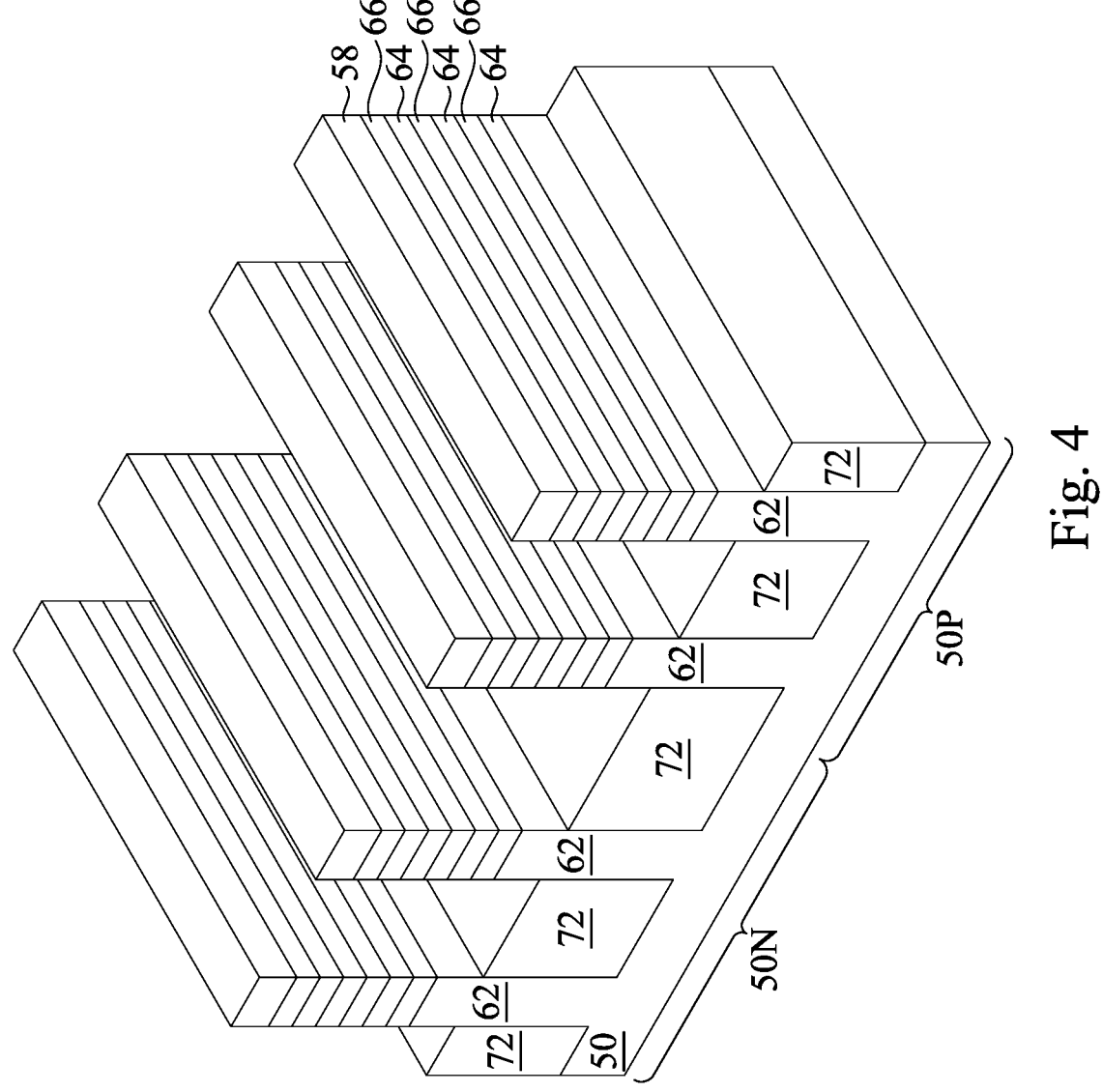

FIGS. 2-25C are views of intermediate stages in the manufacturing of nano-FETs, in accordance with some embodiments. FIGS. 2, 3, and 4 are three-dimensional views. FIGS. 5A, 6A, 7A, 8A, 13A, 14A, 15A, 16A, 17A, 18A, 19A, 20A, 21A, 22A, 23A, 24A, and 25A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, 20B, 21B, 22B, 23B, 24B, and 25B are cross-sectional views illustrated along a similar cross-section as reference cross-section B-B' in FIG. 1. FIGS. 5C, 6C, 7C, 8C, 9C, 10C, 11C, 12C, 13C, 14C, 15C, 16C, 17C, 18C, 18E, 19C, 20C, 21C, 22C, 23C, 24C, and 25C are cross-sectional views illustrated along a similar cross-section as reference cross-section C-C' in FIG. 1. FIGS. 13D and 18D are cross-sectional views illustrated along a similar cross-section as reference cross-section D-D' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will be patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P. Each of the layers may have a small thickness, such as a thickness in a range of 5 nm to 30 nm.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the n-type region 50N and the p-type region

50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P). Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIG. 4, STI regions 72 are formed over the substrate 50 and between adjacent semiconductor fins 62. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-25C illustrate various additional steps in the manufacturing of embodiment devices. FIGS. 5A-25C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, insulating fins 82 will be formed between the semiconductor fins 62. FIGS. 5A, 6A, 7A, 8A, 9A, 10A, 11A, 12A 13A, 14A, 15A, 16A, 17A, 18A, 19A, 20A, 21A, 22A, 23A, 24A, and 25A illustrate a semiconductor fin 62 and structures formed on it. FIGS. 5B, 5C, 6B, 6C, 7B, 7C, 8B, 8C, 9B, 9C, 10B, 10C, 11B, 11C, 12B, 12C, 13B, 13C, 14B, 14C, 15B, 15C, 16B, 16C, 17B, 17C, 18B, 18C, 18E, 19B, 19C, 20B, 20C, 21B, 21C, 22B, 22C, 23B, 23C, 24B, 24C, 25B, and 25C each illustrate two semiconductor fins 62 and portions of the insulating fins 82 and the STI regions 72 that are disposed between the two semiconductor fins 62 in the respective cross-sections. FIGS. 13D and 18D illustrates a patterned insulating fin 82' and structures formed on it.

Figure 5A:
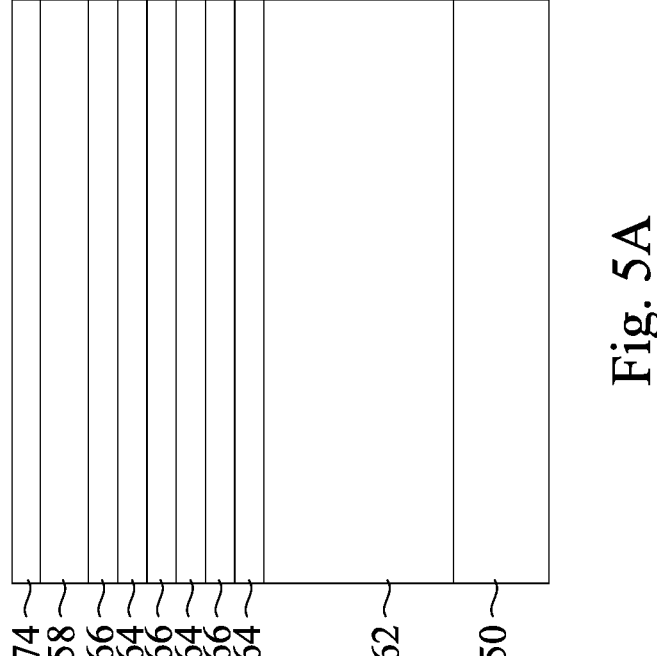
Figure 5C:
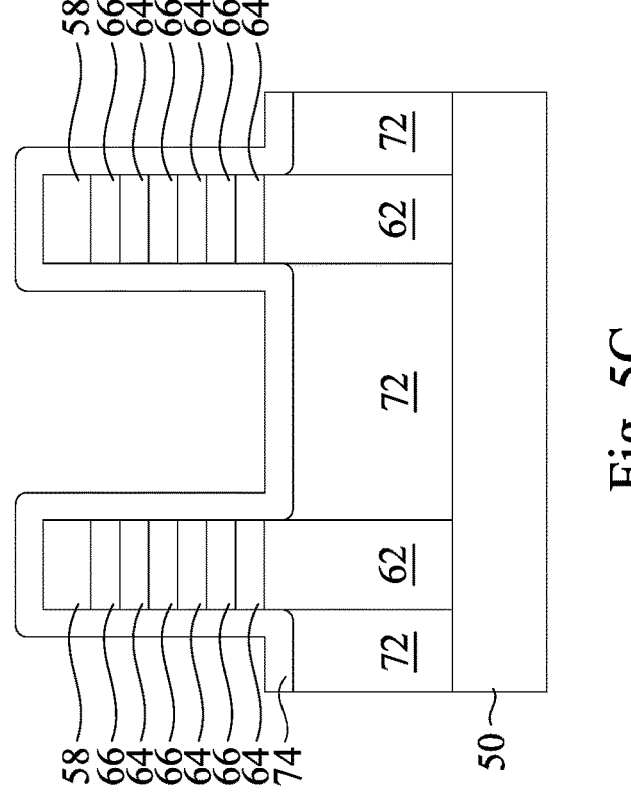
Figure 5B:
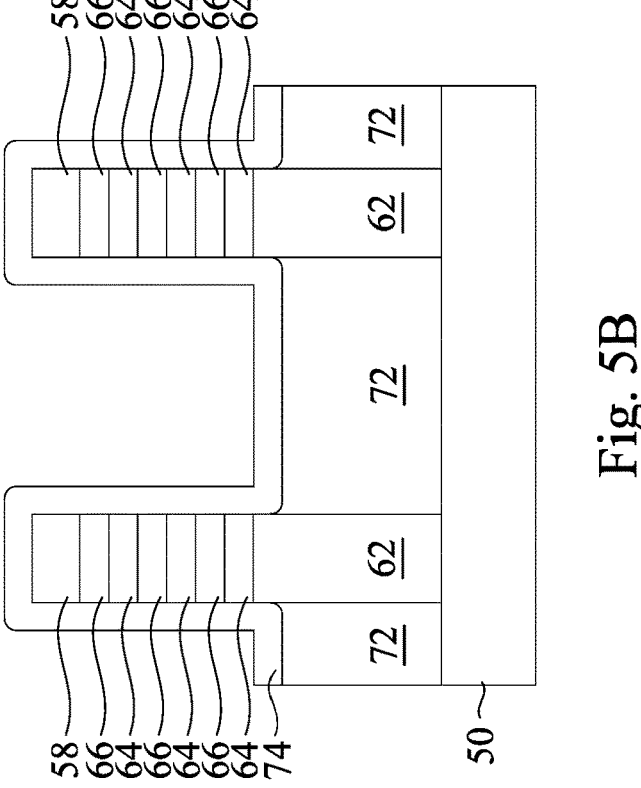

In FIGS. 5A-C, a sacrificial layer 74 is conformally formed over the mask 58, the semiconductor fins 62, the nanostructures 64, 66, and the STI regions 72. The sacrificial layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial layer 74 may be formed of silicon or silicon germanium.

Figure 6A:
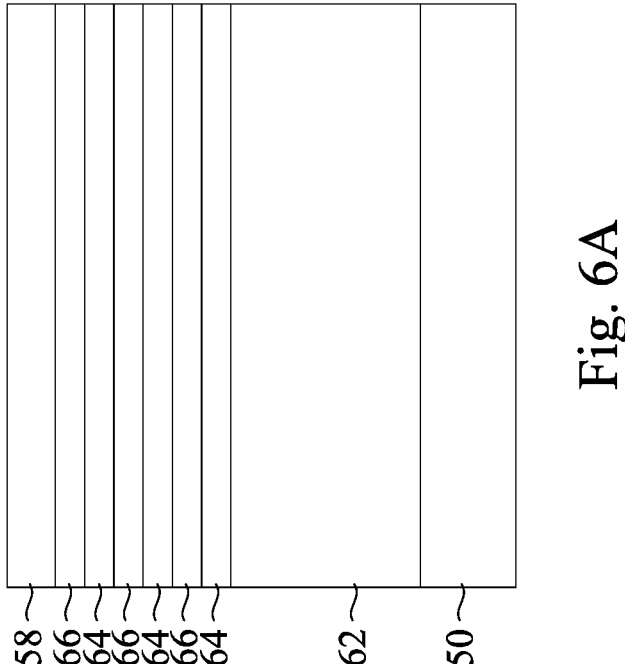
Figure 6C:
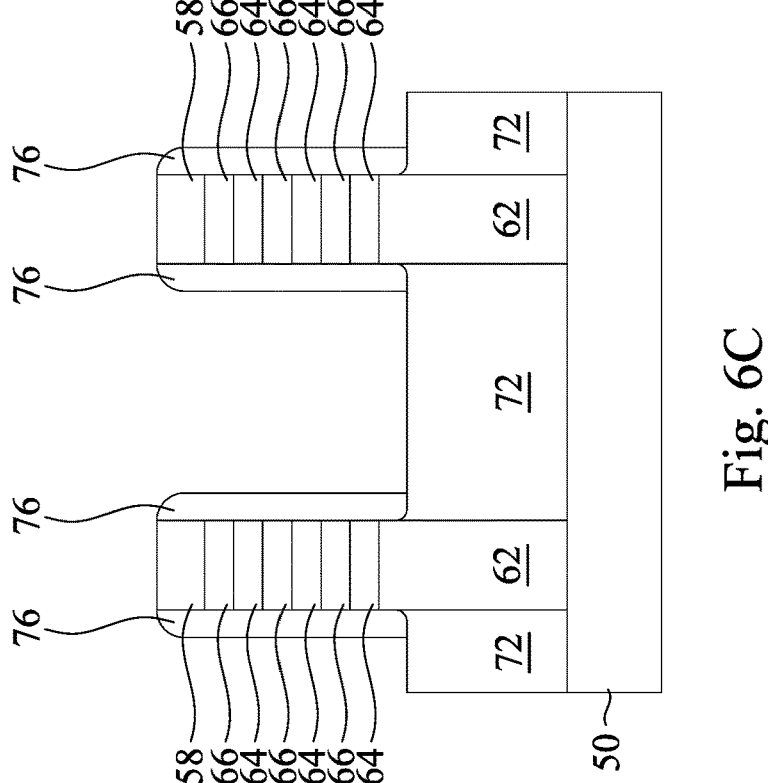
Figure 6B:
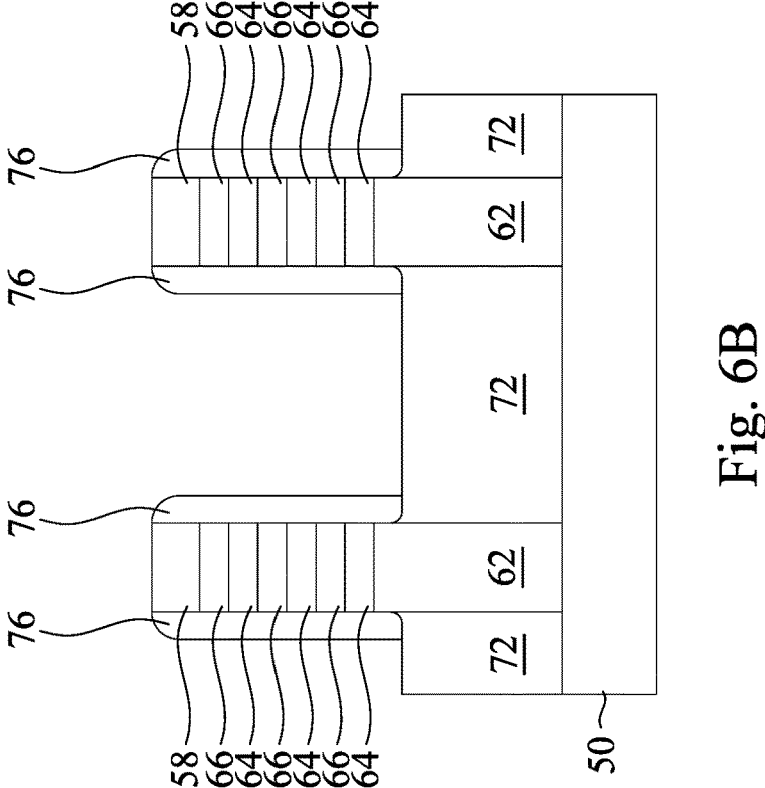

In FIGS. 6A-C, the sacrificial layer 74 is patterned to form sacrificial spacers 76 using an etching process, such as a dry etch, a wet etch, or a combination thereof. The etching process may be anisotropic. As a result of the etching process, the portions of the sacrificial layer 74 over the mask 58 and the nanostructures 64, 66 are removed, and the STI regions 72 between the nanostructures 64, 66 are partially exposed. The sacrificial spacers 76 are disposed over the STI regions 72 and are further disposed on the sidewalls of the mask 58, the semiconductor fins 62, and the nano structures 64, 66.

In subsequent process steps, a dummy gate layer 84 may be deposited over portions of the sacrificial spacers 76 (see below, FIGS. 11A-C), and the dummy gate layer 84 may be patterned to provide dummy gates 94 that include underlying portions of the sacrificial spacers 76 (see below, FIGS. 12A-C). These dummy gates 94 (e.g., patterned portions of the dummy gate layer 84 and portions of the sacrificial spacers 76) may then be replaced with a functional gate stack. Specifically, the sacrificial spacers 76 are used as temporary spacers during processing to delineate boundaries of insulating fins, and the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. For example, the sacrificial spacers 76 may be formed of the same semiconductor material as the nanostructures 64 so that the sacrificial spacers 76 and the nanostructures 64 may be removed in a single process step. Alternatively, the sacrificial spacers 76 may be formed of a different material as the nanostructures 64.

FIGS. 7A through 9C illustrate a formation of insulating fins 82 (also referred to as hybrid fins or dielectric fins) between the sacrificial spacers 76 adjacent to the semiconductor fins 62 and nanostructures 64, 66. The insulating fins 82 may insulate and physically separate subsequently formed source/drain regions (see below, FIGS. 18A-E) from each other.

Figure 7A:
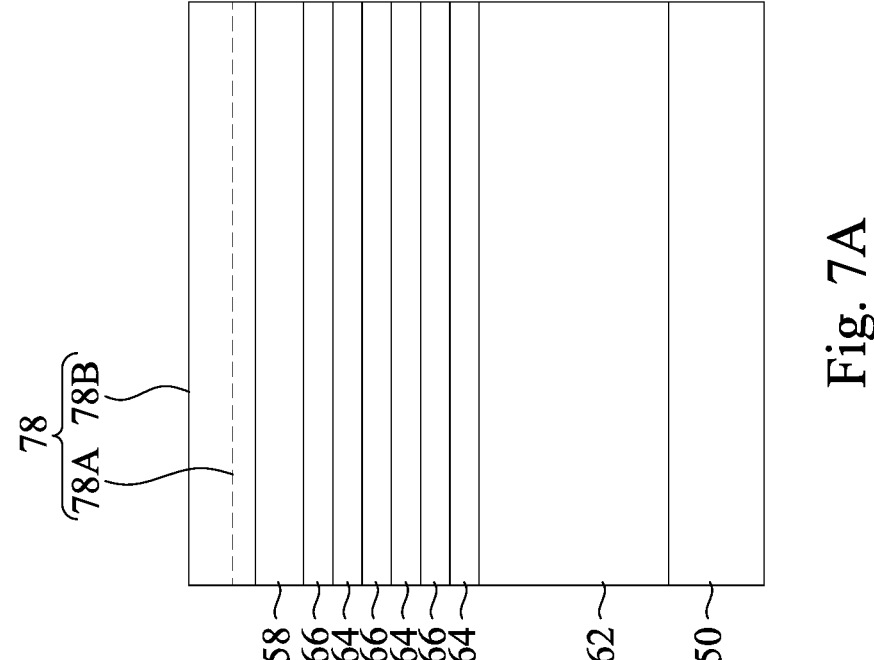
Figure 7C:
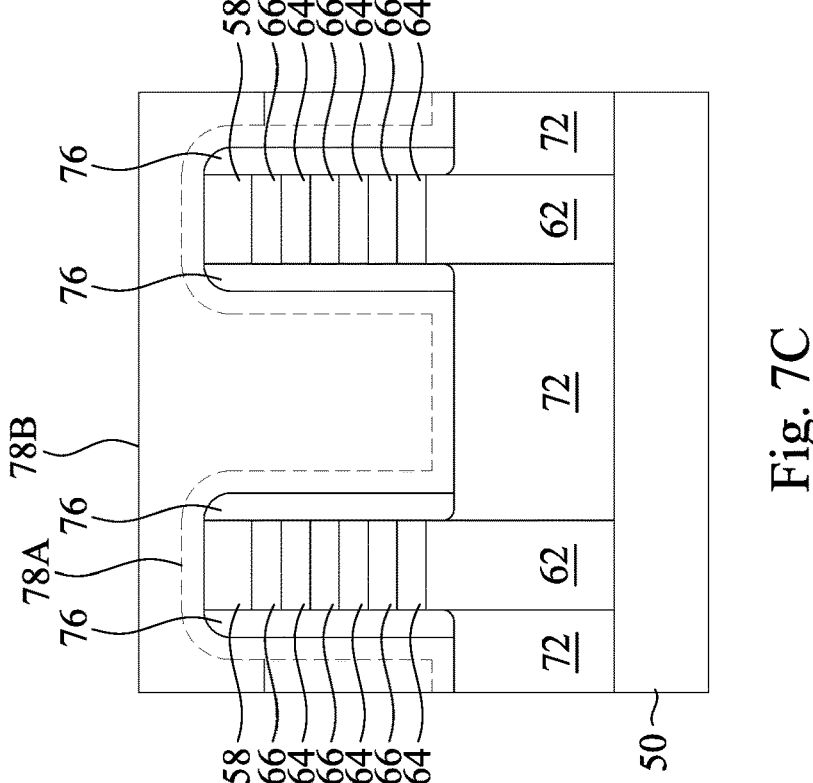
Figure 7B:
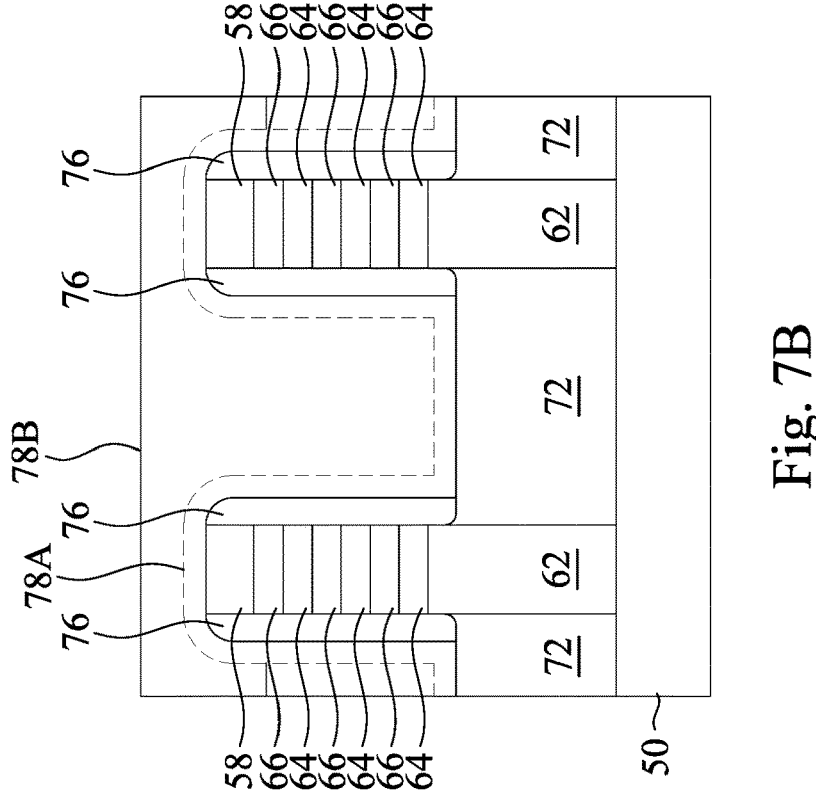

In FIGS. 7A-C, a liner 78A and a fill material 78B are formed over the structure. The liner 78A is conformally deposited over exposed surfaces of the STI regions 72, the masks 58, the semiconductor fins 62, the nanostructures 64, 66, and the sacrificial spacers 76 by an acceptable deposition process such as atomic layer deposition (ALD), chemical vapor deposition (CVD), physical vapor deposition (PVD), or the like. The liner 78A may be formed of one or more dielectric material(s) having a high etching selectivity from the etching of the semiconductor fins 62, the nanostructures 64, 66, and the sacrificial spacers 76, e.g. a nitride such as silicon nitride, silicon carbonitride, silicon oxycarbonitride, or the like. The liner 78A may reduce oxidation of the sacrificial spacers 76 during the subsequent formation of the fill material 78B, which may be useful for a subsequent removal of the sacrificial spacers 76.

Next, a fill material 78B is formed over the liner 78A, filling the remaining area between the semiconductor fins 62 and the nanostructures 64, 66 that is not filled by the sacrificial spacers 76 or the liner 78A. The fill material 78B may form the bulk of the lower portions of the insulating fins 82 (see FIGS. 9A-C) to insulate subsequently formed source/drain regions (see FIGS. 18C and 18D) from each other. The fill material 78B may be formed by an acceptable deposition process such as ALD, CVD, PVD, or the like. The fill material 78B may be formed of one or more dielectric material(s) having a high etching selectivity from the etching of the semiconductor fins 62, the nanostructures 64, 66, the sacrificial spacers 76, and the liner 78A such as an oxide such as silicon oxide, silicon oxynitride, silicon oxycarbonitride, silicon oxycarbide, the like, or combinations thereof.

Figure 8A:
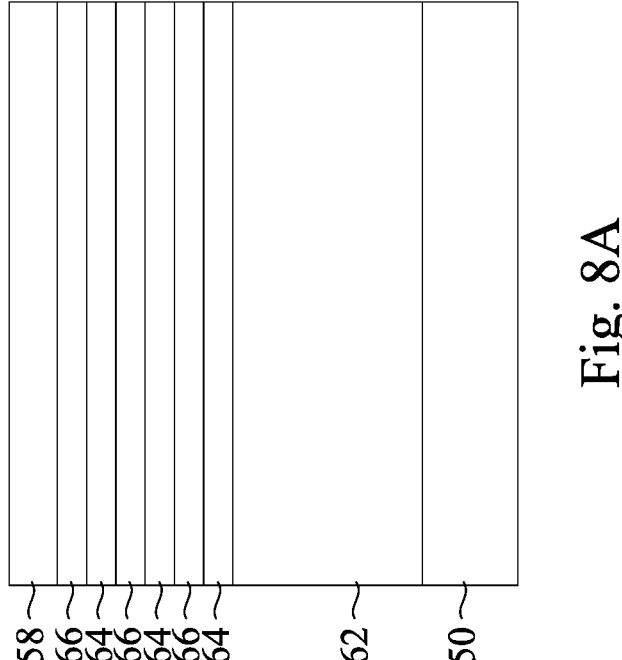
Figure 8C:
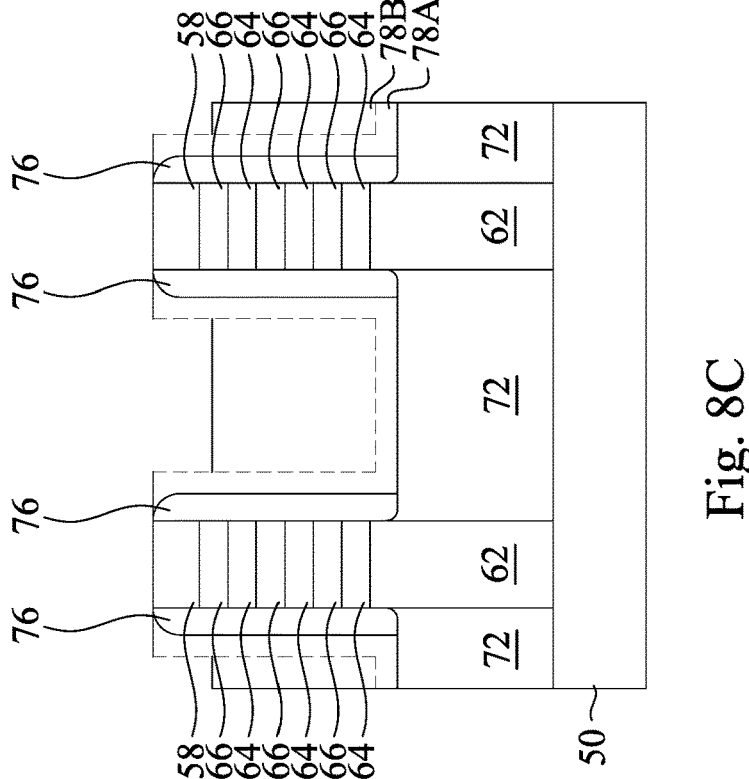
Figure 8B:
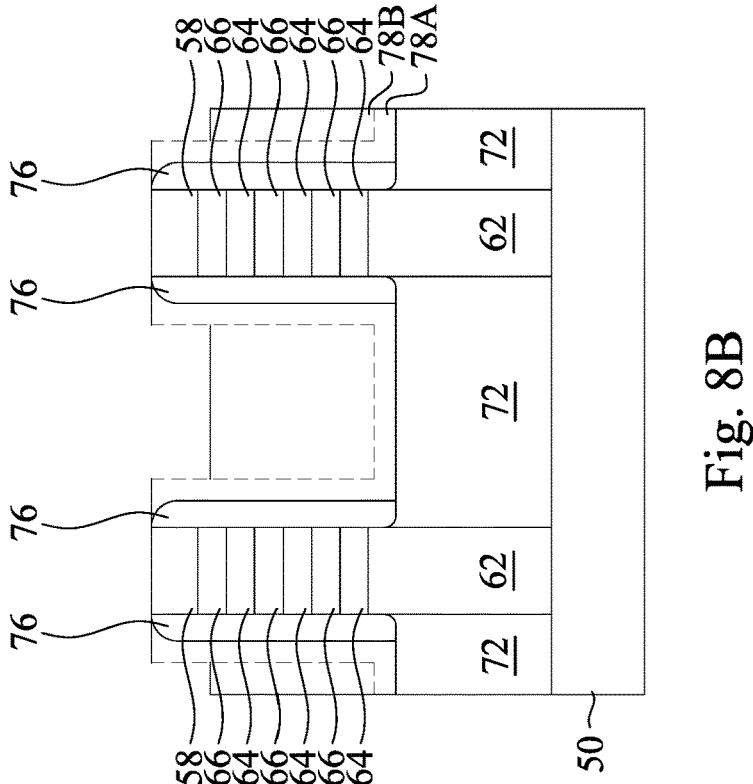

In FIGS. 8A-8C, upper portions of the liner 78A and the fill material 78B above top surfaces of the masks 58 may be removed using one or more acceptable planarization and/or etching processes, such as one that is selective to the fill material 78B (e.g., selectively etches the fill material 78B at a faster rate than the liner 78A, the sacrificial spacers 76, and/or the mask 58). After etching, top surfaces of the fill material 78B may be below top surfaces of the mask 58. In some embodiments, the liner 78A may also be etched to a same level as the fill material 78B.

Figure 9A:
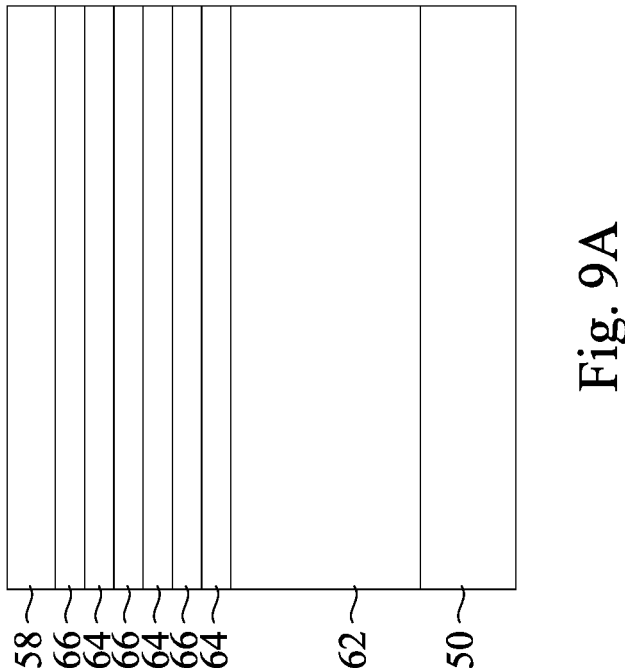
Figure 9C:
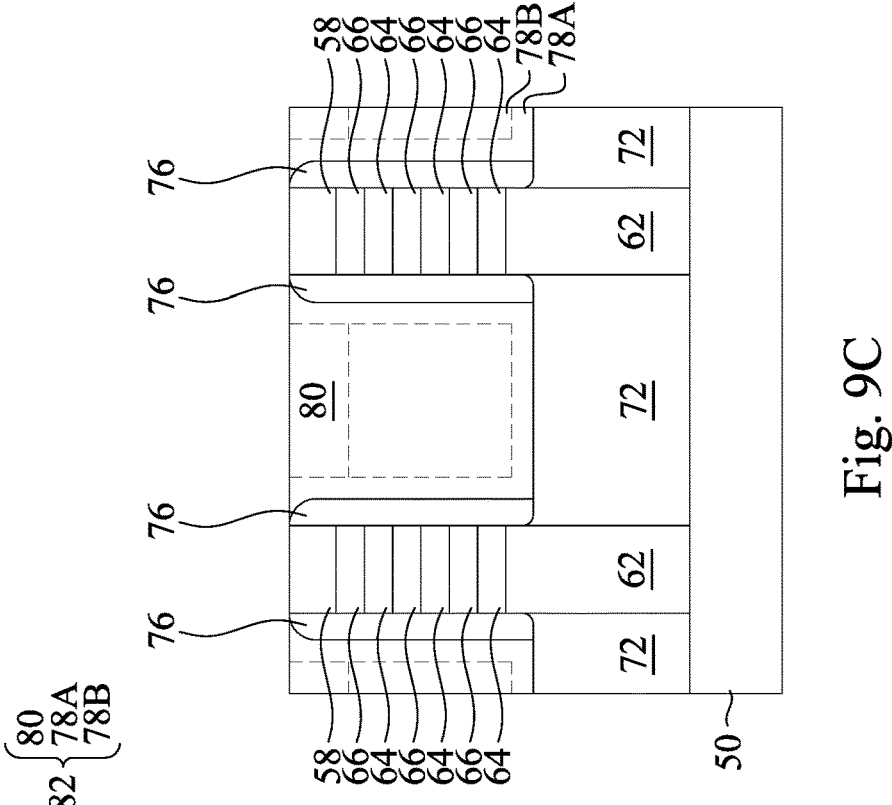
Figure 9B:
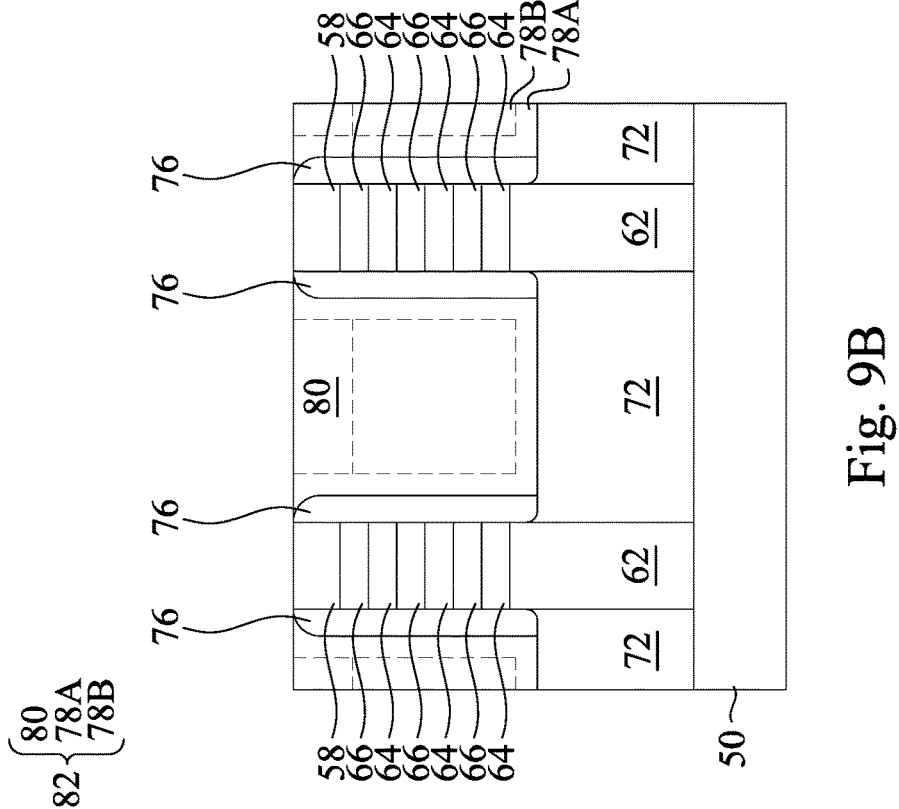

FIGS. 9A-C illustrate the forming of a dielectric capping layer 80 on the fill material 78B, thereby forming the insulating fins 82. The dielectric capping layer 80 may fill a remaining area over the fill material 78B and between sidewalls of the liner 78A. The dielectric capping layer 80 may be formed by an acceptable deposition process such as ALD, CVD, PVD, or the like. The dielectric capping layer 80 may be formed of one or more dielectric material(s) having a high etching selectivity from the etching of the semiconductor fins 62, the nanostructures 64, 66, the sacrificial spacers 76, the liner 78A, and the fill material 78B. For example, the dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof.

The dielectric capping layer 80 may be formed to initially cover the mask 58 and the nanostructures 64, 66. Subsequently, a removal process is applied to remove excess material(s) of the dielectric capping layer 80. In some embodiments, a planarization process such as a CMP, an etch-back process, combinations thereof, or the like may be utilized. The planarization process exposes the masks 58 such that top surfaces of the masks 58, the sacrificial spacers 76, and the dielectric capping layer 80 are coplanar (within process variations). In the illustrated embodiment, the masks 58 remain after the planarization process. In another embodiment, portions of or the entirety of the masks 58 may also be removed by the planarization process.

As a result, insulating fins 82 are formed between and contacting the sacrificial spacers 76. The insulating fins 82 comprise the liner 78A, the fill material 72B, and the dielectric capping layer 80. The sacrificial spacers 76 space the insulating fins 82 apart from the nanostructures 64, 66, and a size of the insulating fins 82 may be adjusted by adjusting a thickness of the sacrificial spacers 76.

FIGS. 10A through 18C illustrate various additional steps in the manufacturing of embodiment devices and features. Specifically, FIGS. 10A through 18C illustrate the selective removal of portions of certain insulating fins 82 so that larger, merged epitaxial source/drain regions may be grown, thereby reducing device resistance. For ease of illustration, the insulating fins 82 are illustrated without the details of the liner 78A, the fill material 78B, or the dielectric capping layer 80 in subsequent figures.

Figure 10A:
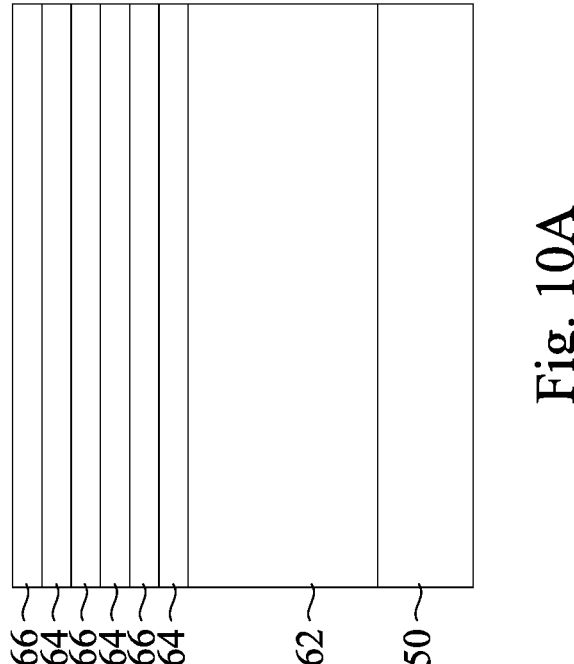
Figure 10C:
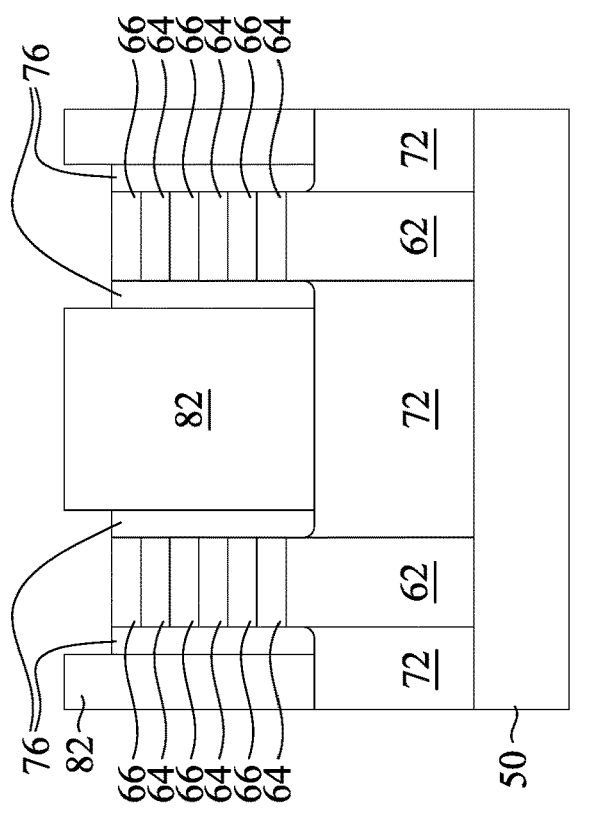
Figure 10B:
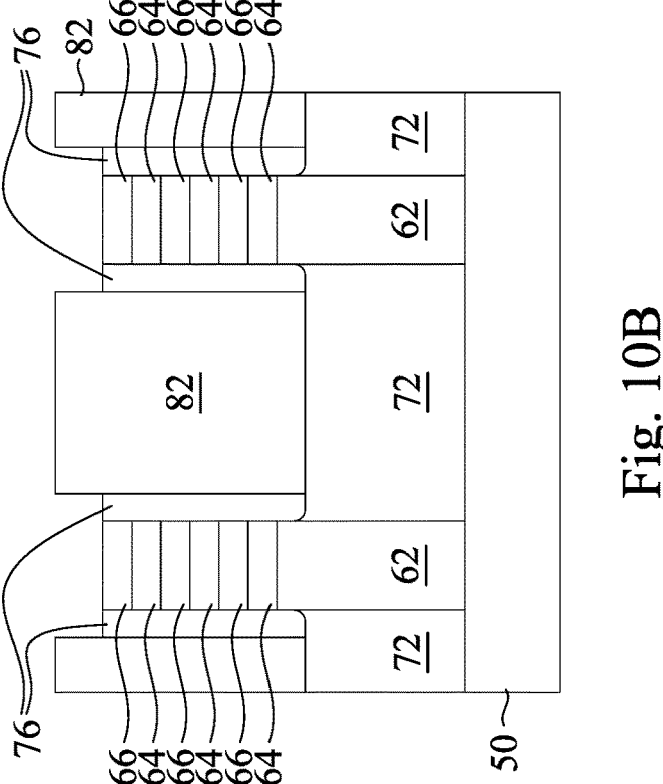

In FIGS. 10A-C, the mask 58 is removed using an etching process, for example. The etching process may be a wet etch that selective removes the mask 58 without significantly etching the insulating fins 82. The etching process may be anisotropic. Further, the etching process (or a separate, selective etching process) may also be applied to reduce a height of the sacrificial spacers 76 to a similar level (e.g., same within processing variations) as the stacked nanostructures 64, 66. In embodiments where the mask 58 comprises an organic material, a sulfuric peroxide mix (e.g., a combination of $H_2O_2$ and $H_2SO_4$) may be used as an etchant to remove the mask 58. After the etching process(es), a topmost surface of the stacked nanostructures 64, 66 and the sacrificial spacers 76 may be exposed and may by lower than a topmost surface of the insulating fins 82.

Figure 11A:
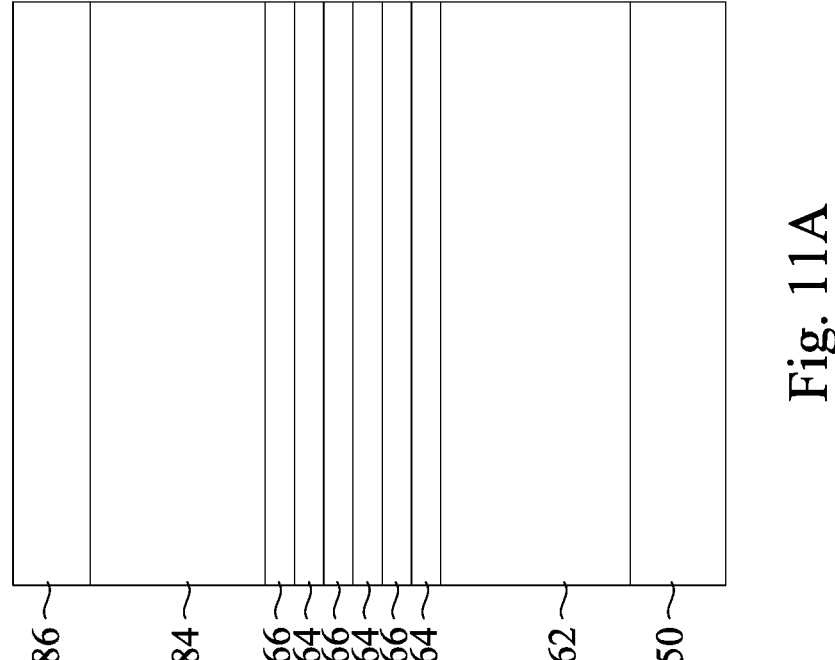
Figure 11C:
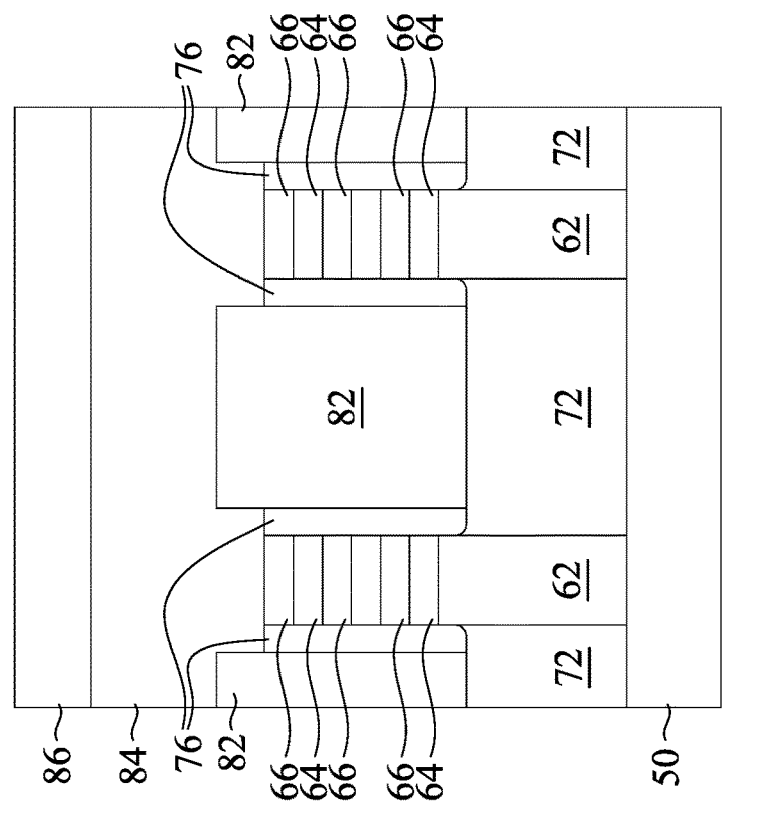
Figure 11B:
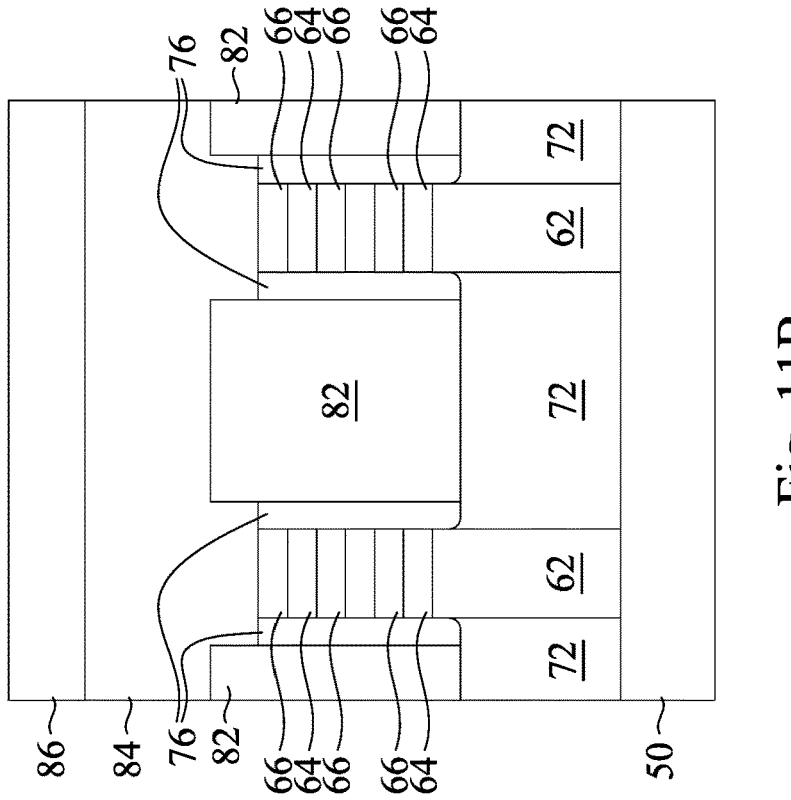

In FIG. 11A-C, a dummy gate layer 84 is formed on the insulating fins 82, the sacrificial spacers 76, and the nanostructures 64, 66. Because the nanostructures 64, 66 and the sacrificial spacers 76 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 12A:
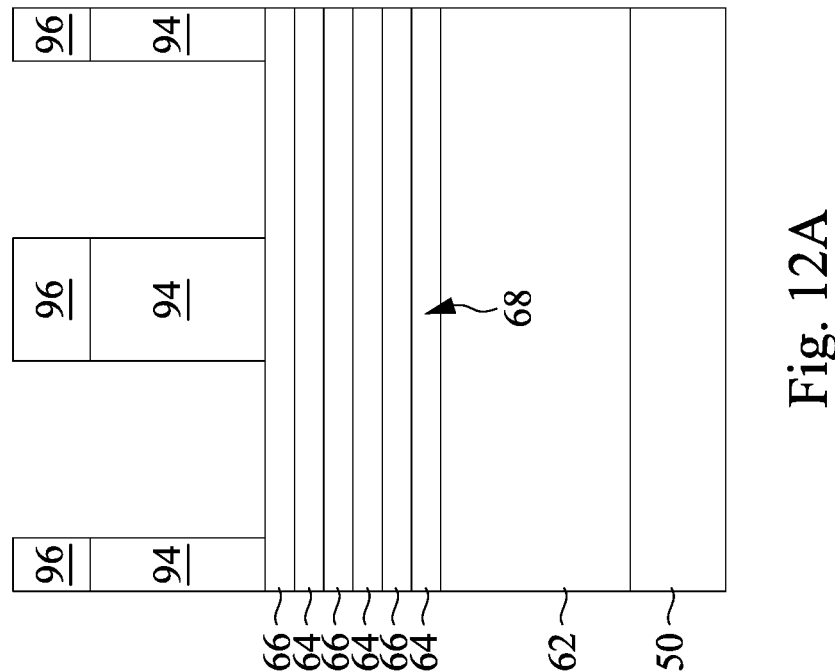
Figure 12C:
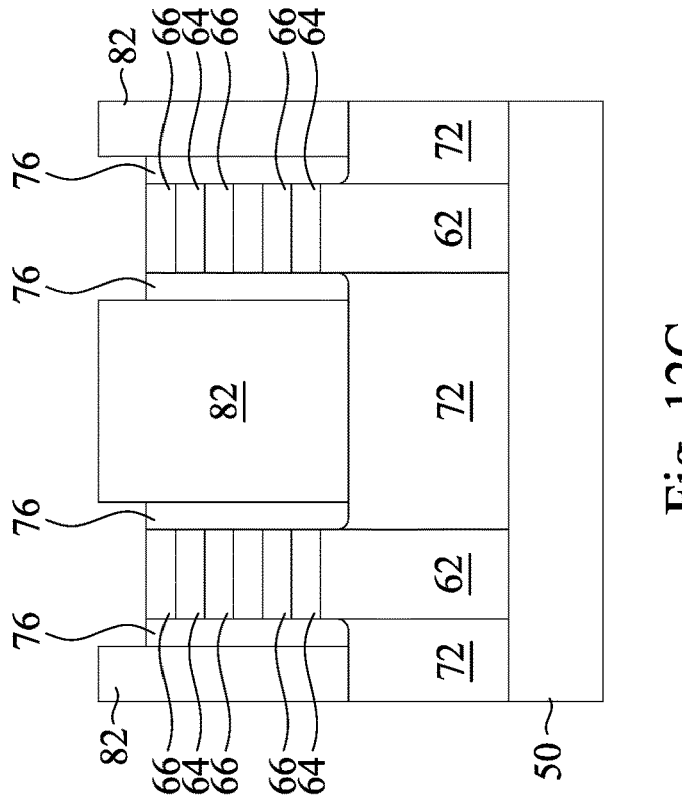
Figure 12B:
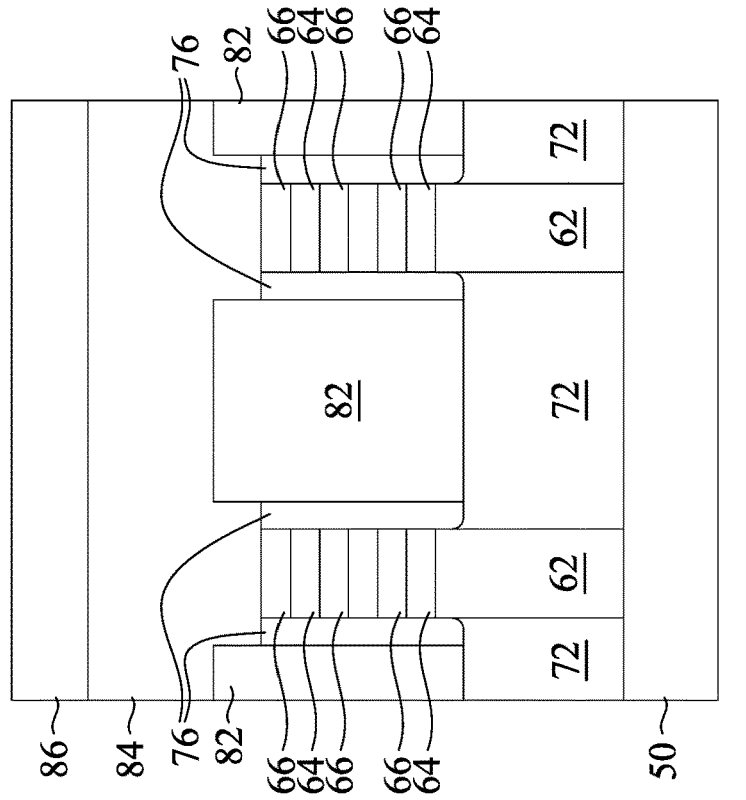

In FIGS. 12A-12C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surface of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The sacrificial spacers 76 and the dummy gates 94 collectively extend along the portions of the nanostructures 66 that will be patterned to form channel regions 68. Subsequently formed gate structures will replace the sacrificial spacers 76 and the dummy gates 94. Forming the dummy gates 94 over the sacrificial spacers 76 allows the subsequently formed gate structures to have a greater height.

As noted above, the dummy gates 94 may be formed of a semiconductor material. In such embodiments, the nanostructures 64, the sacrificial spacers 76, and the dummy gates 94 are each formed of semiconductor materials. In some embodiments, the nanostructures 64 and the sacrificial spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 76 may be removed together in a second etching step. When the nanostructures 64 and the sacrificial spacers 76 are formed of silicon germanium: the nanostructures 64 and the sacrificial spacers 76 may have similar germanium concentrations, the nanostructures 64 may have a greater germanium concentration than the sacrificial spacers 76, or the sacrificial spacers 76 may have a greater germanium concentration than the nanostructures 64. In some embodiments, the nanostructures 64 are formed of a first semiconductor material (e.g., silicon germanium) and the sacrificial spacers 76 and the dummy gates 94 are formed of a second semiconductor material (e.g., silicon), so that during a replacement gate process, the sacrificial spacers 76 and the dummy gates 94 may be removed together in a first etching step, and the nanostructures 64 may be removed in a second etching step.

As illustrated by FIG. 12C, the masks 96 may cover the insulating fins 82 in the B-B cross section (e.g., in an area where gates structures will be subsequently formed) and expose the insulating fins in the C-C cross section (e.g., in an area where source/drain regions will be subsequently formed). By selectively exposing the insulating fins 82, the masks 96 may further allow for the patterning of select insulating fins 82 such that merged source/drain regions can be grown.

Figure 13A:
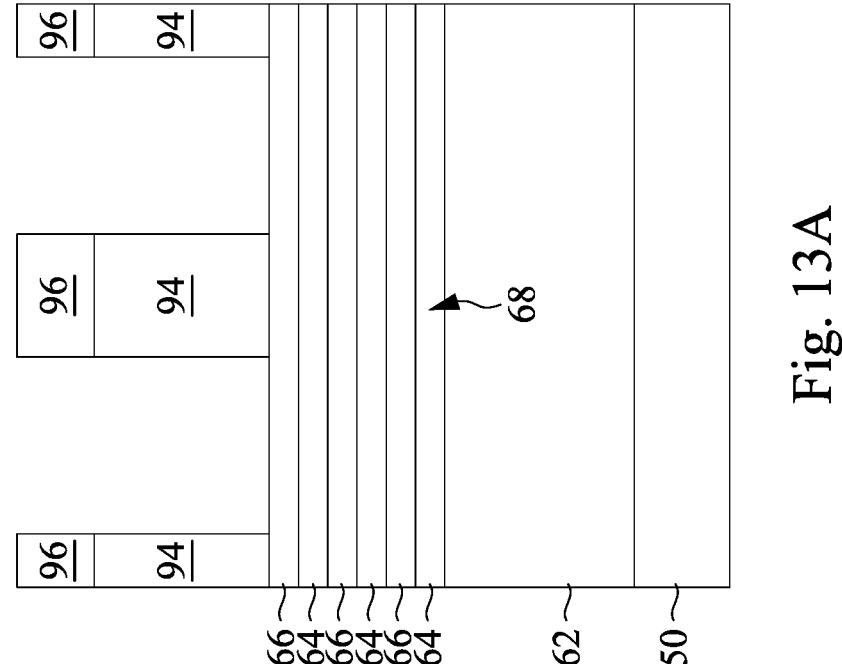
Figure 13C:
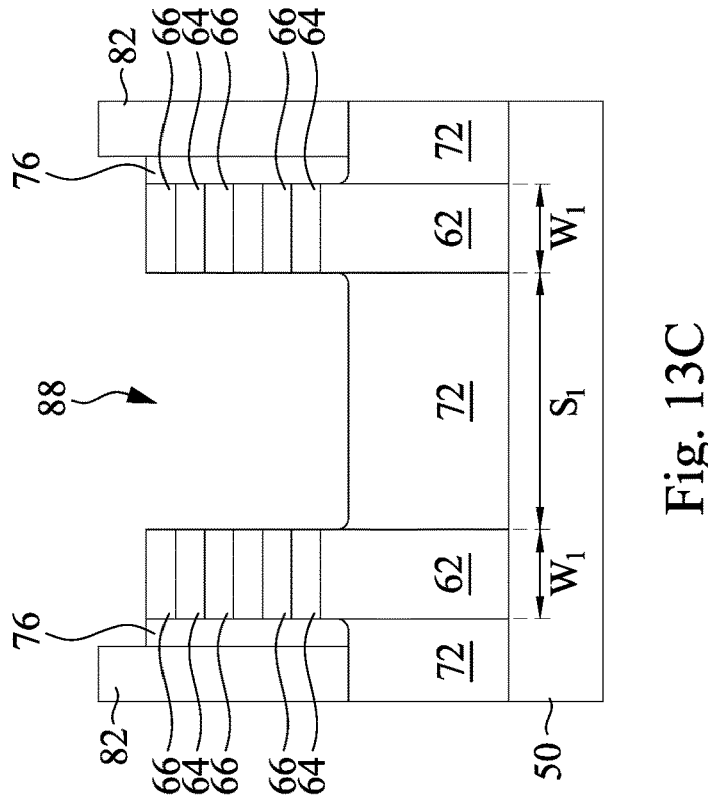
Figure 13B:
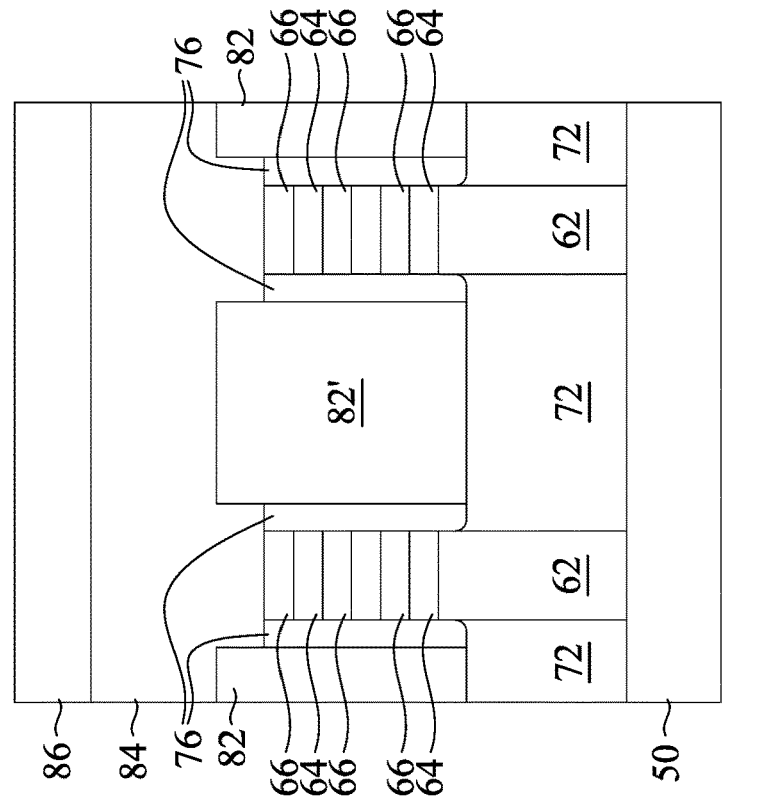
Figure 13D:
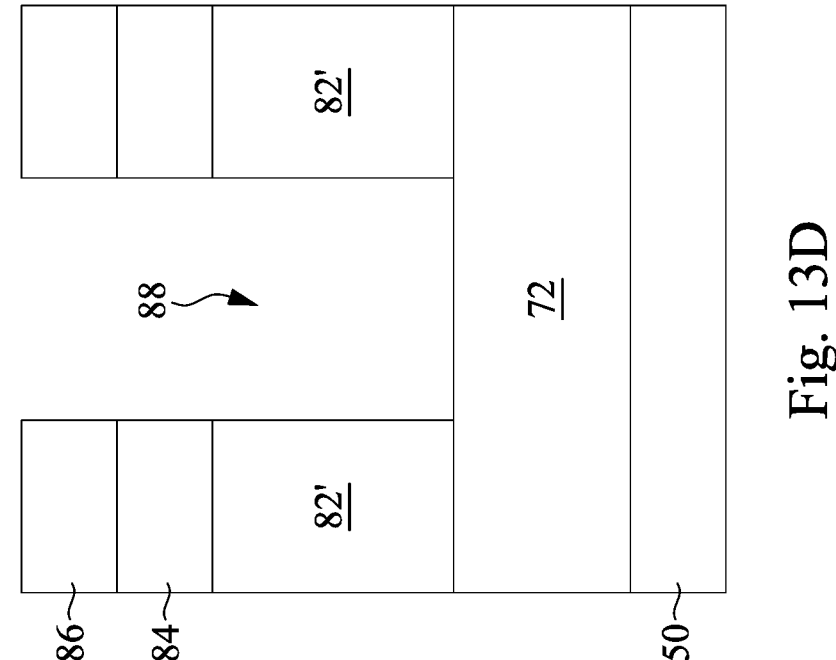
Figure 14A:
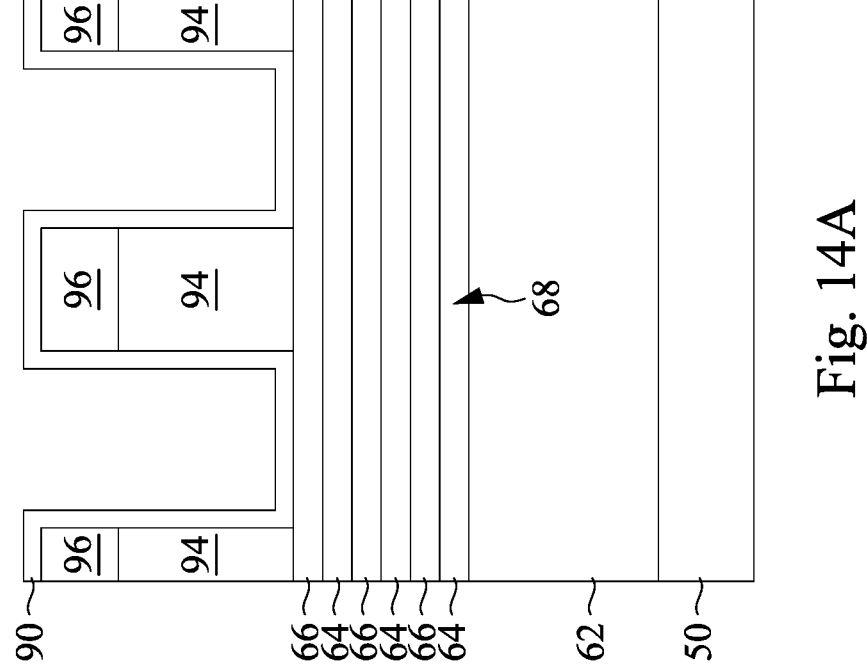
Figure 14C:
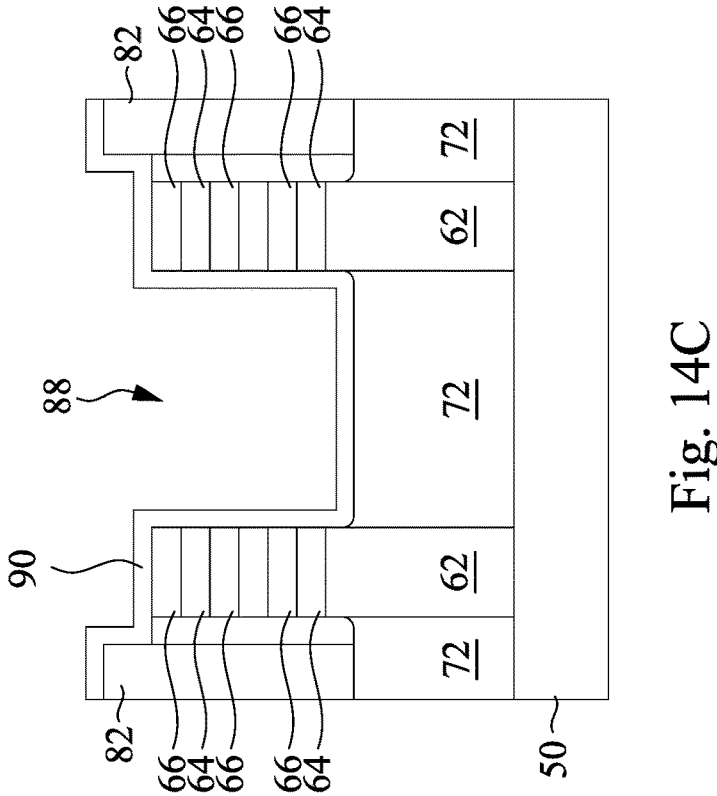
Figure 14B:
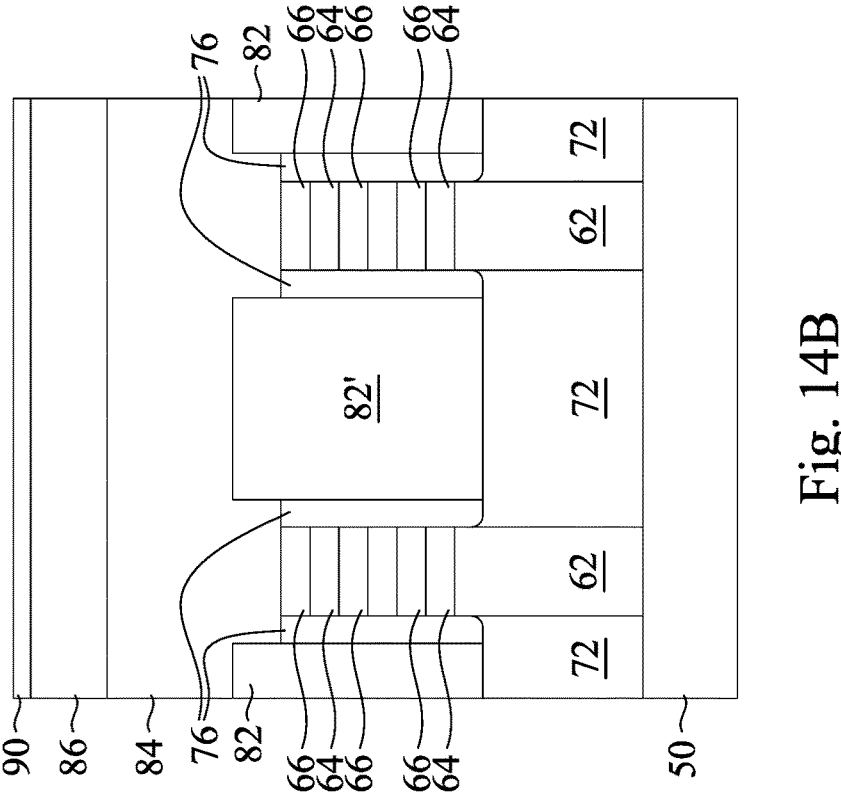

FIGS. 13A-C illustrates the patterning of certain insulating fins 82 (labeled 82′) using a combination of photolithography and etching, for example. In various embodiments, the patterning may etch the insulating fins 82′ between adjacent stacks of nanostructures 64, 66 to remove (as illustrated in FIG. 13C) and/or reduce a height (e.g., in the embodiments of FIGS. 36A-C) of the insulating fins 82′ in the C-C cross section. The etching process may include an anisotropic dry etching process using etchants such as $CF_4$, $NF_3$, $Cl_2$, HBr, $C_4F_6$, $BCl_3$, the like, or combinations thereof. Other ones of the insulating fins 82 may remain unetched. Further, the masks 96 may mask all of the insulating fins 82 in the B-B cross section and prevent patterning of portions of the insulating fins 82′ directly underlying the dummy gates 94. The sacrificial spacers 76 on the patterned insulating fins 82′ may also be patterned using a same or different etching processes as those used to pattern the insulating fins 82′. As a result openings 88 may be formed between the adjacent stacks of nanostructures 64, 66 and extending through the insulating fins 82′ (see FIG. 13D). The openings 88 may expose a region of the STI 72 between the adjacent stacks of nanostructures 64, 66. In subsequent processes, the openings 88 accommodate the formation of merged source/drain regions over the fins 62, which advantageously reduce device resistance. In some embodiments, a spacing $S_1$ between the fins 62 that bound the openings 88 may be relatively small to subsequent source/drain epitaxy merging. For example, the spacing $S_1$ may be in a range of about 20 nm to about 40 nm, and a ratio of a width $W_1$ of the fins 62 to the spacing $S_1$ may be in a range of about 2 to 4. It has been observed that by spacing the semiconductor fins 62 in the above ranges, advantages may be achieved, such as improved ease in forming the merged epitaxially source/drain region 108.

In FIG. 14A through 15C, gate spacers 98 are formed over the nanostructures 64, 66, and on exposed sidewalls of the masks 96 (if present) and the dummy gates 94. The gate spacers 98 may be formed by conformally depositing one or more dielectric material(s) 90 (see FIGS. 14A-C) on the dummy gates 94 and subsequently etching the dielectric material(s) (see FIGS. 15A-C). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nano-structures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 15A:
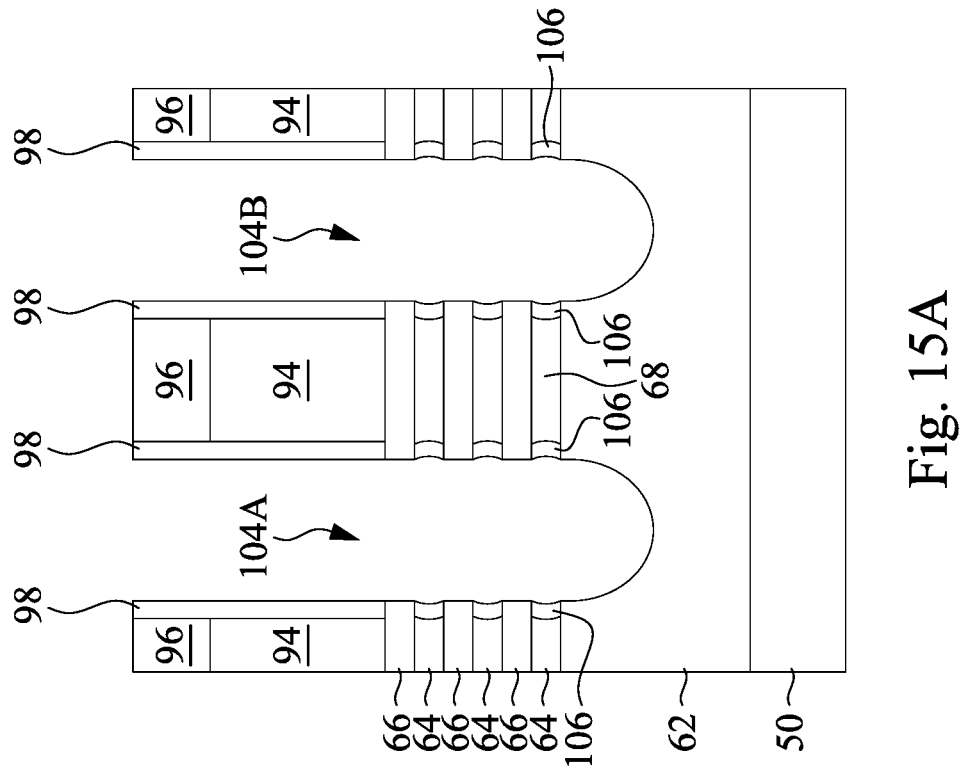
Figure 15C:
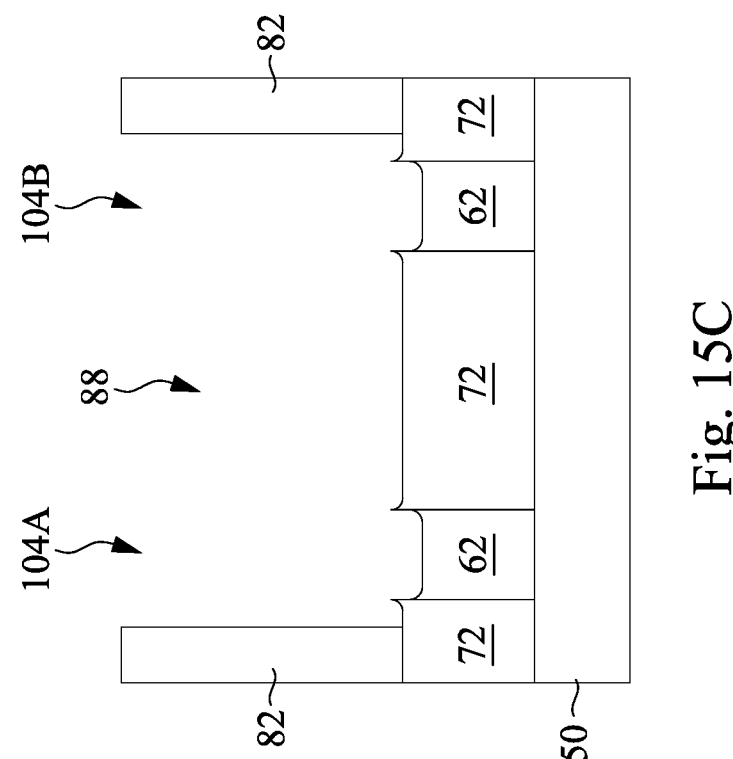
Figure 15B:
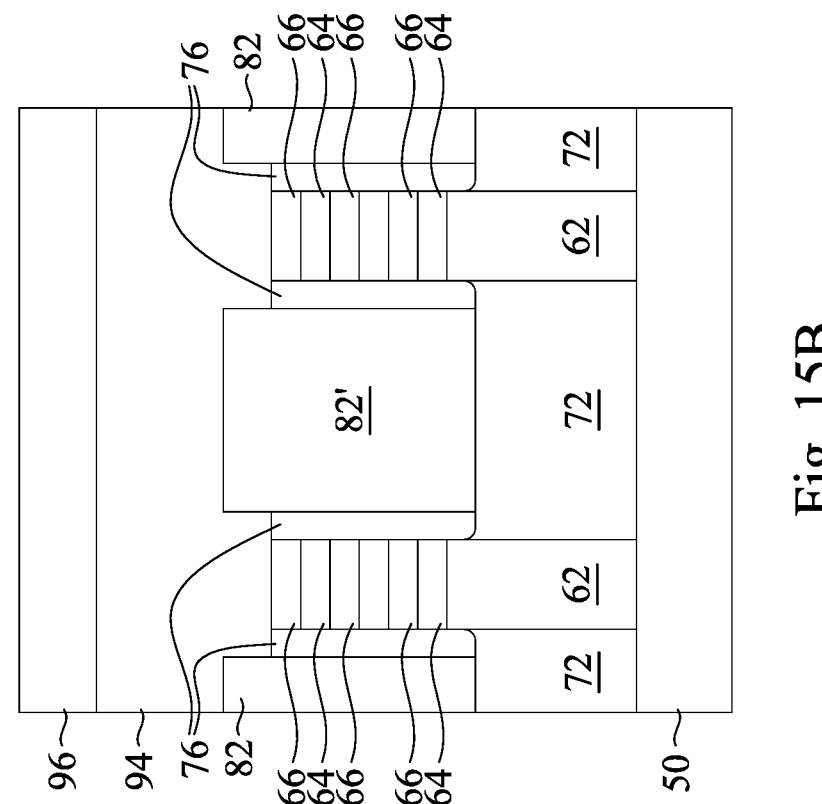

As further illustrated in FIGS. 15A-C, source/drain recesses 104 (labeled 104A and 104B) are formed in the nanostructures 64, 66 and the sacrificial spacers 76. In the illustrated embodiment, the source/drain recesses 104 extend through the nanostructures 64, 66 and the sacrificial spacers 76 into the semiconductor fins 62. The source/drain recesses 104 may also extend into the substrate 50. Due to the removal of portions of the insulating fins 82' described previously, the source/drain recesses 104A and 104B may be connected by the recess 88 in the C-C cross section. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the sacrificial spacers 76 using an anisotropic etching processes, such as a RIE, a NBE, or the like. The gate spacers 98 and the dummy gates 94 collectively mask portions of the semiconductor fins 62 and/or the nanostructures 64, 66 during the etching pro-cesses used to form the source/drain recesses 104. A single etch process may be used to etch each of the nanostructures 64, 66 and the sacrificial spacers 76, or multiple etch processes may be used to etch the nanostructures 64, 66 and the sacrificial spacers 76. Timed etch processes may be used to stop the etching of the source/drain recesses 104 after the source/drain recesses 104 reach a desired depth.

Optionally, inner spacers 106 are formed on the sidewalls of the nanostructures 64, e.g., those sidewalls exposed by the source/drain recesses 104. As will be subsequently described in greater detail, source/drain regions will be subsequently formed in the source/drain recesses 104, and the nanostruc-tures 64 will be subsequently replaced with corresponding gate structures. The inner spacers 106 act as isolation features between the subsequently formed source/drain regions and the subsequently formed gate structures. Fur-ther, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being concave, the sidewalls may be straight or convex. The sidewalls may be recessed by any acceptable etching pro-cess, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostruc-tures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluo-ride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition pro-cess, such as ALD, CVD, or the like. The etching of the insulating material may be anisotropic. For example, the etching process may be a dry etch such as a RIE, a NBE, or the like. Although outer sidewalls of the inner spacers 106 are illustrated as being recessed with respect to the sidewalls of the gate spacers 98, the outer sidewalls of the inner spacers 106 may extend beyond or be flush with the side-walls of the gate spacers 98. In other words, the inner spacers 106 may partially fill, completely fill, or overfill the sidewall recesses. Moreover, although the sidewalls of the inner spacers 106 are illustrated as being concave, the sidewalls of the inner spacers 106 may be straight or convex.

Figure 16A:
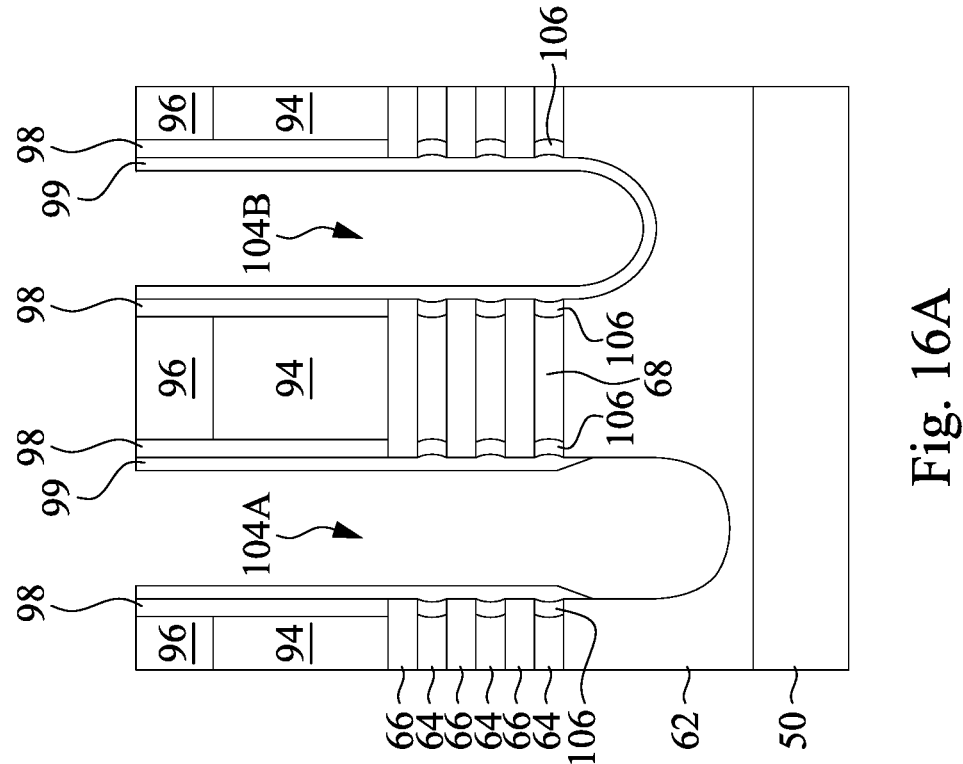
Figure 16C:
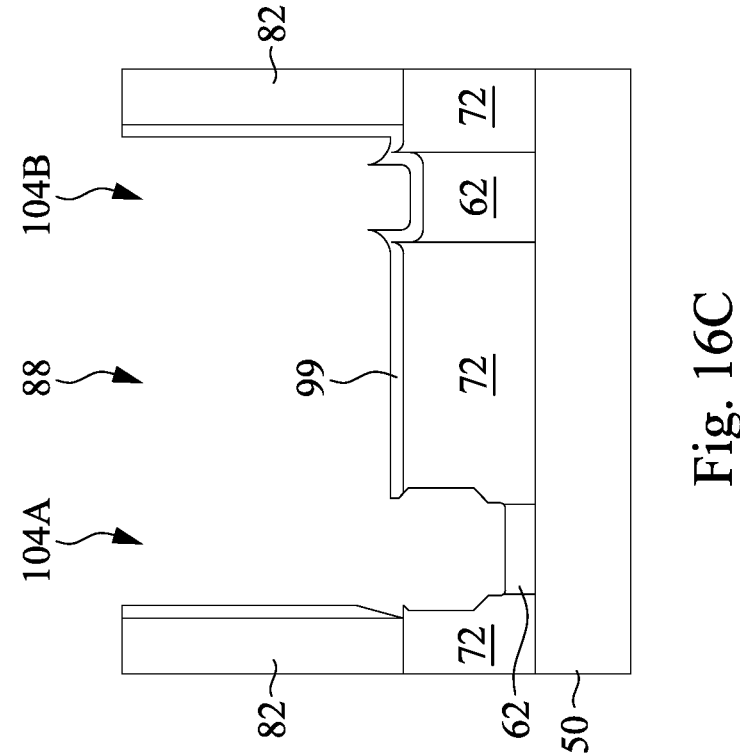
Figure 16B:
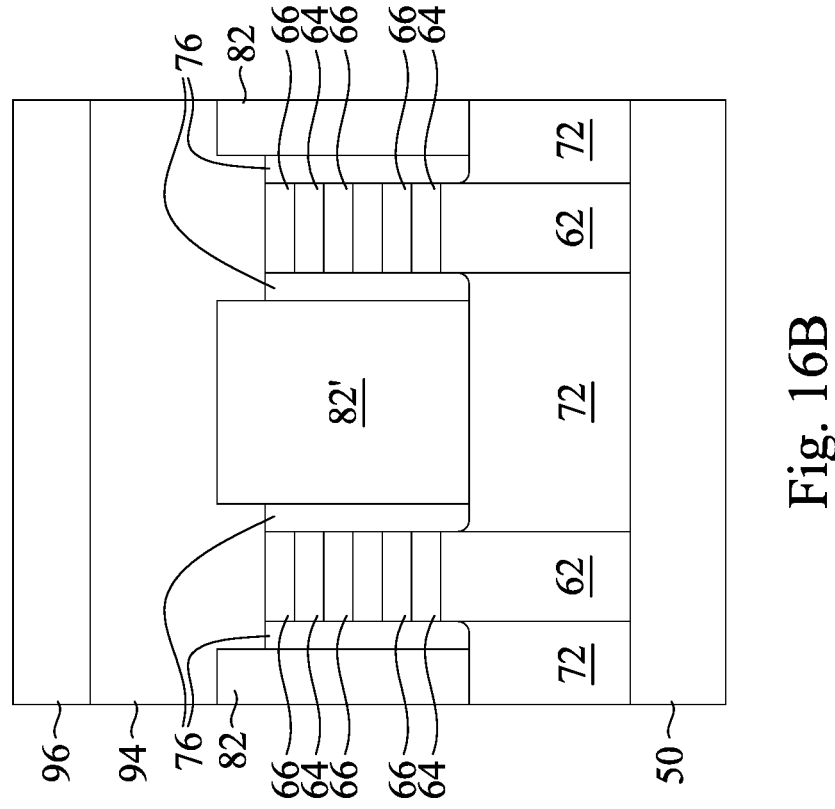

In FIGS. 16A-C, the recesses 104A are extended deeper into the semiconductor fins 62. As explained in detail below, dummy epitaxial materials and epitaxial source/drain regions will be subsequently formed in the recesses 104A, and epitaxial source/drain regions will be subsequently formed in the recesses 104B. In various embodiments, the semiconductor fins 62 may be etched such that the recesses 104A extend deeper than the recesses 104B in order to accommodate the subsequently grown dummy epitaxial materials under the epitaxial source/drain regions. For example, bottom surfaces of the recesses 104A may be disposed below the bottom surfaces of the recesses 104B. The recesses 104A may be extended using a combination of photolithography and anisotropic etching processes, such as RIE, NBE, or the like. For example, a mask layer 99 may be deposited to line sidewalls and bottom surfaces of the recesses 88, 104A, and 104B. Lateral portions of the mask layer 99 in the recesses 104A may be removed using a combination of photolithography and anisotropic etching processes, such as RIE, NBE, or the like while leaving mask layer 99 to line bottom surfaces of the recesses 88 and 104B. The mask layer 99 may be then used as a patterning mask while the fins 62 are etched to extend the recesses 104A, and the mask layer 99 may protect sidewalls of the nanostructures 66 during the patterning process.

Figure 17A:
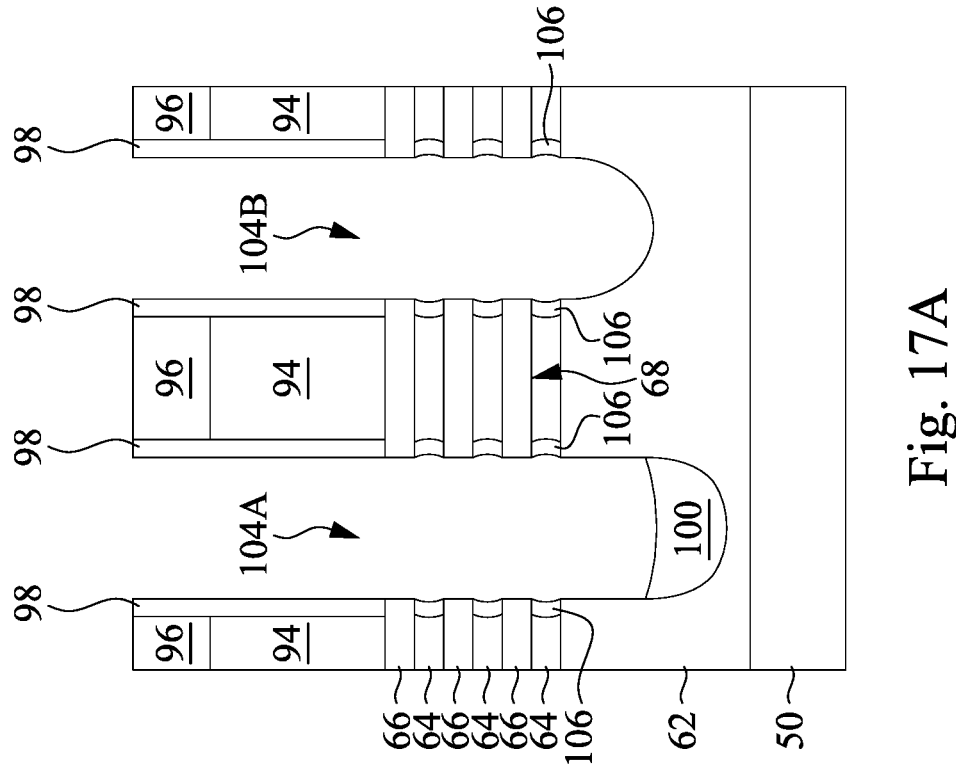
Figure 17C:
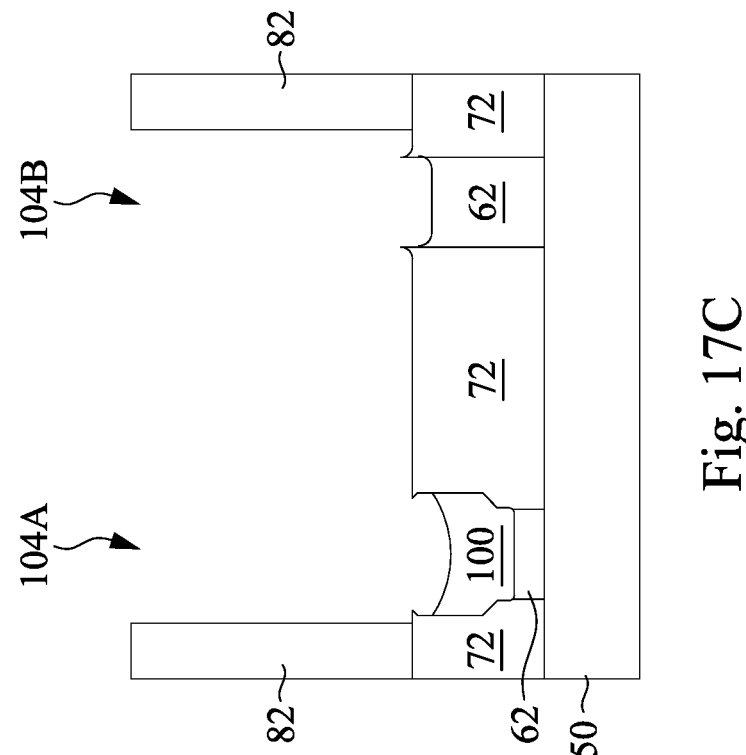
Figure 17B:
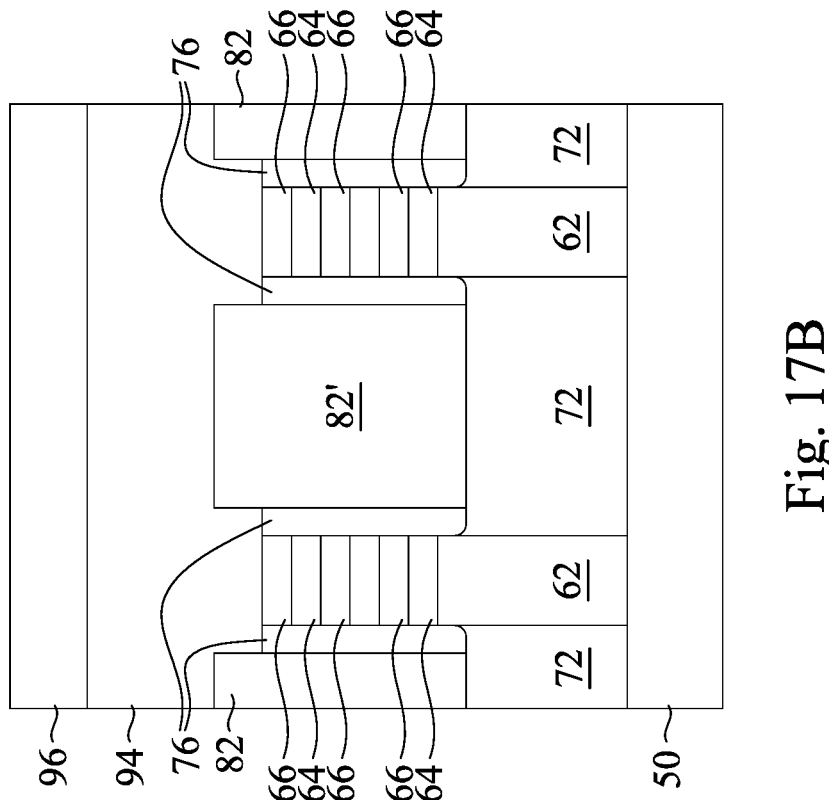

In FIGS. 17A-C, dummy epitaxial materials 100 are formed in the recesses 104A. The mask layer 99 (see FIGS. 16A-C) may be present during the growth of the dummy epitaxial materials 100 to allow the selective growth of the dummy epitaxial materials 100 in the recesses while blocking undesirable growth of the dummy epitaxial materials in the recesses 104B, for example. Subsequently, the mask layer 99 may be removed using one or more cleaning processes (e.g., wet clean processes or the like).

In some embodiments, dummy epitaxial materials 100 may be sacrificial materials, which are subsequently removed to form backside vias (such as the backside source/drain contacts 174, discussed below with respect to FIGS. 34A-C). As illustrated in FIGS. 17A-C, top surfaces of the dummy epitaxial materials 100 may be concave. However, in some embodiments, top surfaces of the dummy epitaxial materials 100 may have a different profile. The dummy epitaxial materials 100 may be grown in the recesses 104A using a process such as CVD, ALD, VPE, MBE, or the like. The dummy epitaxial materials 100 may include any acceptable material, such as silicon germanium or the like. The dummy epitaxial materials 100 may be formed of materials having high etch selectivity to materials of the subsequently formed epitaxial source/drain regions, the semiconductor fins 62, the substrate 50, and dielectric layers (such as the STI regions 72 and subsequently formed dielectric layers). As such, dummy epitaxial materials 100 may be removed and replaced with the backside vias without significantly removing the epitaxial source/drain regions or any dielectric layers.

In FIGS. 18A-18E, dummy epitaxial materials 102 and epitaxial source/drain regions 108 are formed in the source/drain recesses 104 (labeled 104A and 104B). The dummy epitaxial materials 102 may be sacrificial materials, which protect the overlying epitaxial source/drain regions 108 during the subsequent formation of backside vias (such as the backside source/drain contacts 174, discussed below with respect to FIGS. 34A-C). The dummy epitaxial materials 102 may be grown in the recesses 104A using a process such as CVD, ALD, VPE, MBE, or the like. The dummy epitaxial materials 102 may include any acceptable material, such as silicon germanium or the like. The dummy epitaxial materials 102 may be formed of materials having high etch selectivity to materials of the semiconductor fins 62, the substrate 50, and dielectric layers (such as the STI regions 72 and subsequently formed dielectric layers). As such, the semiconductor fins 62 and the substrate 50 may be subsequently removed without consuming the dummy epitaxial materials 102 and damaging the epitaxial source/drain regions 108. In some embodiments where the dummy epitaxial materials 100, 102 each comprise silicon germanium, the dummy epitaxial materials 102 may have a different germanium concentration than the dummy epitaxial materials 100 so that it may be selectively etched. Further, the dummy epitaxial materials 102 may be an undoped layer or a lightly doped layer compared to the heavily doped epitaxial source/drain regions 108.

The epitaxial source/drain regions 108 are formed in recesses 104A, 104B, and 88 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nano-FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nanostructures 66 are silicon, the epitaxial source/drain regions 108 in the n-type region 50N may include materials exerting a tensile strain on the channel regions 68, such as silicon, silicon carbide, phosphorous doped silicon carbide, silicon arsenide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nanostructures 66 are silicon, the epitaxial source/drain regions 108 in the p-type region 50P may include materials exerting a compressive strain on the channel regions 68, such as silicon germanium, boron doped silicon germanium, silicon germanium phosphide, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The epitaxial source/drain regions 108 may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A and a main layer 108B (or more generally, a first semiconductor material layer and a second semiconductor material layer). Any number of semiconductor material layers may be used for the epitaxial source/drain regions 108. Each of the liner layer 108A and the main layer 108B may be formed of different semiconductor materials and/or may be doped to different impurity concentrations. For example, in n-type source/drain regions, possible combinations of the liner layer 108A/the main layer 108B may include SiP/SiP; SiAs/SiP; SiC/SiP; SiCP/SiP; or the like, and in p-type source/drain regions, possible combinations of the liner layer 108A/the main layer 108B may include SiB/SiGeP; SiGeP/SiGeP; or the like. In some embodiments, the liner layer 108A may have a lesser concentration of impurities than the main layer 108B. In embodiments in which the epitaxial source/drain regions include two semiconductor material layers, the liner layers 108A may be grown in the source/drain recesses 104, and the main layers 108B may be grown on the liner layers 108A. In other embodiments, the epitaxial source/drain regions 108 may comprise additional layers or fewer layers.

Figure 18A:
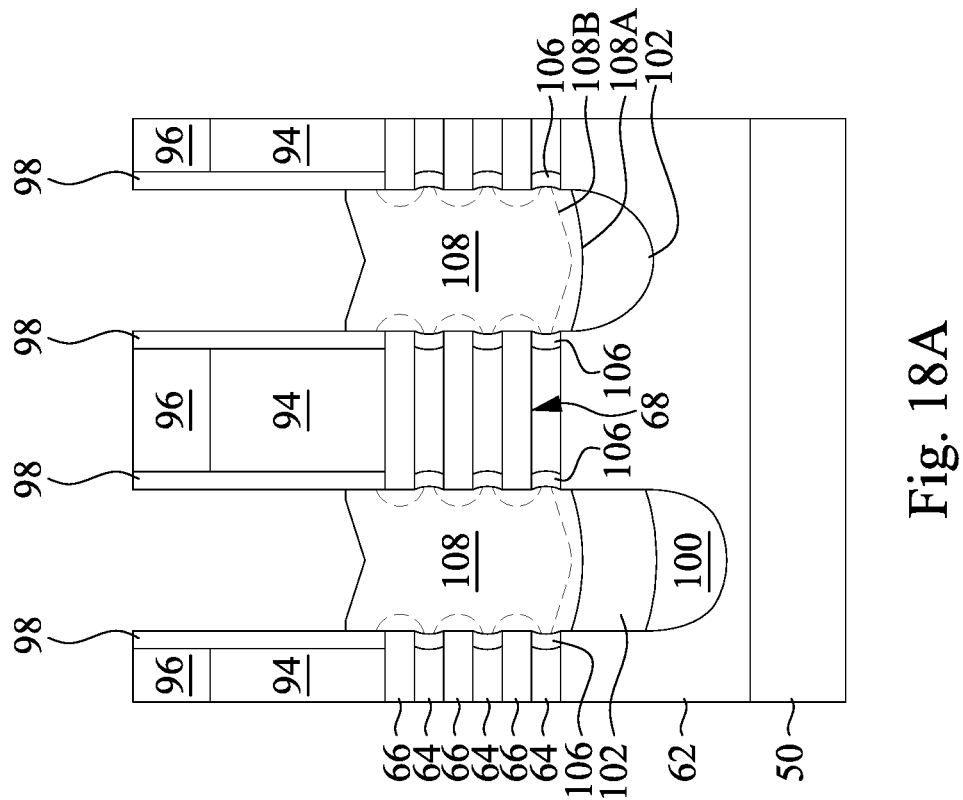
Figure 18C:
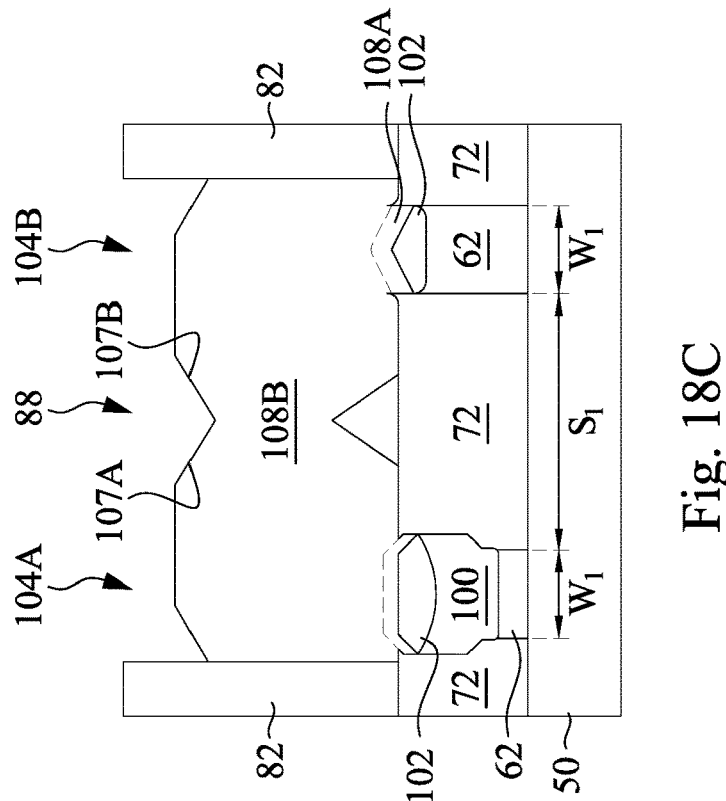
Figure 18B:
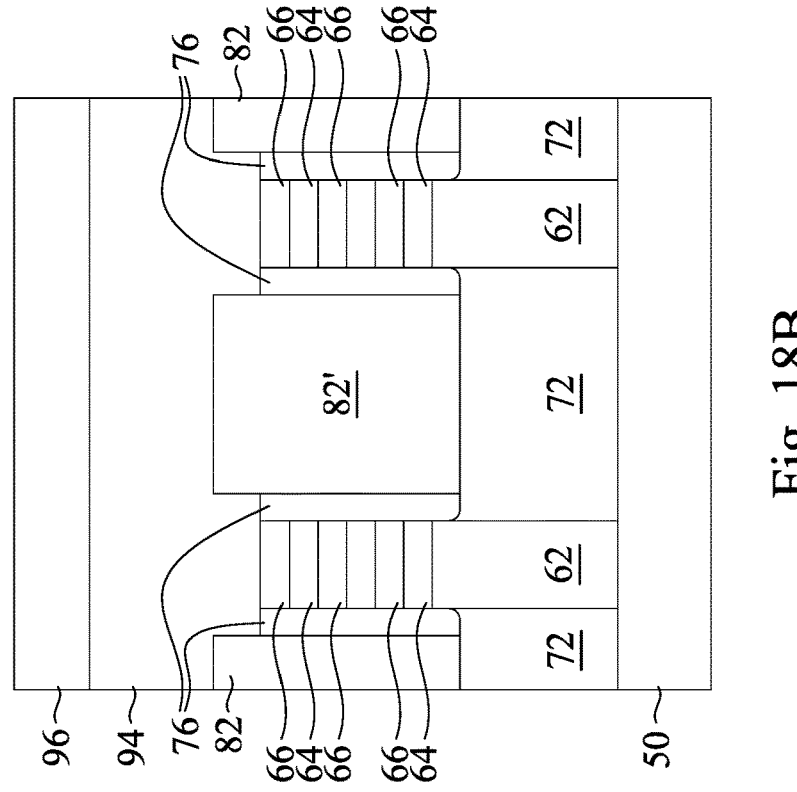
Figure 18D:
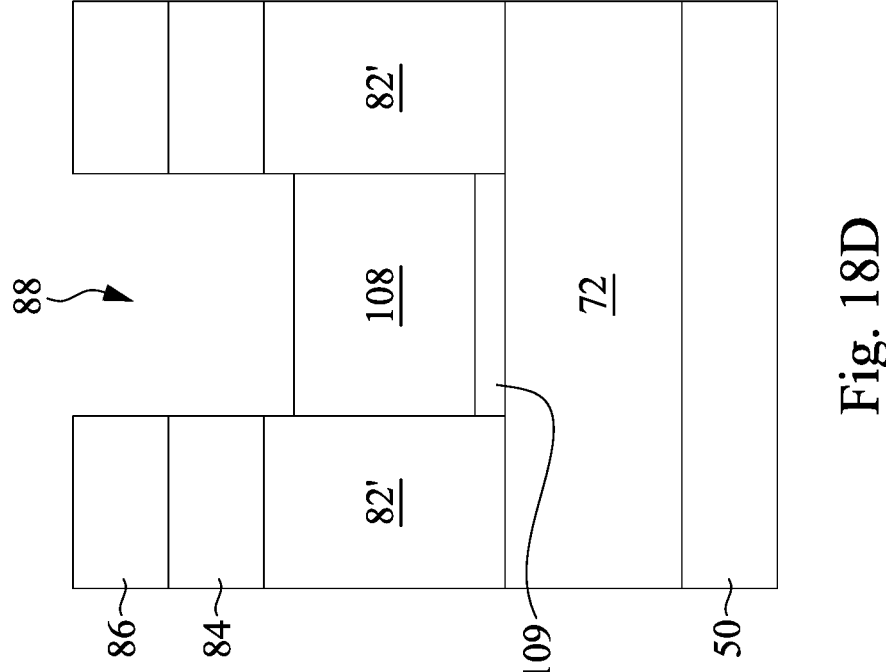

As a result of the epitaxy processes used to form the epitaxial source/drain regions 108, upper surfaces of the epitaxial source/drain regions have facets which expand laterally outward beyond sidewalls of the semiconductor fins 62 and the nanostructures 64, 66. Due to the selective patterning of the insulating fins 82', the recesses 104A and 104B may be connected by the recesses 88 in certain areas of the device as illustrated in FIG. 18C. As a result, the facets cause adjacent epitaxial source/drain regions 108 to merge, resulting in a larger epitaxial volume, which advantageously decreases epitaxial resistance and overall device resistance of the resulting transistor. For example, facets 107A and 107B of adjacent epitaxy regions of the epitaxial source/drain region 108 may merge and form a continuous epitaxy region. The epitaxial source/drain regions 108 may extend from a sidewall of a first insulating fin 82, through the patterned insulating fins 82' (see FIG. 18D), and to a sidewall of a second insulating fin 82, and an air gap 109 may be disposed between the epitaxial source/drain regions 108 and the STI regions 72. Further, a spacing $S_1$ between semiconductor fins 62 that bound the recess 88 may be selected to be relatively small to promote the epitaxial merging.

Figure 18E:
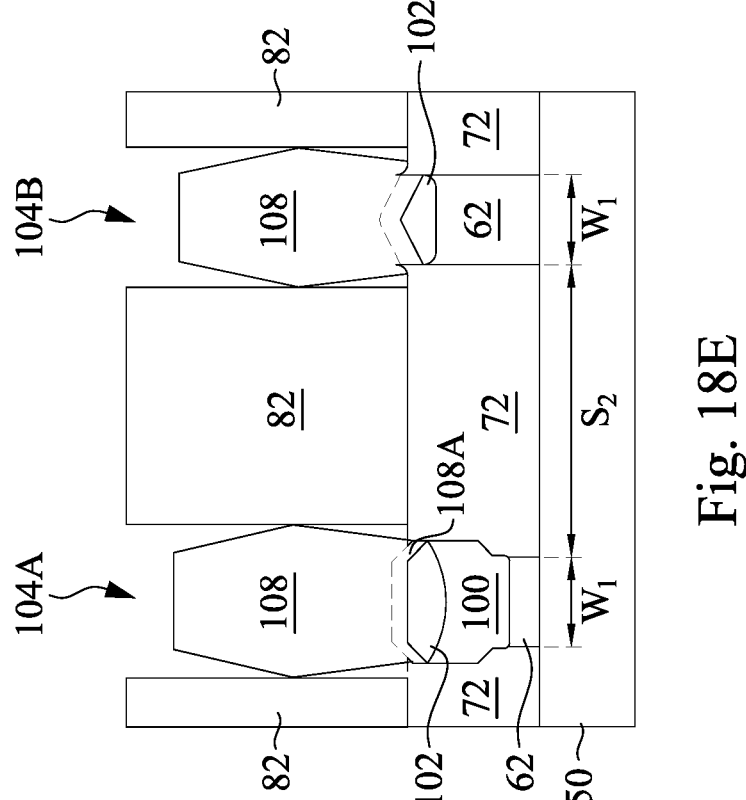

However, in other areas of the device where the insulating fins 82 was not at least partially removed in the C-C cross-section, the insulating fins 82 may block the lateral epitaxial growth of adjacent epitaxial source/drain regions 108. Therefore, adjacent epitaxial source/drain regions 108 remain separated after the epitaxy process is completed as illustrated by FIG. 18E. In these areas, a spacing $S_2$ between adjacent semiconductor fins 62 may be relatively large (e.g., larger than the spacing $S_1$). For example, the spacing $S_2$ may be in a range of about 30 nm to about 50 nm, and a ratio of the width $W_1$ of the semiconductor fins 62 to the spacing $S_2$ may be in a range of about 1 to about 2. The epitaxial source/drain regions 108 contact the sidewalls of the insulating fins 82. In the illustrated embodiment, the epitaxial source/drain regions 108 are grown so that the upper surfaces of the epitaxial source/drain regions 108 are disposed below the top surfaces of the insulating fins 82. In other embodiments, the upper surfaces of the epitaxial source/drain regions 108 are disposed above the top surfaces of the insulating fins 82; the upper surfaces of the epitaxial source/drain regions 108 have portions disposed above and below the top surfaces of the insulating fins 82; or the like.

Figure 19A:
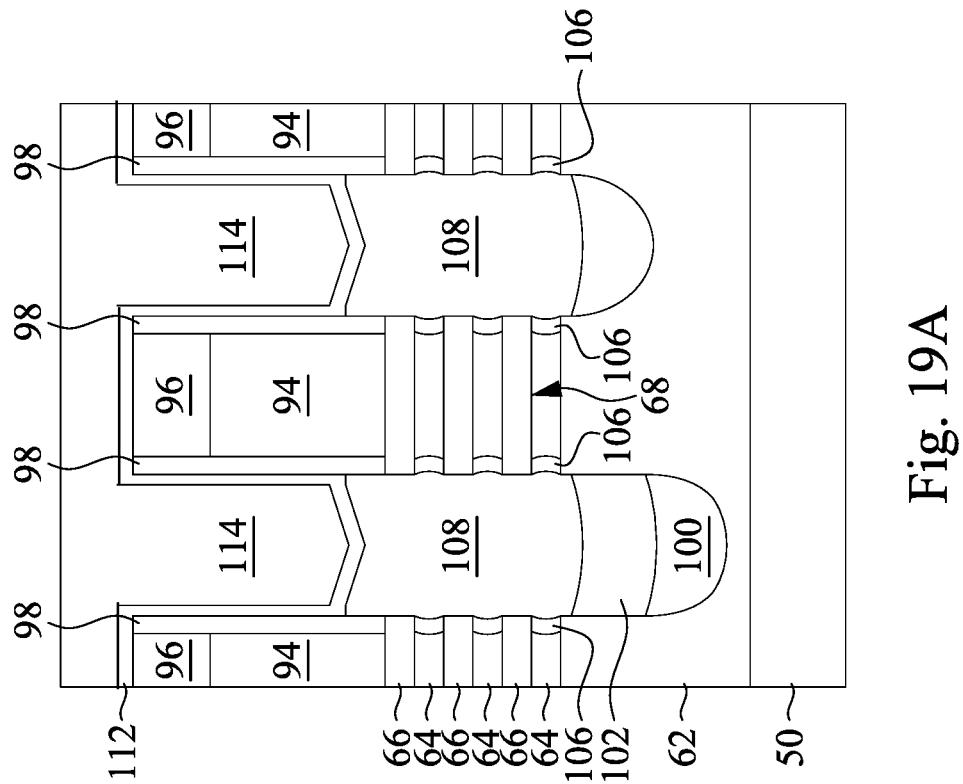
Figure 19C:
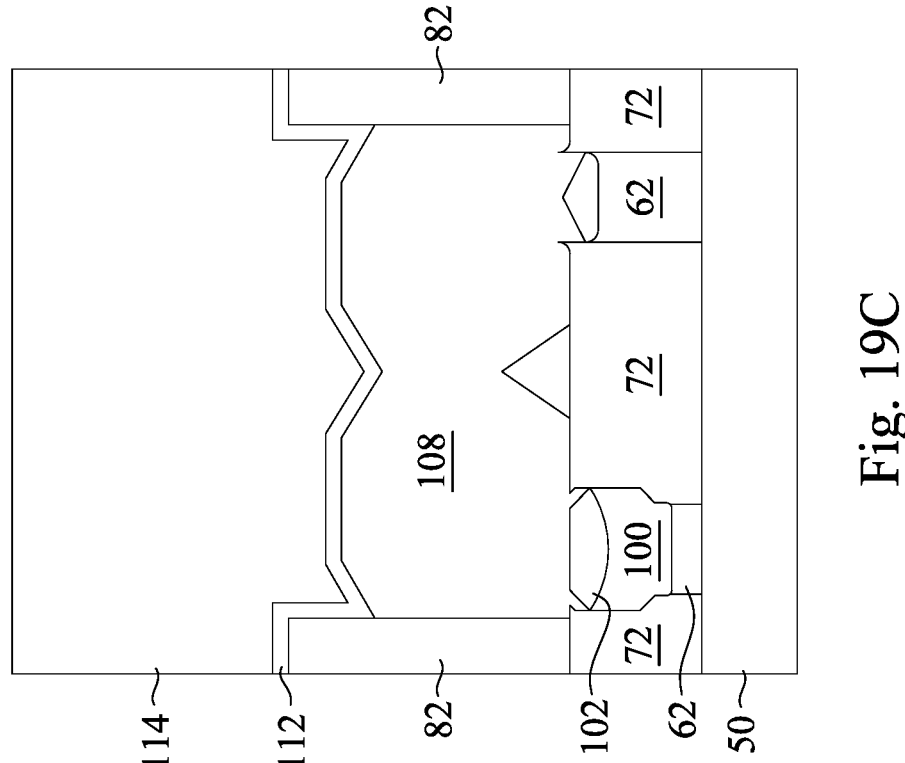
Figure 19B:
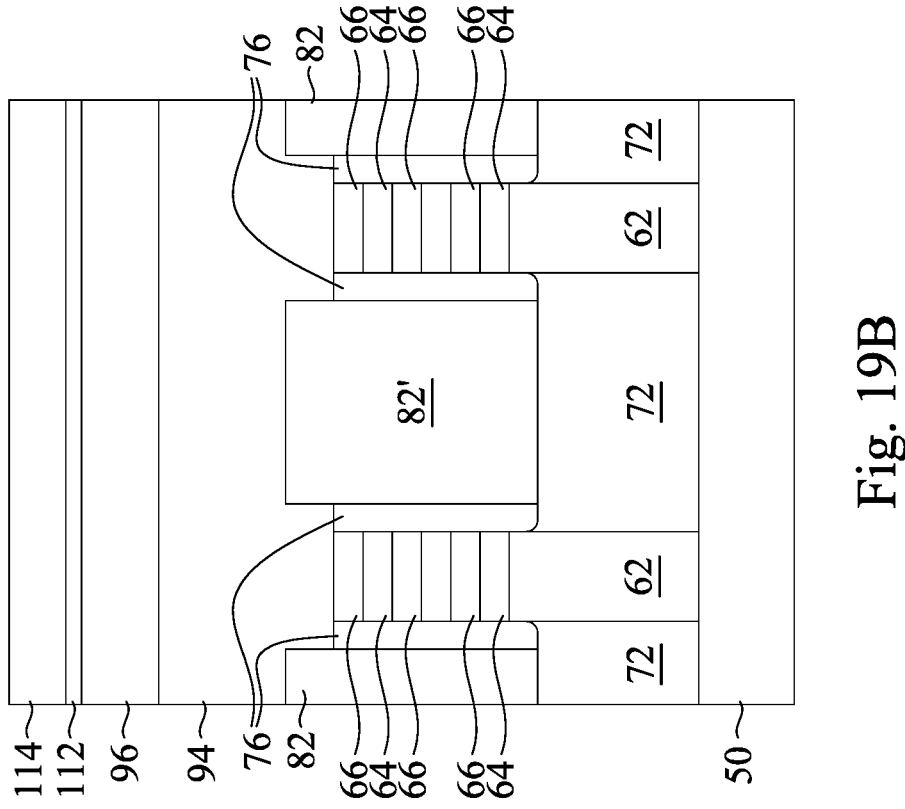

In FIGS. 19A-C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like.

Figure 20A:
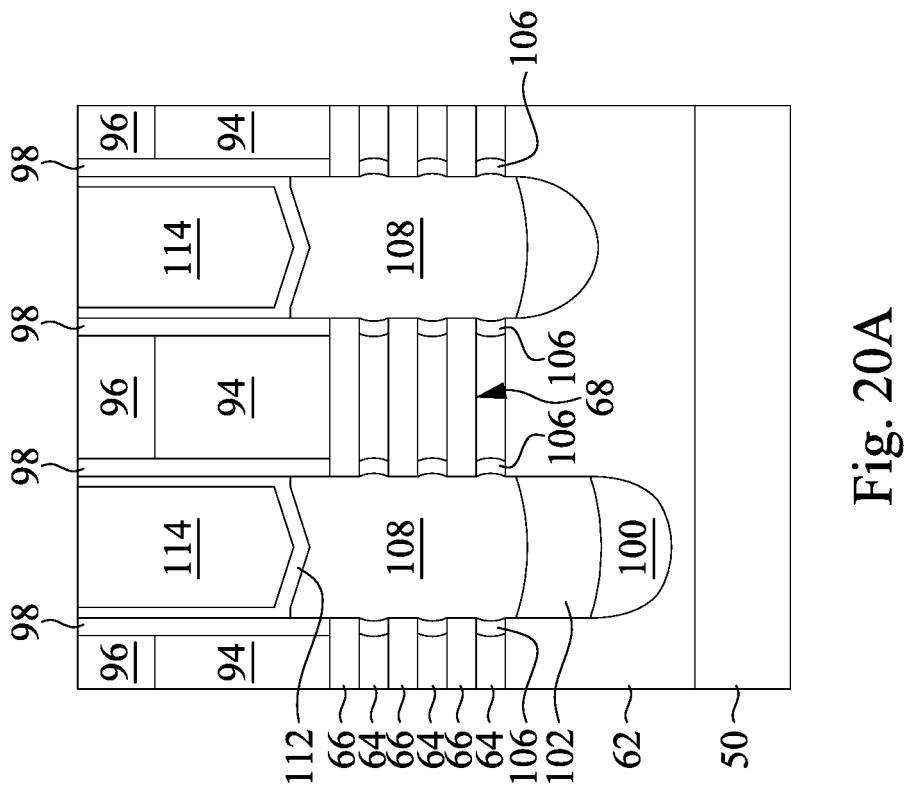
Figure 20C:
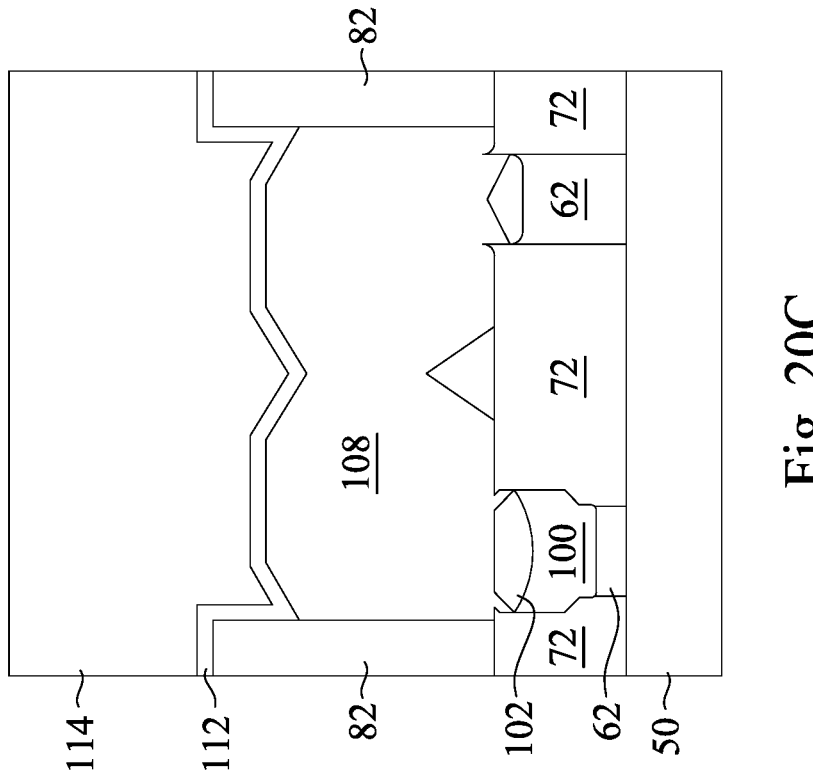
Figure 20B:
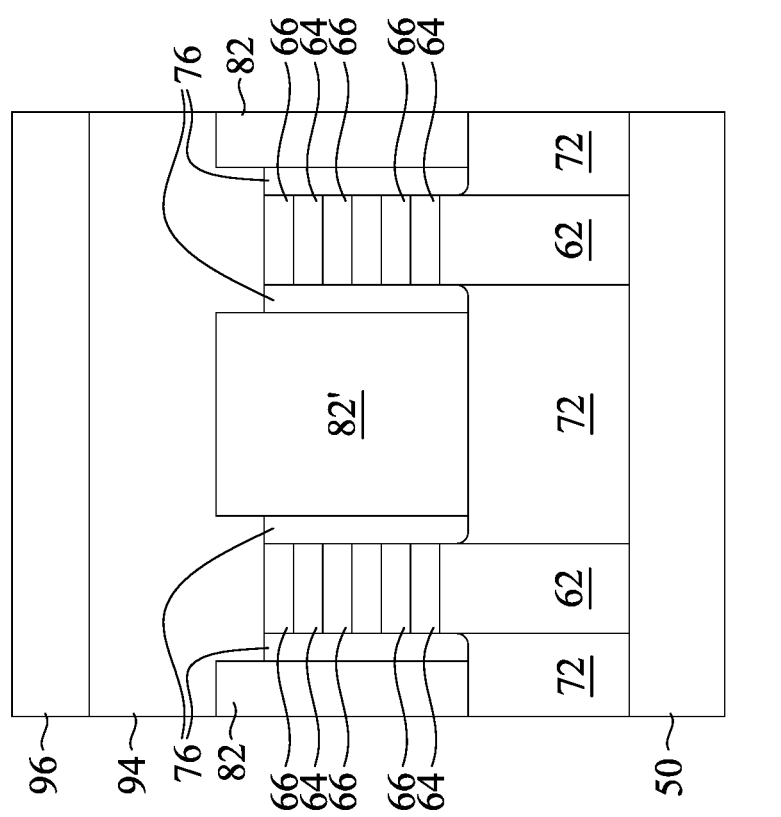

In FIGS. 20A-C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 21A:
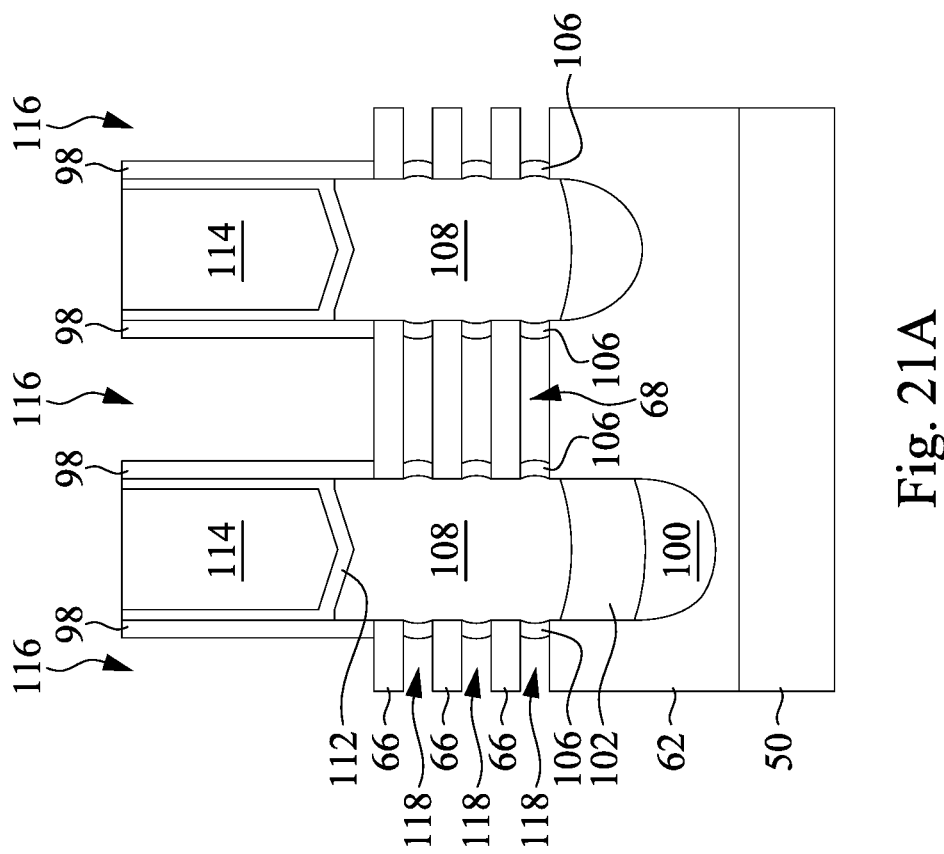
Figure 21C:
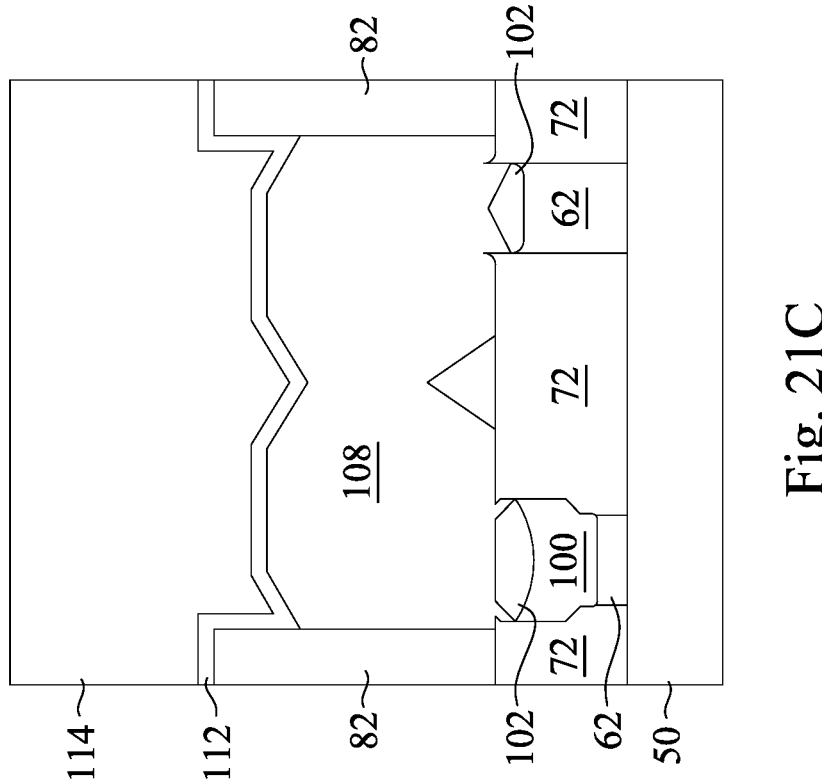
Figure 21B:
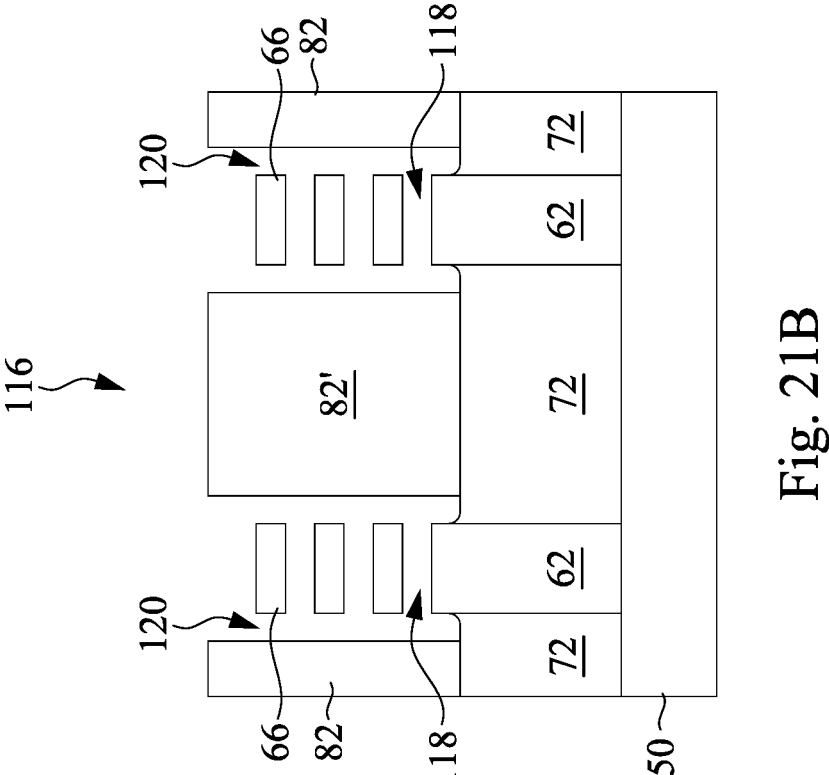

In FIGS. 21A-C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings 118 are formed in regions between the nanostructures 66. The remaining portions of the sacrificial spacers 76 are also removed to expand the recesses 116, such that openings 120 are formed in regions between semiconductor fins 62 and the insulating fins 82. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch using tetramethyl-ammonium hydroxide (TMAH), ammonium hydroxide ($NH_4OH$), or the like. In some embodiments, a trim process (not separately illustrated) is performed to decrease the thicknesses of the exposed portions of the nanostructures 66.

Figure 22A:
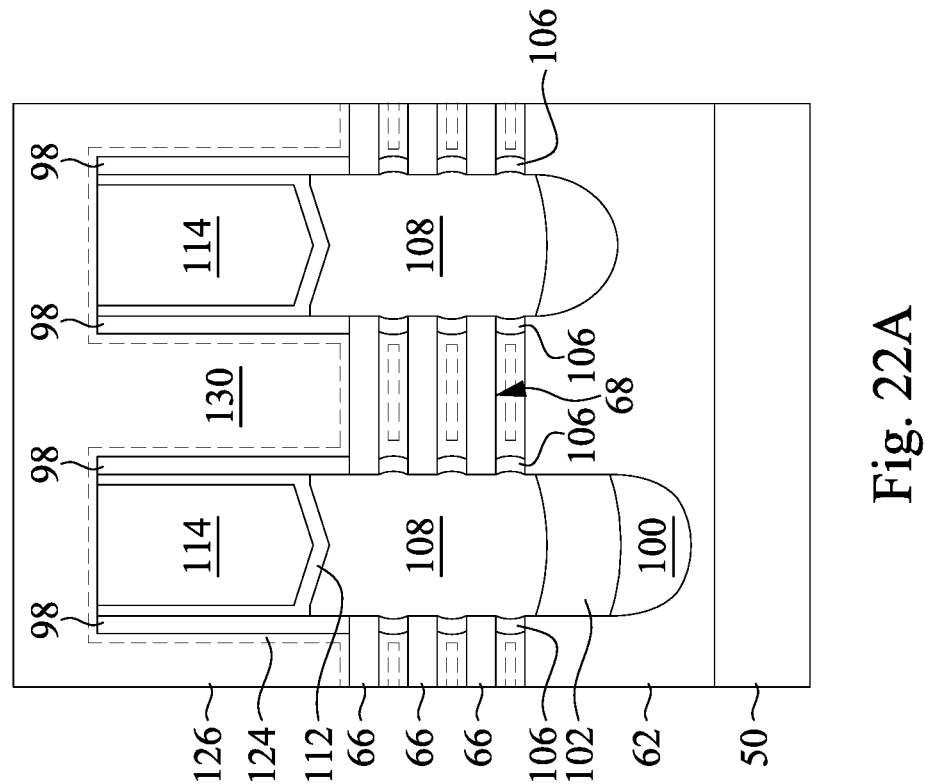
Figure 22C:
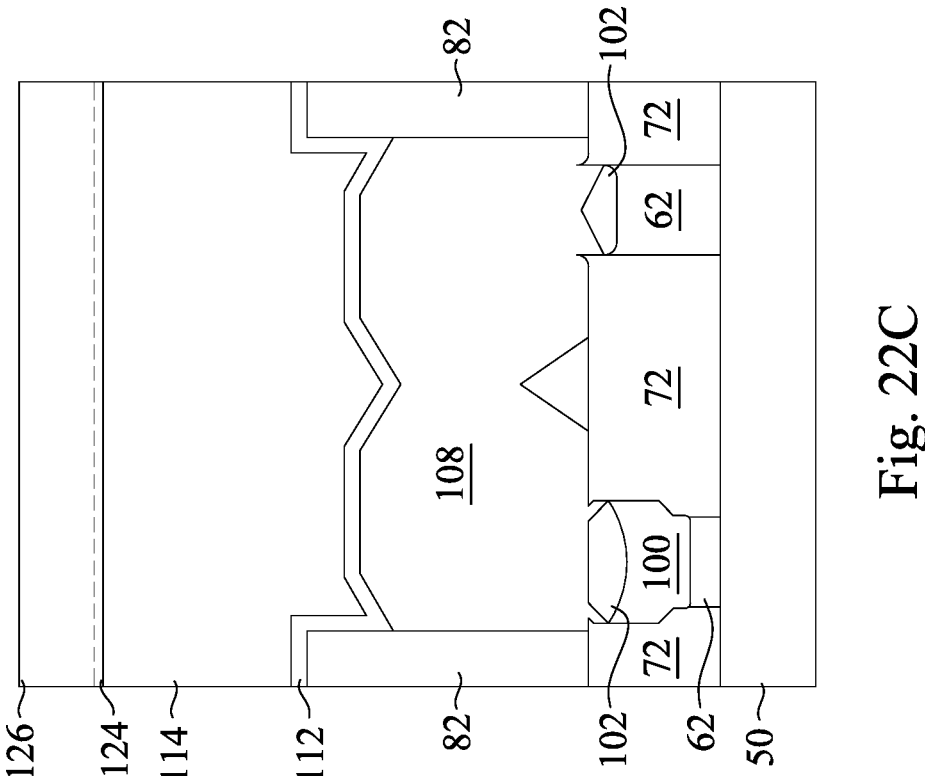
Figure 22B:
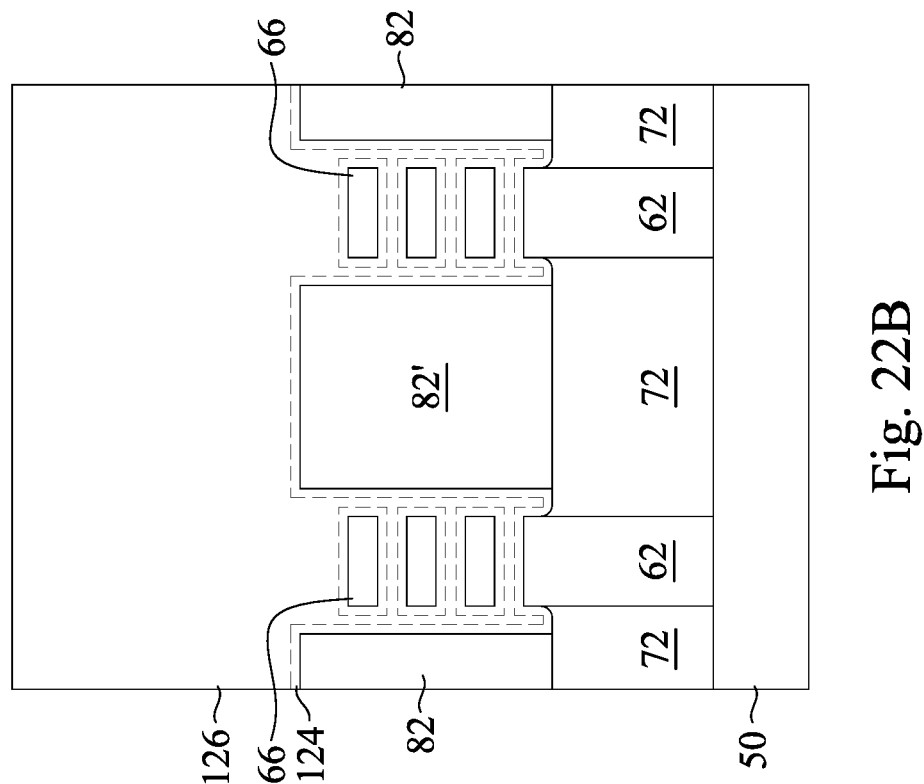

In FIGS. 22A-C, a gate dielectric layer 124 is formed in the recesses 116. A gate electrode layer 126 is formed on the gate dielectric layer 124. The gate dielectric layer 124 and the gate electrode layer 126 are layers for replacement gates, and each wrap around all (e.g., four) sides of the nanostructures 66. Thus, the gate dielectric layer 124 and the gate electrode layer 126 are formed in the openings 118 and the openings 120 (see FIGS. 21A and 21B).

The gate dielectric layer 124 is disposed on the sidewalls and/or the top surfaces of the semiconductor fins 62; on the top surfaces, the sidewalls, and the bottom surfaces of the nanostructures 66; on the sidewalls of the inner spacers 106 adjacent the epitaxial source/drain regions 108 and the gate spacers 98 on top surfaces of the top inner spacers 106; and on the top surfaces and the sidewalls of the insulating fins 82. The gate dielectric layer 124 may also be formed on the top surfaces of the first ILD 114 and the gate spacers 98. The gate dielectric layer 124 may include an oxide such as silicon oxide or a metal oxide, a silicate such as a metal silicate, combinations thereof, multi-layers thereof, or the like. The gate dielectric layer 124 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 124 is illustrated in FIGS. 22A-C, the gate dielectric layer 124 may include any number of interfacial layers and any number of main layers.

The gate electrode layer 126 may include a metal-containing material such as titanium nitride, titanium oxide, tungsten, cobalt, ruthenium, aluminum, combinations thereof, multi-layers thereof, or the like. Although a single-layered gate electrode layer 126 is illustrated in FIGS. 22A-C, the gate electrode layer 126 may include any number of work function tuning layers, any number of barrier layers, any number of glue layers, and a fill material.

The formation of the gate dielectric layers 124 in the n-type region 50N and the p-type region 50P may occur simultaneously such that the gate dielectric layers 124 in each region are formed of the same materials, and the formation of the gate electrode layers 126 may occur simultaneously such that the gate electrode layers 126 in each region are formed of the same materials. In some embodiments, the gate dielectric layers 124 in each region may be formed by distinct processes, such that the gate dielectric layers 124 may be different materials and/or have a different number of layers, and/or the gate electrode layers 126 in each region may be formed by distinct processes, such that the gate electrode layers 126 may be different materials and/or have a different number of layers. Various masking steps may be used to mask and expose appropriate regions when using distinct processes.

Figure 23A:
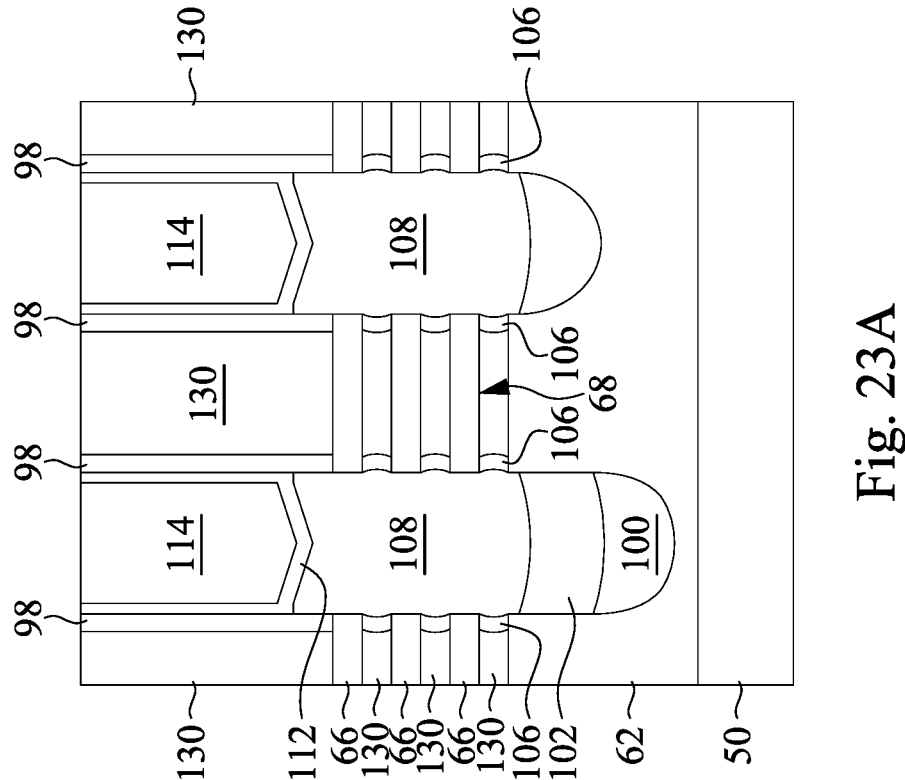
Figure 23C:
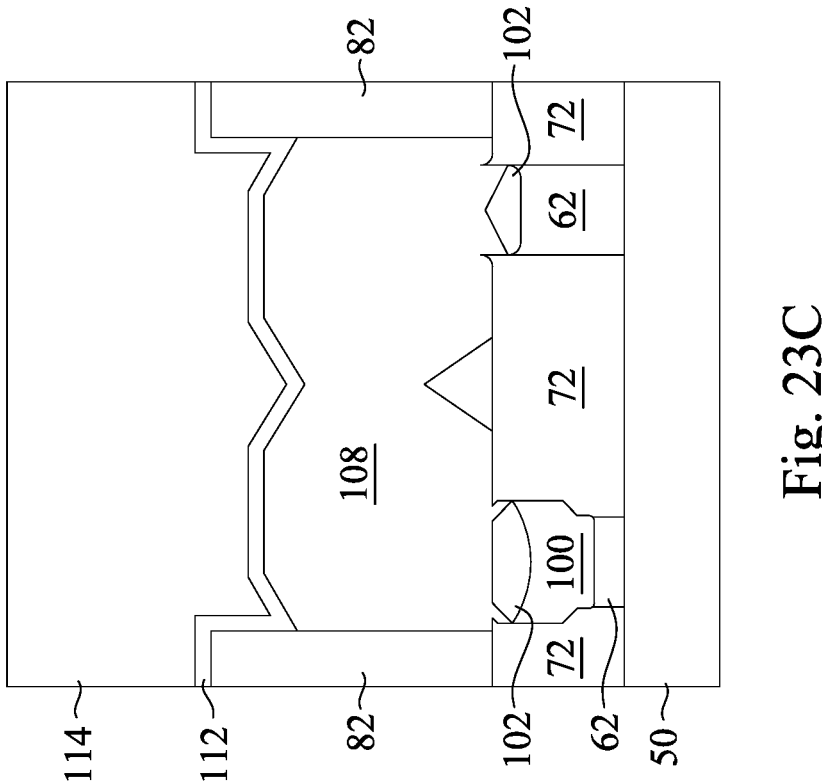
Figure 23B:
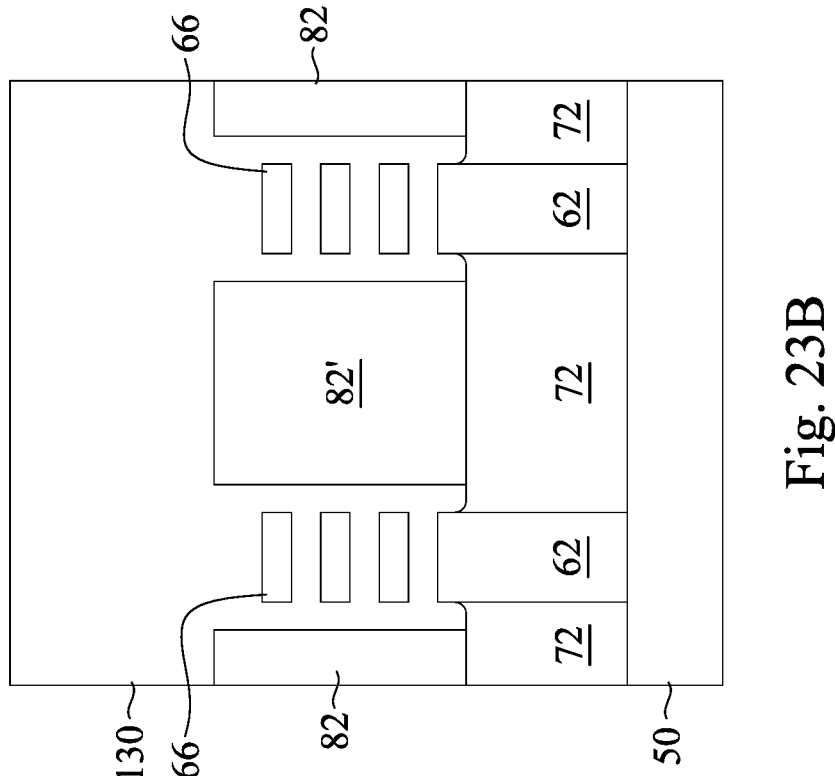

In FIGS. 23A-C, a removal process is performed to remove the excess portions of the materials of the gate dielectric layer 124 and the gate electrode layer 126, which excess portions are over the top surfaces of the first ILD 114 and the gate spacers 98, thereby forming gate structures 130. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures 130). The gate electrode layer 126, when planarized, has portions left in the recesses 116 (thus forming gate electrodes for the gate structures 130). The top surfaces of the gate spacers 98; the CESL 112; the first ILD 114; and the gate structures 130 are coplanar (within process variations). The gate structures 130 are replacement gates of the resulting nano-FETs, and may be referred to as "metal gates." The gate structures 130 each extend along top surfaces, sidewalls, and bottom surfaces of a channel region 68 of the nanostructures 66. The gate structures 130 fill the area previously occupied by the nanostructures 64, the sacrificial spacers 76, and the dummy gates 94.

Figure 24A:
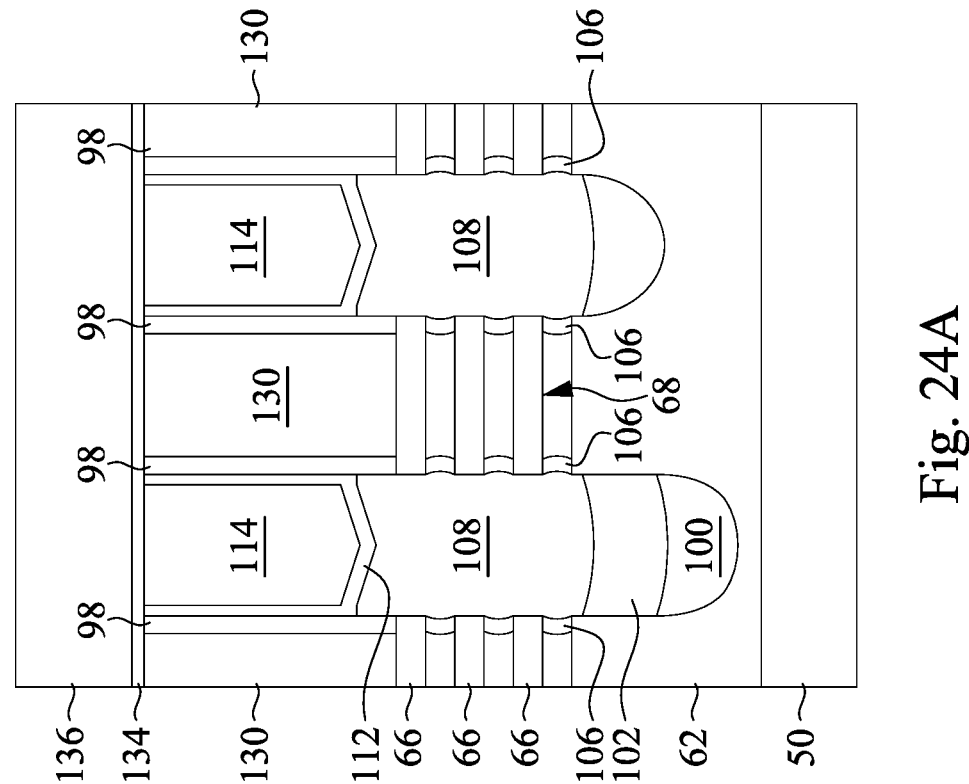
Figure 24C:
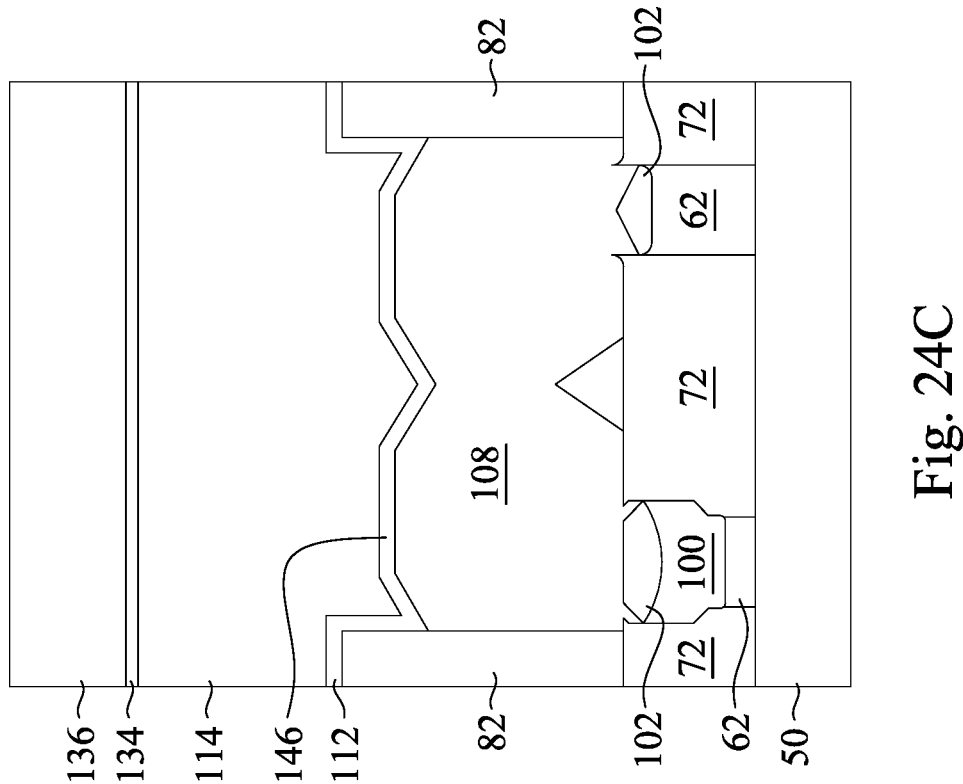
Figure 24B:
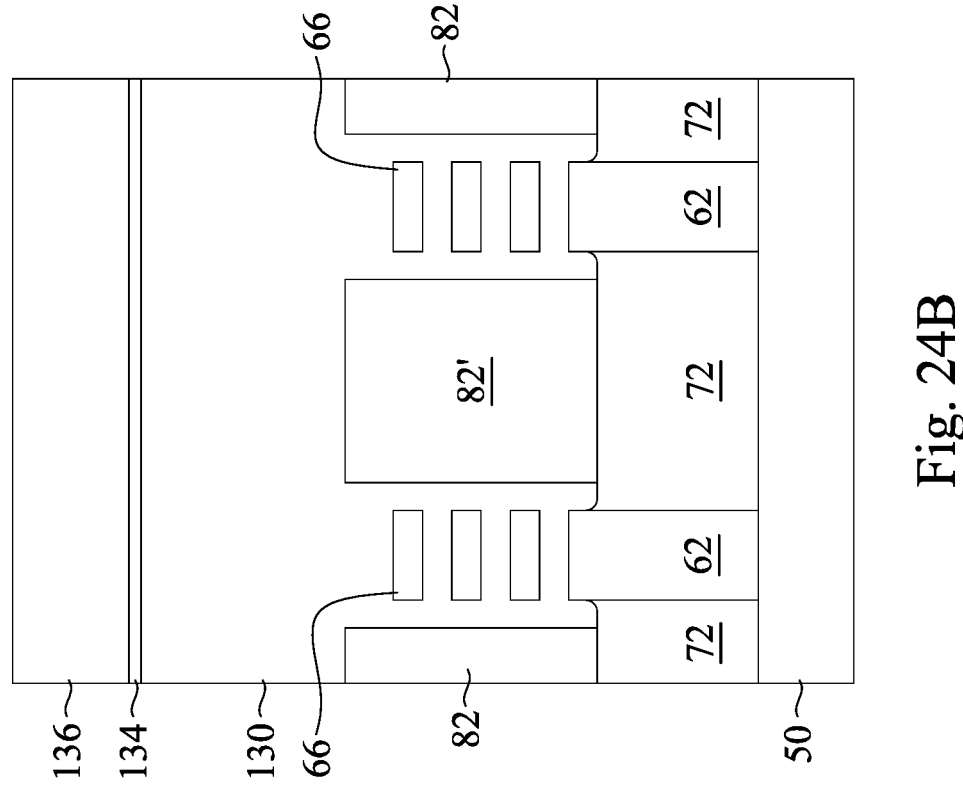

In FIGS. 24A-24C, a second ILD 136 is deposited over the gate spacers 98 98, the CESL 112, the first ILD 114, and the gate structures 130. In some embodiments, the second ILD 136 is a flowable film formed by a flowable CVD method. In some embodiments, the second ILD 136 is formed of a dielectric material such as PSG, BSG, BPSG, USG, or the like, which may be deposited by any suitable method, such as CVD, PECVD, or the like.

In some embodiments, an etch stop layer (ESL) 134 is formed between the second ILD 136 and the gate spacers 98, the CESL 112, the first ILD 114, and the gate structures 130. The ESL 134 may include a dielectric material, such as silicon nitride, silicon oxide, silicon oxynitride, or the like, having a high etching selectivity from the etching of the second ILD 136.

Figure 25A:
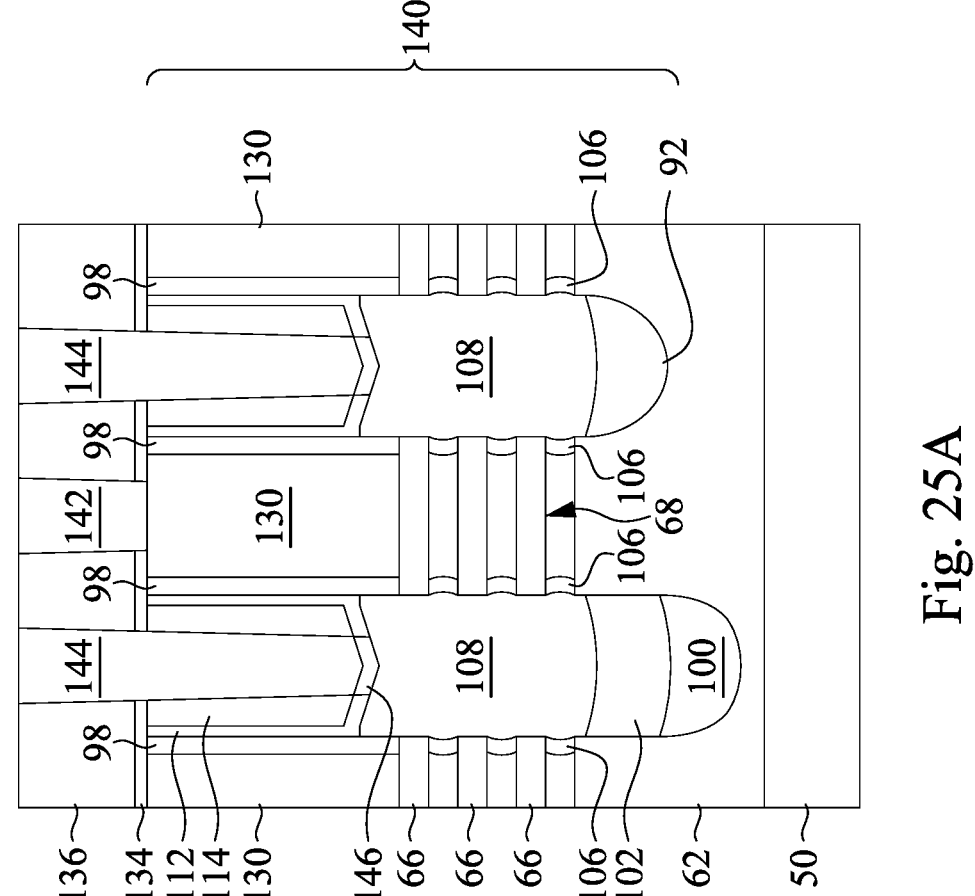
Figure 25C:
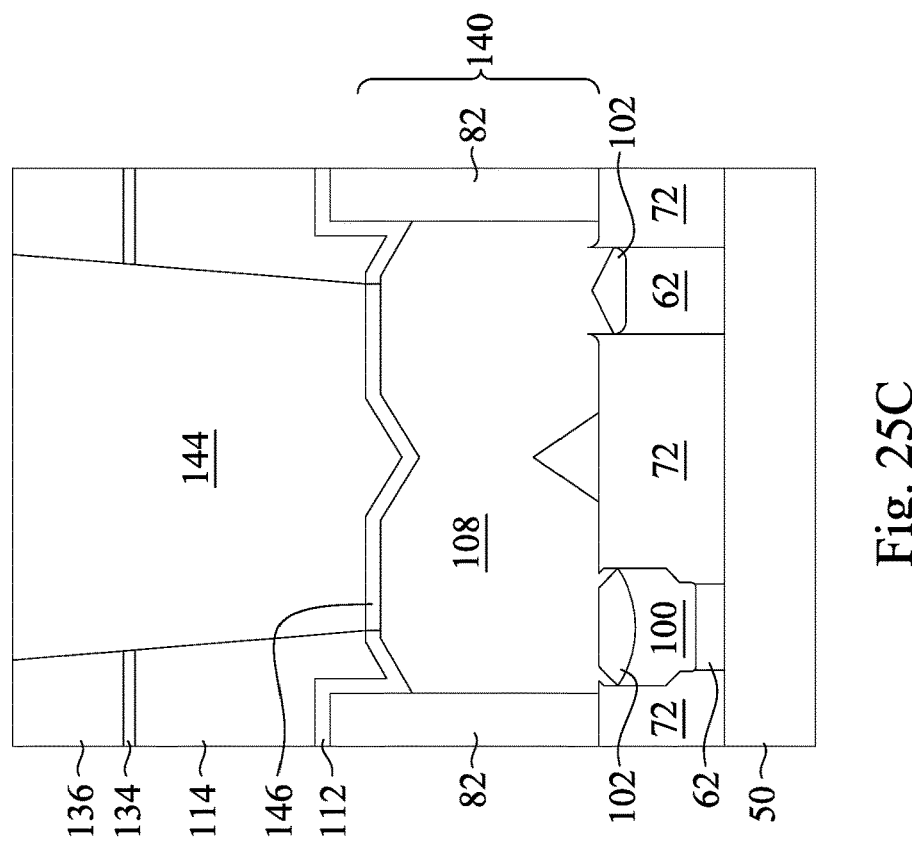
Figure 25B:
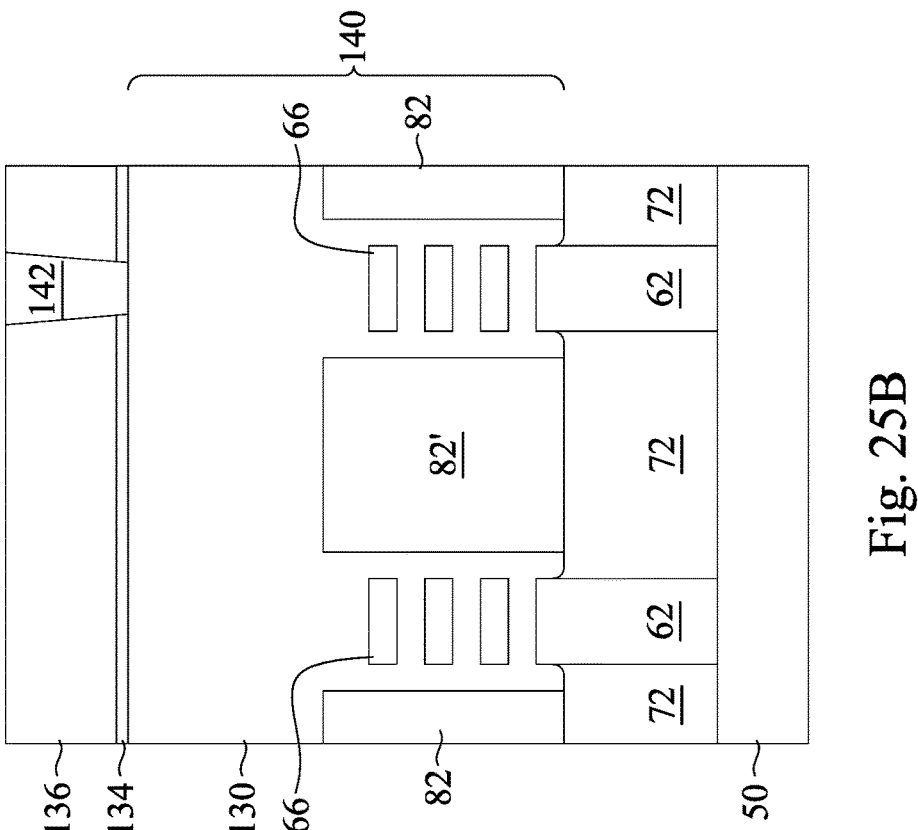

In FIGS. 25A-25C, gate contacts 142 and source/drain contacts 144 are formed to contact, respectively, the gate structures 130 and the epitaxial source/drain regions 108. The gate contacts 142 are physically and electrically coupled to the gate structures 130. The source/drain contacts 144 are physically and electrically coupled to the epitaxial source/drain regions 108.

As an example to form the gate contacts 142 and the source/drain contacts 144, openings for the gate contacts 142 are formed through the second ILD 136 and the ESL 134, and openings for the source/drain contacts 144 are formed through the second ILD 136, the ESL 134, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 136. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Due to the increased surface area of the merged epitaxial source/drain regions 108, a landing area of the source/drain contacts 144 may be increased, thereby reducing contact resistance and increasing source/drain contact processing windows. This decreased contact resistance combines with reduced epitaxy resistance (discussed above) to lower overall device resistance, facilitate current flow through the merged source/drain regions 108, and improve overall electrical performance of the resulting transistor device.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

The epitaxial source/drain regions 108, the nanostructures 66, and the gate structures 130 may collectively be referred to as transistor structures 140. The transistor structures 140 may be formed in a device layer, with a first interconnect structure (such as the front-side interconnect structure 150, discussed below with respect to FIGS. 26A-C) being formed over a front-side thereof and a second interconnect structure (such as the backside interconnect structure 186, discussed below with respect to FIGS. 34A-C) being formed over a backside thereof. Although the device layer is described as having nano-FETs, other embodiments may include a device layer having different types of transistors (e.g., planar FETs, finFETs, thin film transistors (TFTs), or the like).

FIGS. 26A through 35C illustrate intermediate steps of forming front-side interconnect structures and backside interconnect structures on the transistor structures 140. The front-side interconnect structures and the backside interconnect structures may each comprise conductive features that are electrically connected to the nano-FETs formed on the substrate 50. FIGS. 26A, 27A, 28A, 29A, 30A, 31A, 32A, 33A, 34A, and 35A illustrate reference cross-section A-A' illustrated in FIG. 1. FIGS. 26B, 27B, 28B, 29B, 30B, 31B, 32B, 33B, 34B, and 35B illustrate reference cross-section B-B' illustrated in FIG. 1. FIGS. 26C, 27C, 28C, 29C, 30C, 31C, 32C, 33C, 34C, and 35C illustrate reference cross-section C-C' illustrated in FIG. 1. The process steps described in FIGS. 26A through 35C may be applied to both the n-type region 50N and the p-type region 50P. A back-side conductive feature (e.g., a backside via or a power rail) may be connected to one or more of the epitaxial source/drain regions 108. As such, the front-side source/drain contacts 144 may be optionally omitted from connecting to one or more of the epitaxial source/drain regions 108.

Figure 26A:
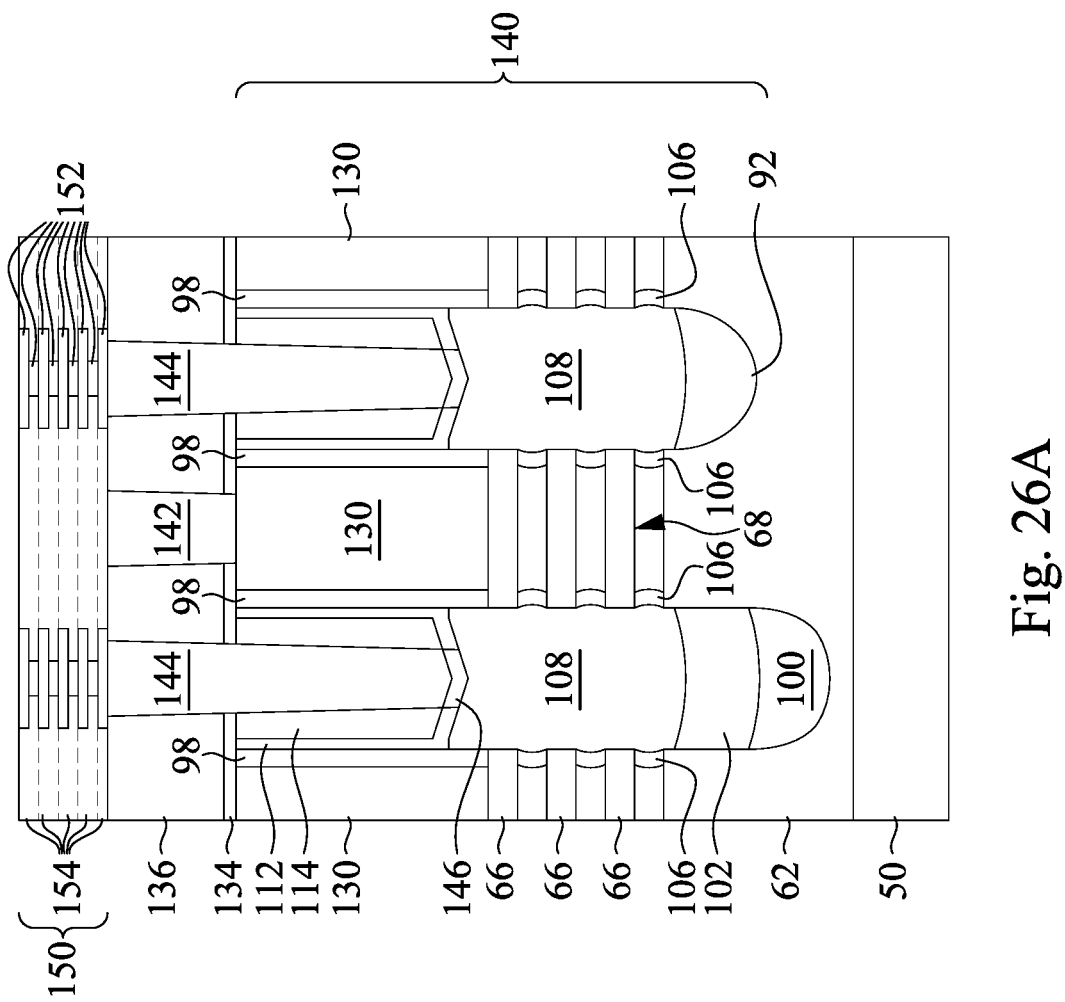
FIGS. 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, and 35C are cross-sectional views of intermediate stages of manufacturing interconnect structures on the nano-FETs, in accordance with some embodiments.
Figures 26B, 26C:
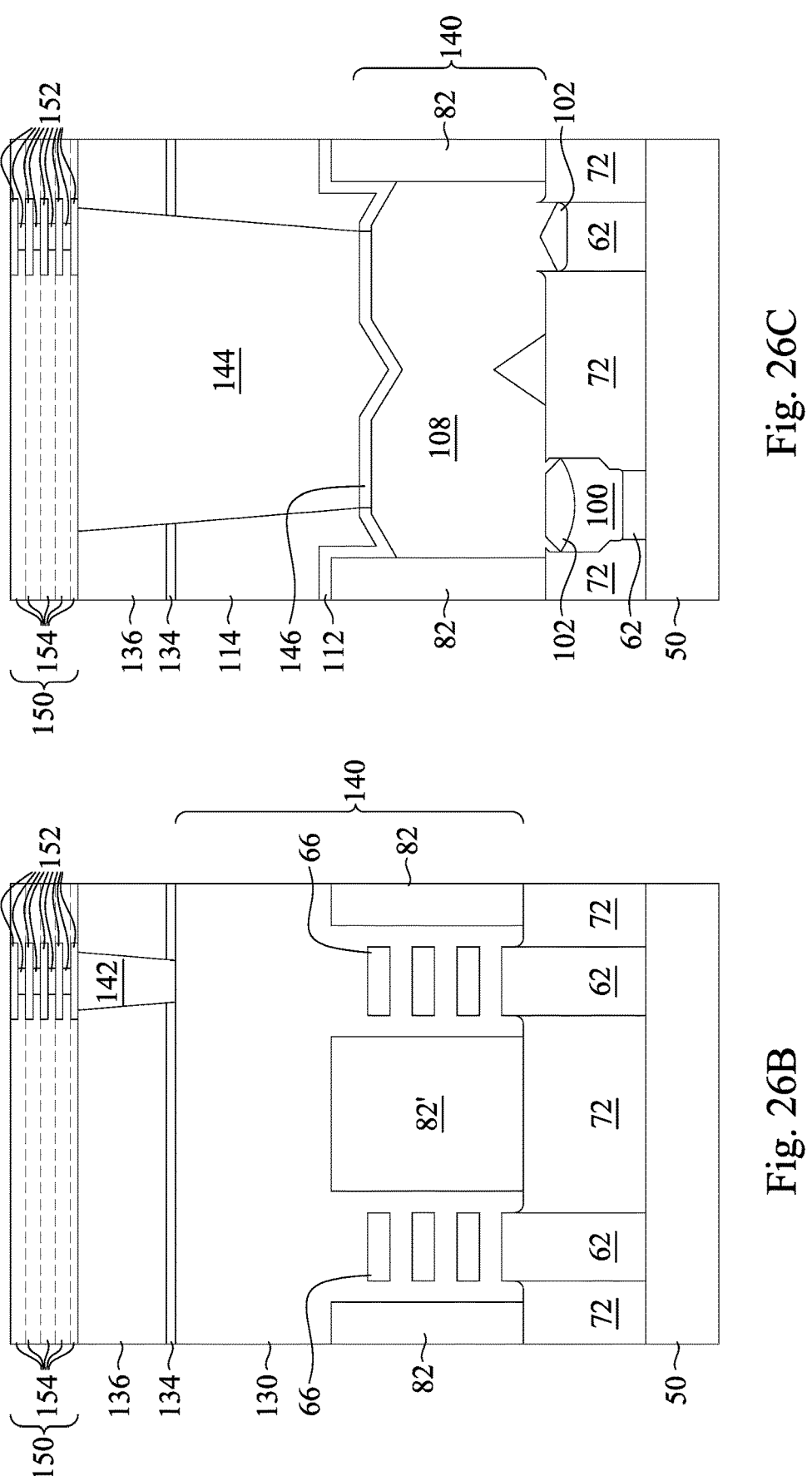

In FIGS. 26A-C, a front-side interconnect structure 150 is formed on the second ILD 136. The front-side interconnect structure 150 may be referred to as a front-side interconnect structure because it is formed on a front-side of the transistor structures 140.

The front-side interconnect structure 150 may comprise one or more layers of first conductive features 152 formed in one or more stacked first dielectric layers 154. Each of the stacked first dielectric layers 154 may comprise a dielectric material, such as a low-k dielectric material, an extra low-k (ELK) dielectric material, or the like. The first dielectric layers 154 may be deposited using an appropriate process, such as, CVD, ALD, PVD, PECVD, or the like.

The first conductive features 152 may comprise conductive lines and conductive vias interconnecting the layers of conductive lines. The conductive vias may extend through respective ones of the first dielectric layers 154 to provide vertical connections between layers of the conductive lines. The first conductive features 152 may be formed through any acceptable process, such as, a damascene process, a dual damascene process, or the like.

In some embodiments, the first conductive features 152 may be formed using a damascene process in which a respective first dielectric layer 154 is patterned utilizing a combination of photolithography and etching techniques to form trenches corresponding to the desired pattern of the first conductive features 152. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 152 may be formed by depositing a seed layer of copper or a copper alloy, and filling the trenches by electroplating. A chemical mechanical planarization (CMP) process or the like may be used to remove excess conductive material from a surface of the respective first dielectric layer 154 and to planarize surfaces of the first dielectric layer 154 and the first conductive features 152 for subsequent processing.

FIGS. 26A-C illustrate five layers of the first conductive features 152 and the first dielectric layers 154 in the front-side interconnect structure 150. However, it should be appreciated that the front-side interconnect structure 150 may comprise any number of first conductive features 152 disposed in any number of first dielectric layers 154. The front-side interconnect structure 150 may be electrically connected to the gate contacts 142 and the source/drain contacts 144 to form functional circuits. In some embodiments, the functional circuits formed by the front-side interconnect structure 150 may comprise logic circuits, memory circuits, image sensor circuits, or the like.

Figure 27A:
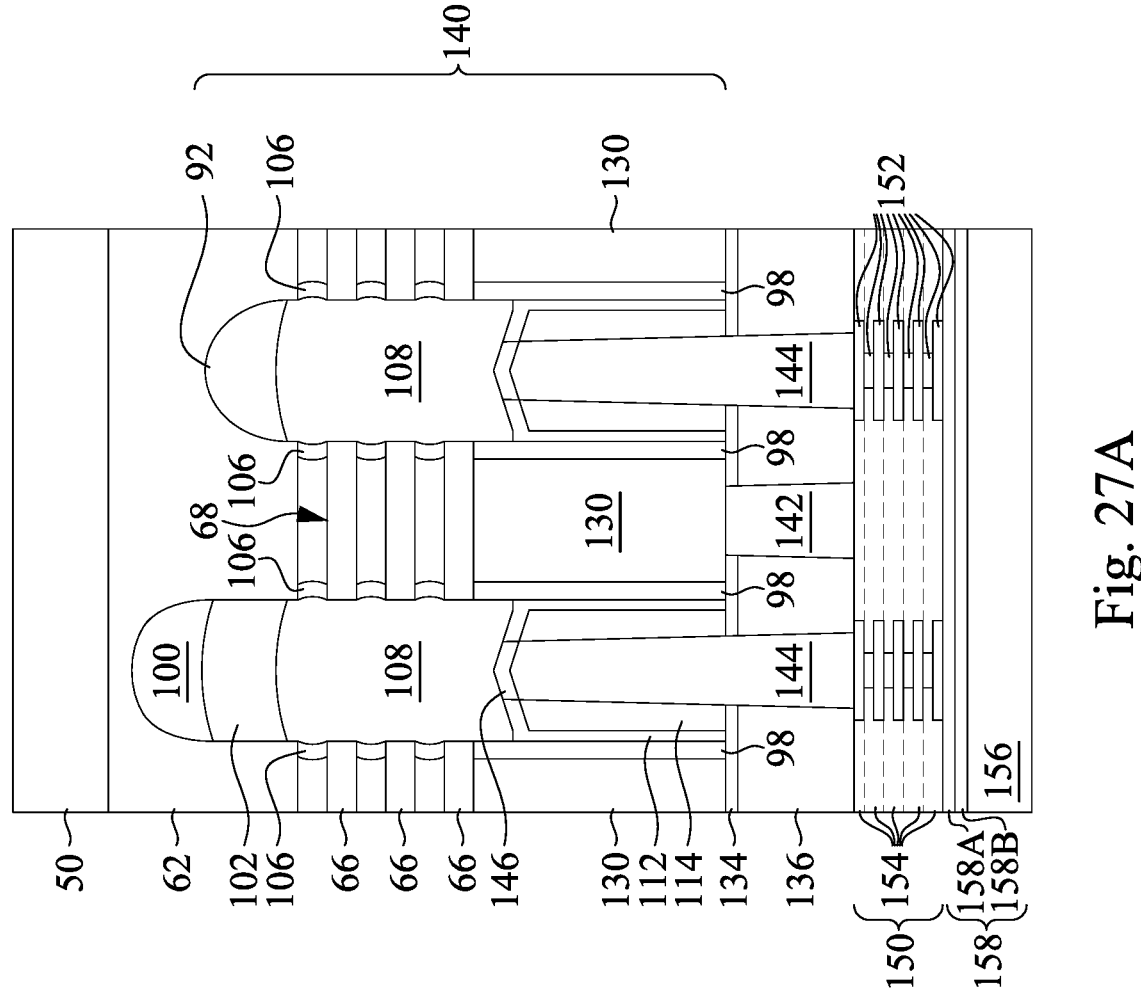
Figures 27B, 27C:
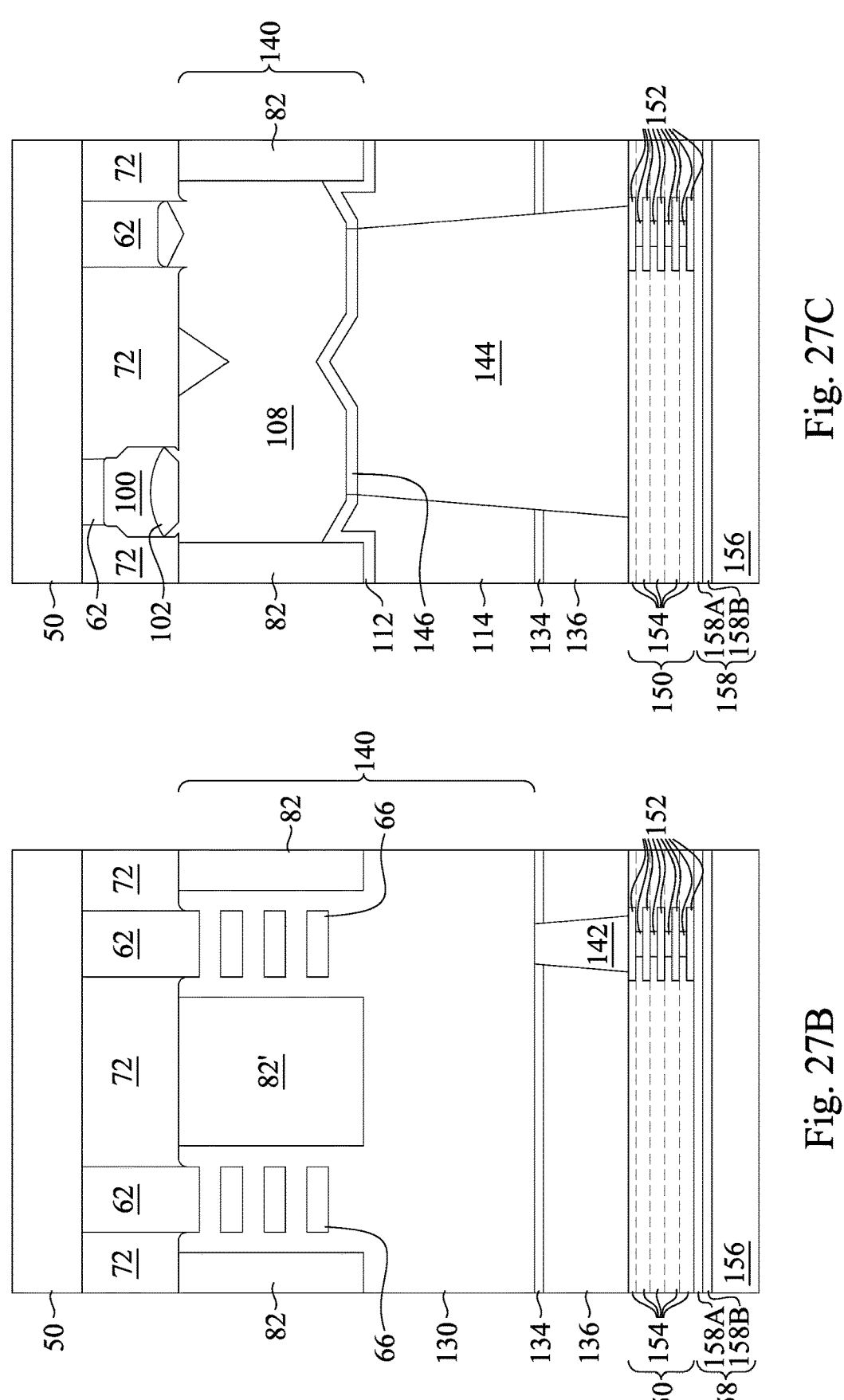

In FIGS. 27A-C, a carrier substrate 156 is bonded to a top surface of the front-side interconnect structure 150 by a first bonding layer 158A and a second bonding layer 158B (collectively referred to as a bonding layer 158). The carrier substrate 156 may be a glass carrier substrate, a ceramic carrier substrate, a wafer (e.g., a silicon wafer), or the like. The carrier substrate 156 may provide structural support during subsequent processing steps and in the completed device.

In various embodiments, the carrier substrate 156 may be bonded to the front-side interconnect structure 150 using a suitable technique, such as dielectric-to-dielectric bonding, or the like. The dielectric-to-dielectric bonding may comprise depositing the first bonding layer 158A on the front-side interconnect structure 150. In some embodiments, the first bonding layer 158A comprises silicon oxide (e.g., a high density plasma (HDP) oxide, or the like) that is deposited by CVD, ALD, PVD, or the like. The second bonding layer 158B may likewise be an oxide layer that is formed on a surface of the carrier substrate 156 prior to bonding using, for example, CVD, ALD, PVD, thermal oxidation, or the like. Other suitable materials may be used for the first bonding layer 158A and the second bonding layer 158B.

The dielectric-to-dielectric bonding process may further include applying a surface treatment to one or more of the first bonding layer 158A and the second bonding layer 158B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 158. The carrier substrate 156 is then aligned with the front-side interconnect structure 150 and the two are pressed against each other to initiate a pre-bonding of the carrier substrate 156 to the front-side interconnect structure 150. The pre-bonding may be performed at room temperature (e.g., between about 21° C. and about 25° C.). After the pre-bonding, an annealing process may be applied by, for example, heating the front-side interconnect structure 150 and the carrier substrate 156 to a temperature of about 150° C. to 400° C.

Further in FIGS. 27A-C, after the carrier substrate 156 is bonded to the front-side interconnect structure 150, the device may be flipped such that a backside of the transistor structures 140 faces upwards. The backside of the transistor structures 140 may refer to a side opposite to the front-side of the transistor structures 140 on which the front-side interconnect structure 150 is formed.

Figure 28A:
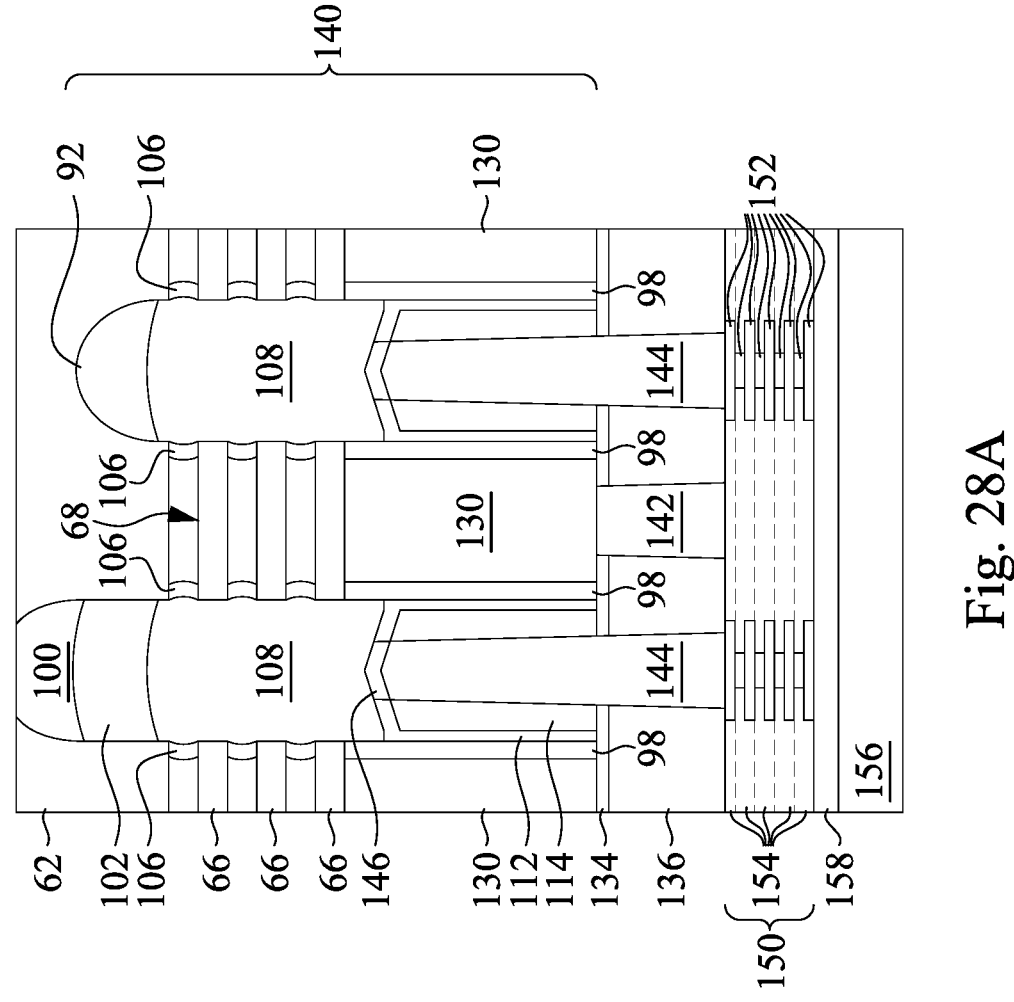
Figures 28B, 28C:
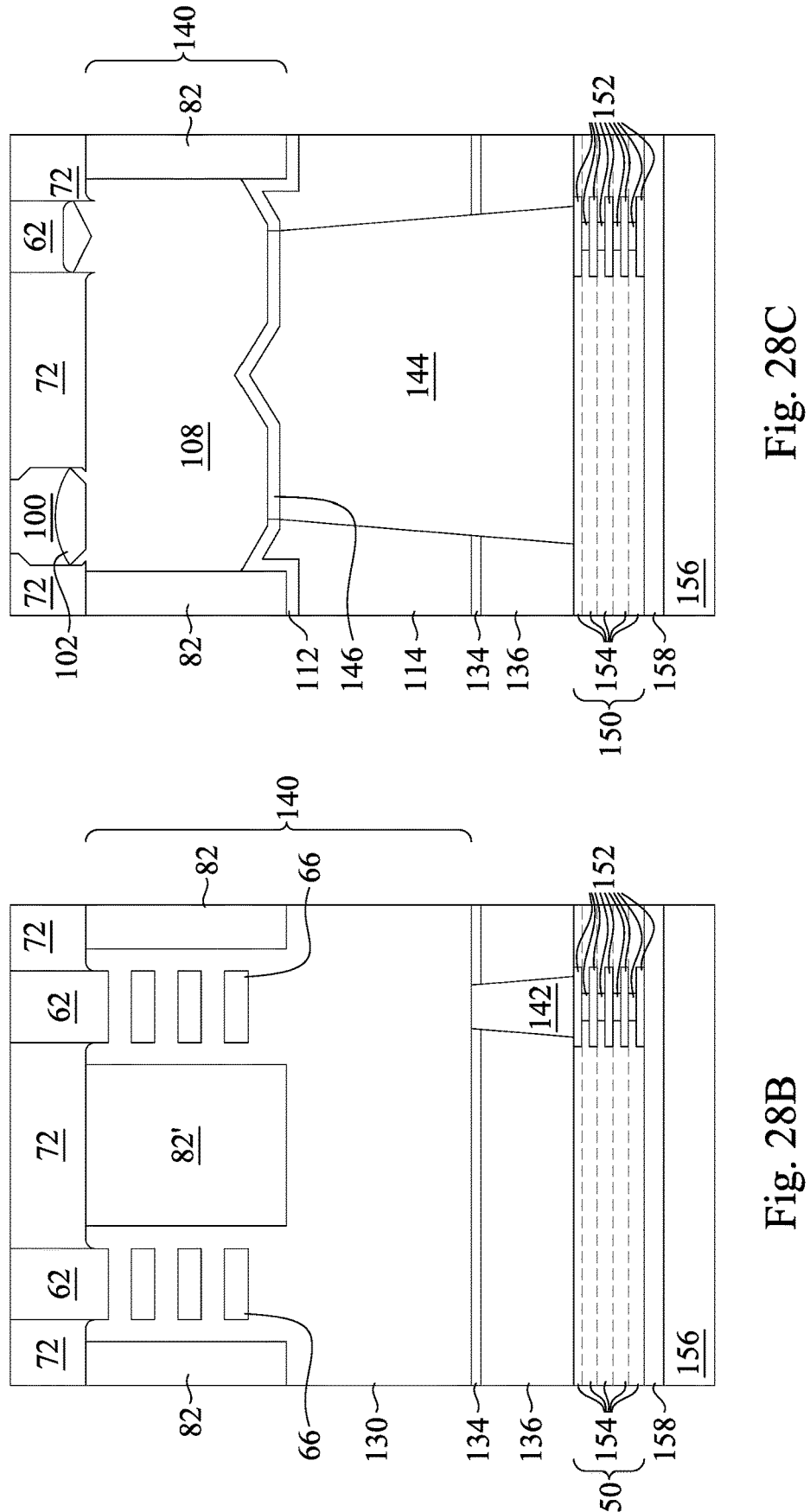

In FIGS. 28A-C, a thinning process may be applied to the backside of the substrate 50 and/or the semiconductor fins 62. The thinning process may comprise a planarization process (e.g., a mechanical grinding, a CMP, or the like), an etch-back process, a combination thereof, or the like. The thinning process may expose surfaces of the dummy epitaxial materials 100 opposite the front-side interconnect structure 150. In some embodiments, the thinning process removes the substrate 50 and leaves a portion of the semiconductor fins 62 over the gate structures 130 and the nanostructures 66. As illustrated in 28A-C, backside surfaces of the semiconductor fins 62, the dummy epitaxial materials 100, and the STI regions 72 may be level with one another following the thinning process.

Figure 29A:
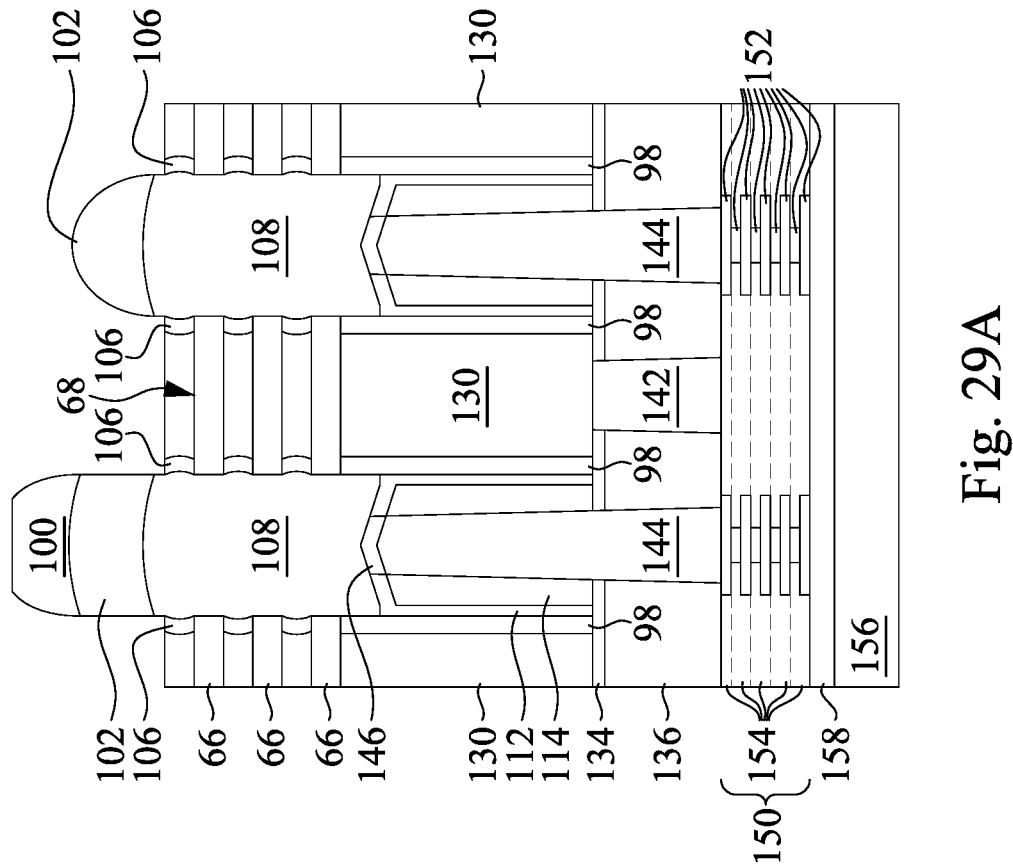
Figure 29C:
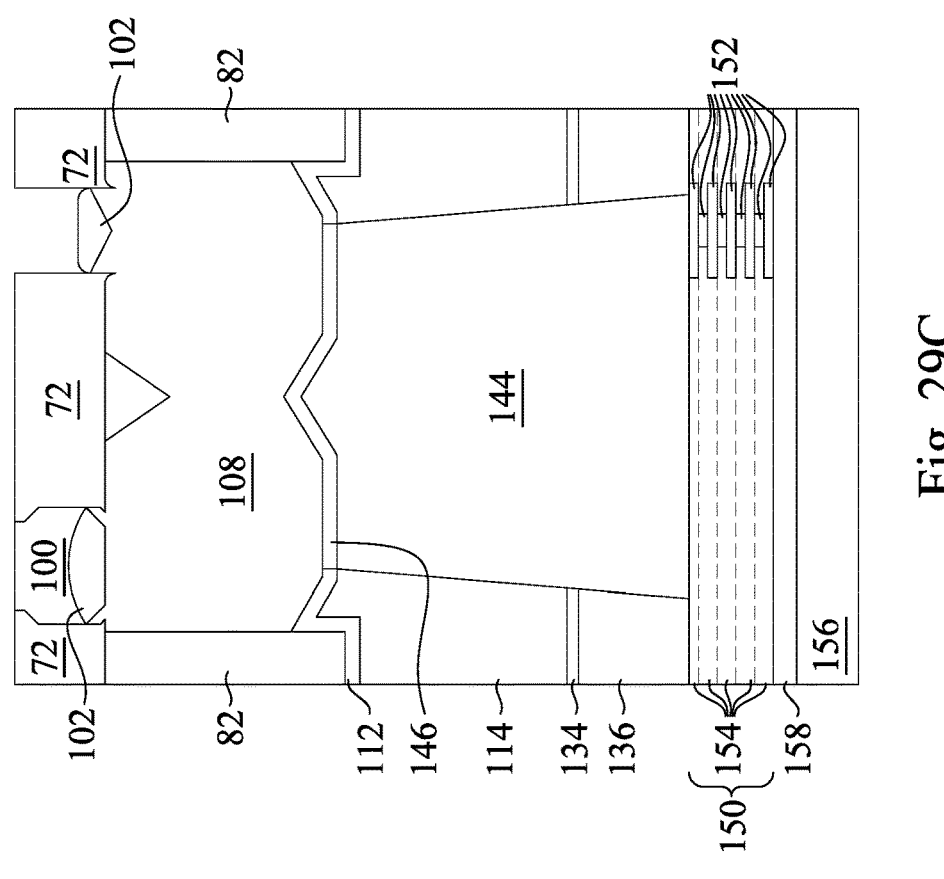
Figure 29B:
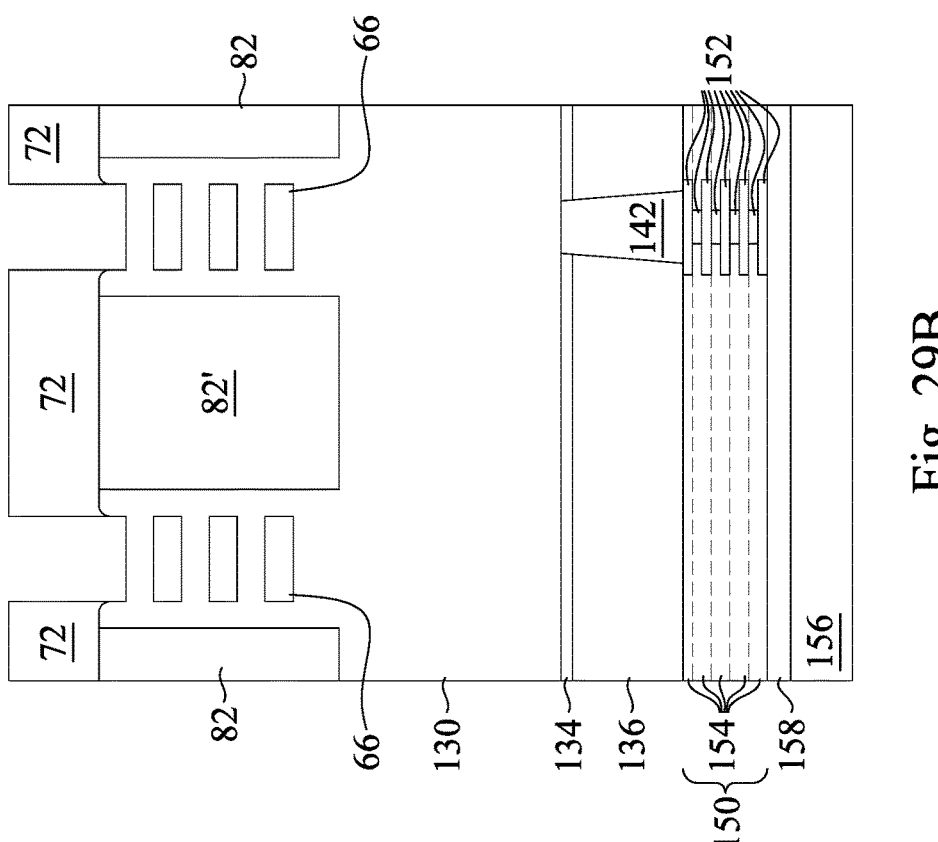

In FIGS. 29A-30C, remaining portions of the semiconductor fins 62 are removed and replaced with a second dielectric layer 162. In FIGS. 29A-C, the semiconductor fins 62 may be etched using a suitable etching process, such as an isotropic etching process (e.g., a wet etching process), an anisotropic etching process (e.g., a dry etching process), or the like. The etching process may be one that is selective to the material of the semiconductor fins 62 (e.g., etches the material of the semiconductor fins 62 at a faster rate than the material of the STI regions 72, the gate structures 130, the epitaxial source/drain regions 108, and the dummy epitaxial materials 100, 102). After etching the semiconductor fins 62, surfaces of the STI regions 72, the gate structures, and the dummy epitaxial materials 100, 102 may be exposed. The dummy epitaxial materials 100, 102 may mask and protect the epitaxial source/drain regions 108 during the removal of the substrate 50 and the semiconductor fins 62.

Figure 30A:
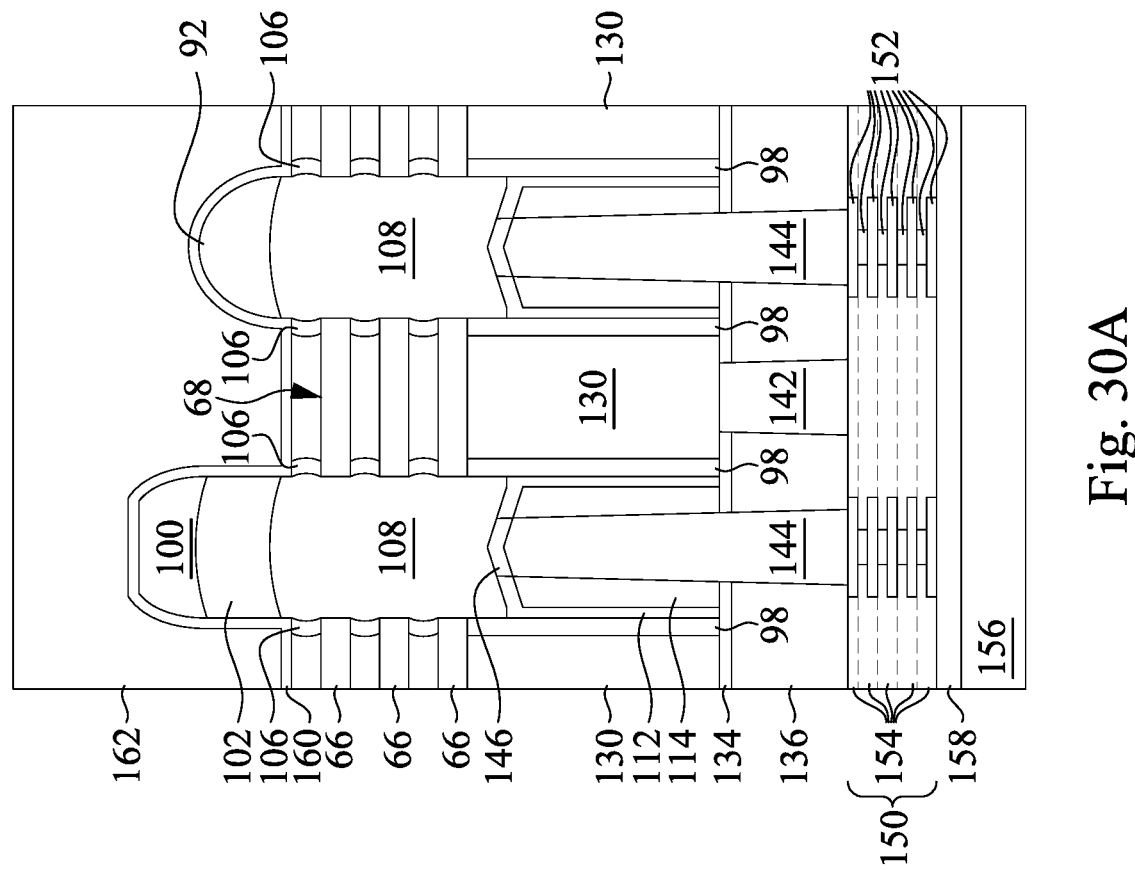
Figures 30B, 30C:
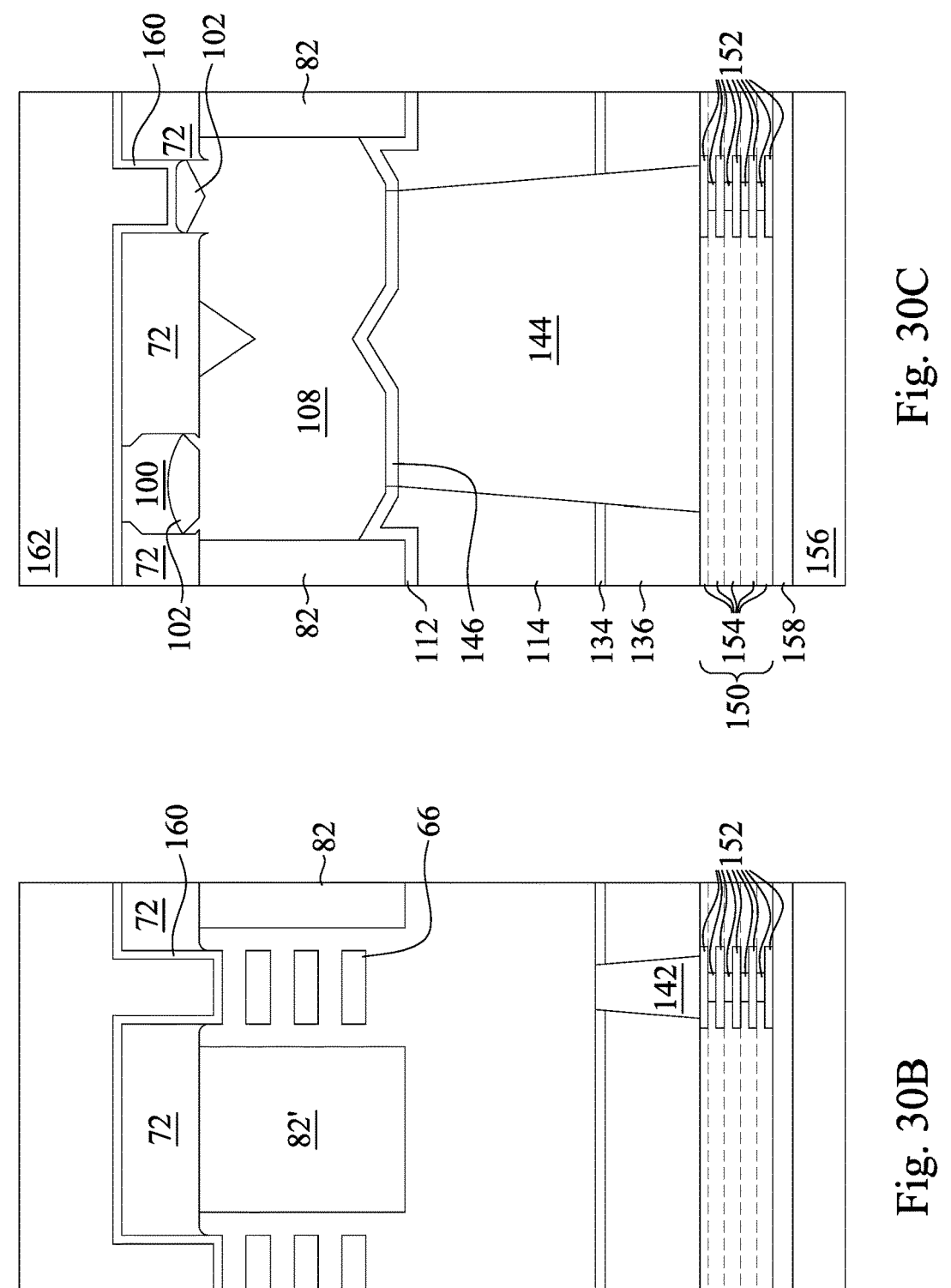
Figure 31A:
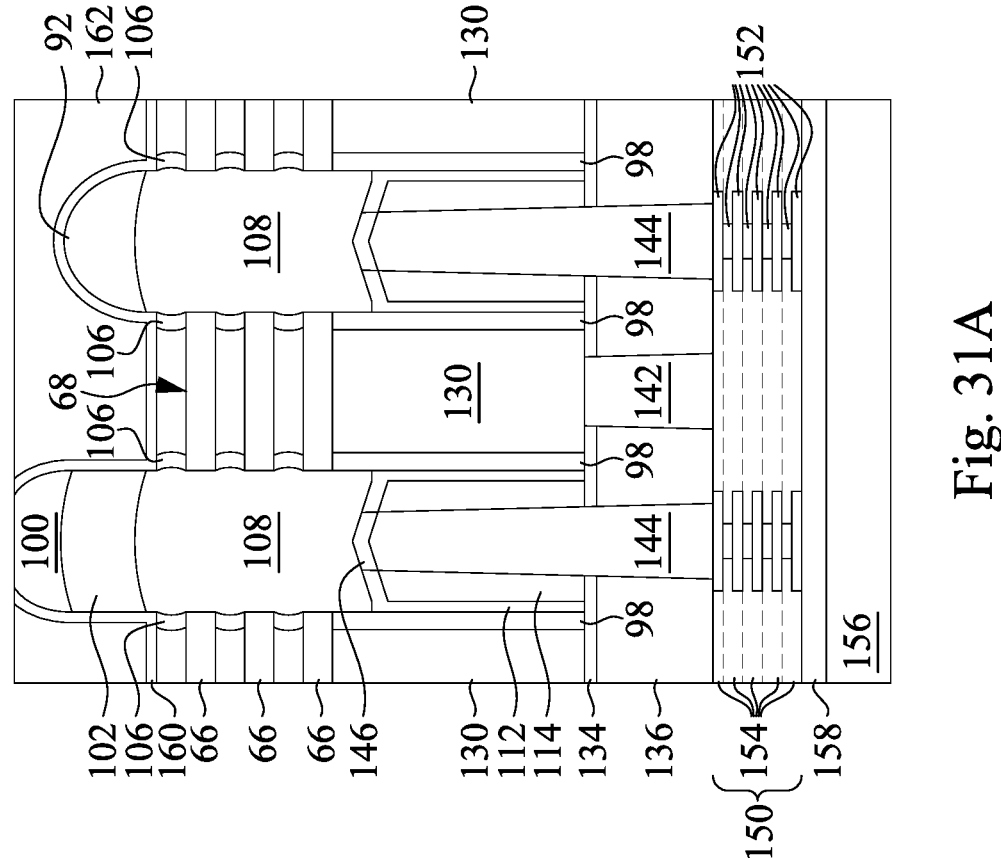
Figure 31C:
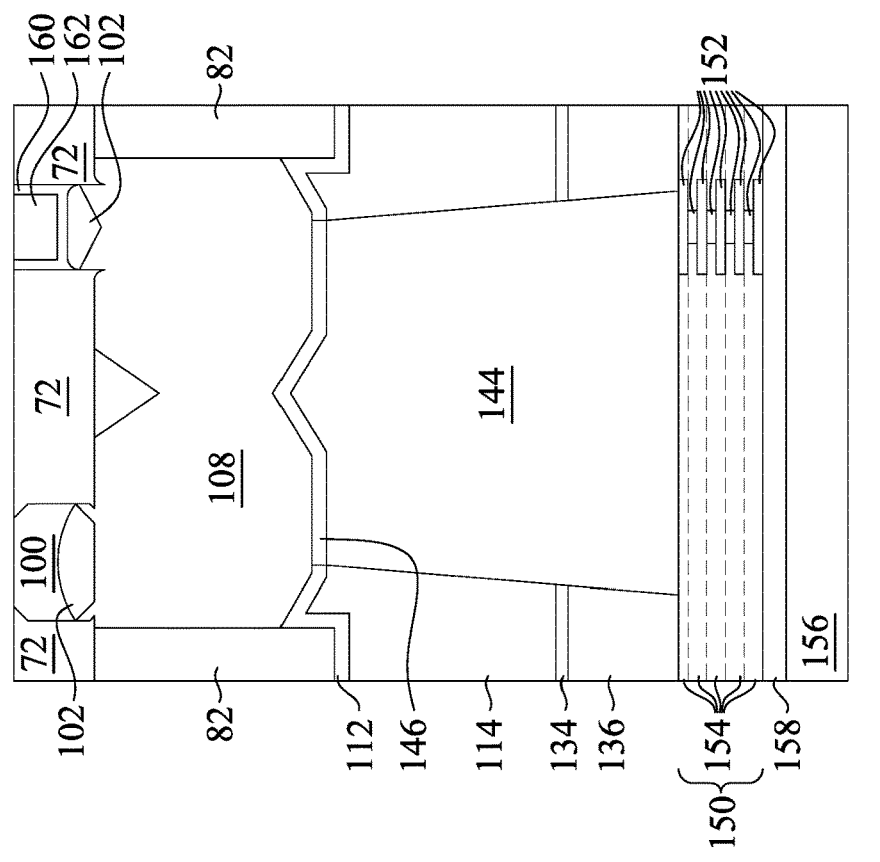
Figure 31B:
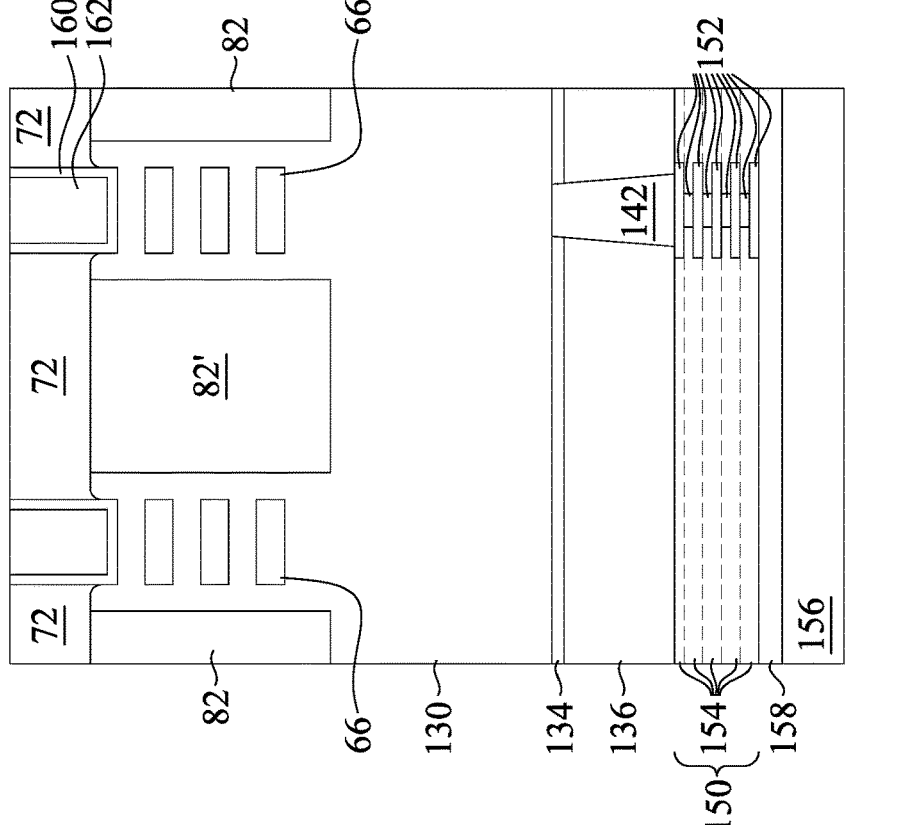

In FIGS. 30A-C, a dielectric liner 160 and the second dielectric layer 162 are then deposited on the backside of the transistor structures 140 in recesses formed by removing the semiconductor fins 62 and the substrate 50. The dielectric liner and the second dielectric layer 162 may be sequentially deposited over the STI regions 72, the gate structures 130, and the epitaxial source/drain regions 108. The dielectric liner 160 may comprise a similar material as the CESL 134, and the second dielectric layer 162 may be substantially similar to the second ILD 136, described above with respect to FIGS. 18A through 18C. For example, the dielectric liner 160 may be formed of a like material and using a like process as the CESL 134, and the second dielectric layer 162 may be formed of a like material and using a like process as the second ILD 136. After deposition, a CMP process or the like may be used to remove material of the liner 160 and the second dielectric layer 162 such that top surfaces of the second dielectric layer 162 are level with top surfaces of the STI regions 72 and the dummy epitaxial materials 100 as illustrated by FIGS. 31A-C.

Figure 32A:
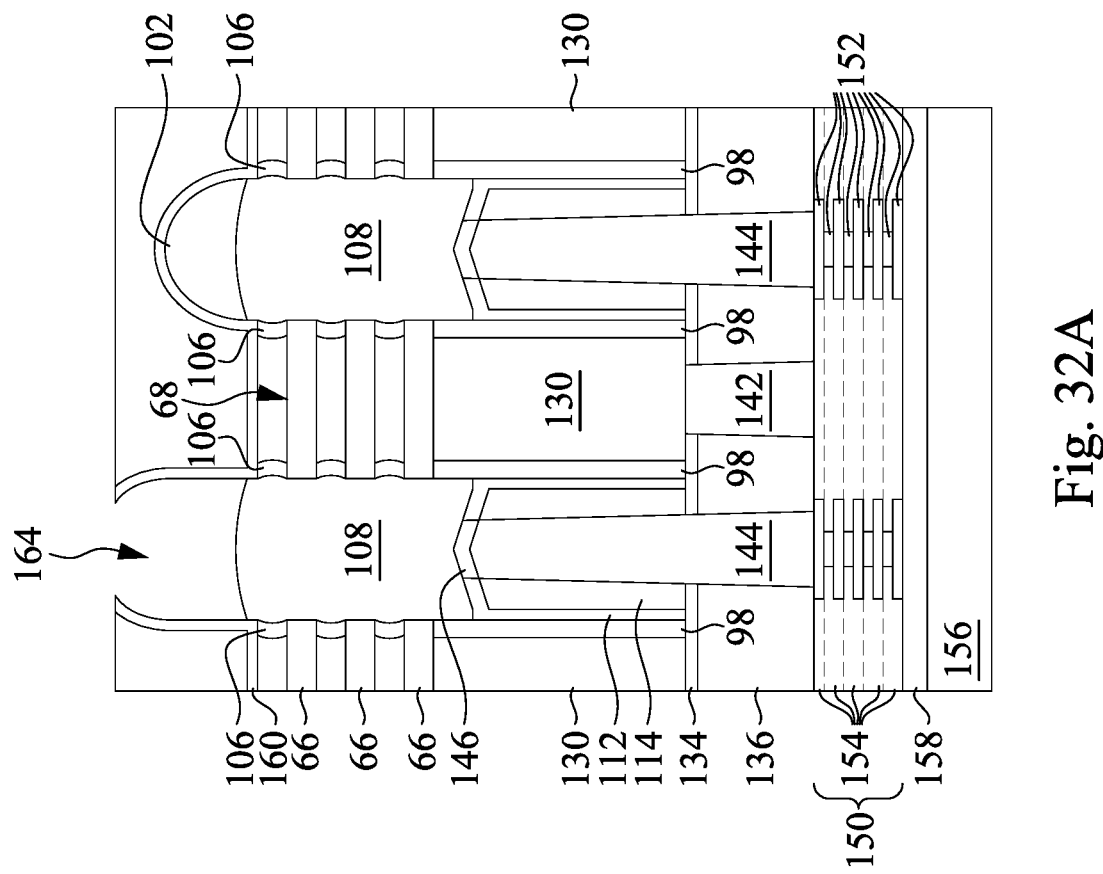
Figure 32C:
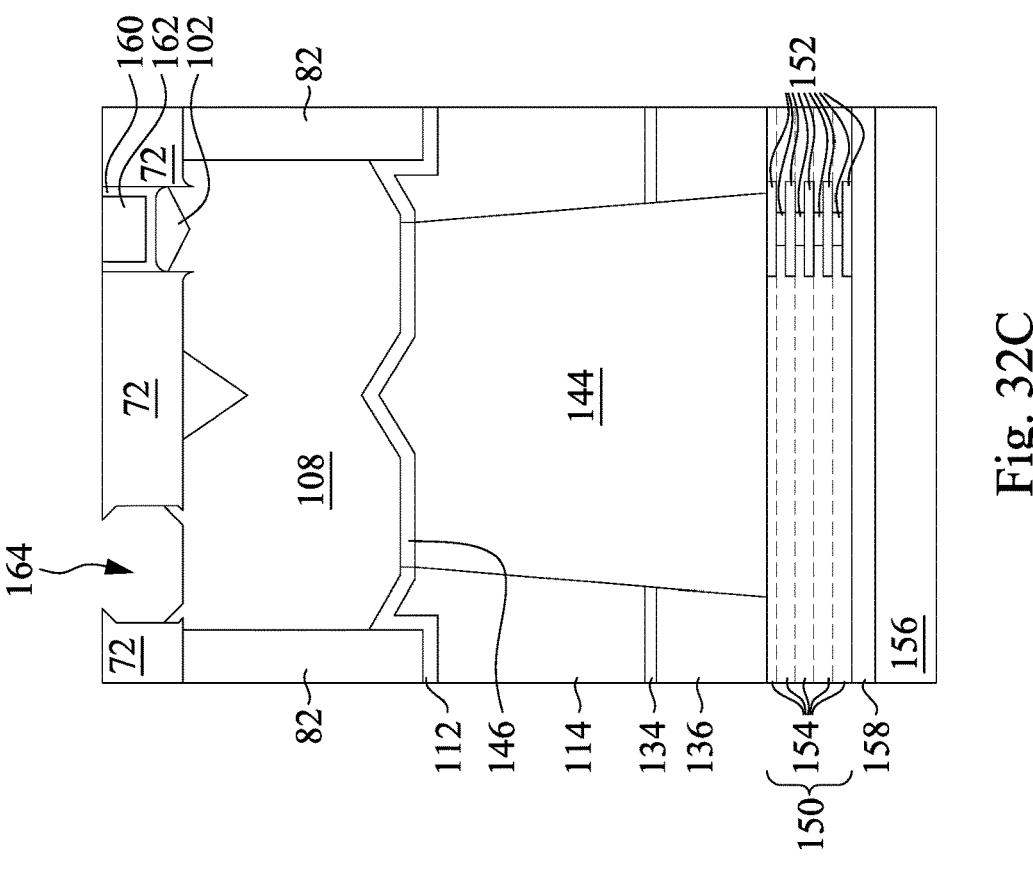
Figure 32B:
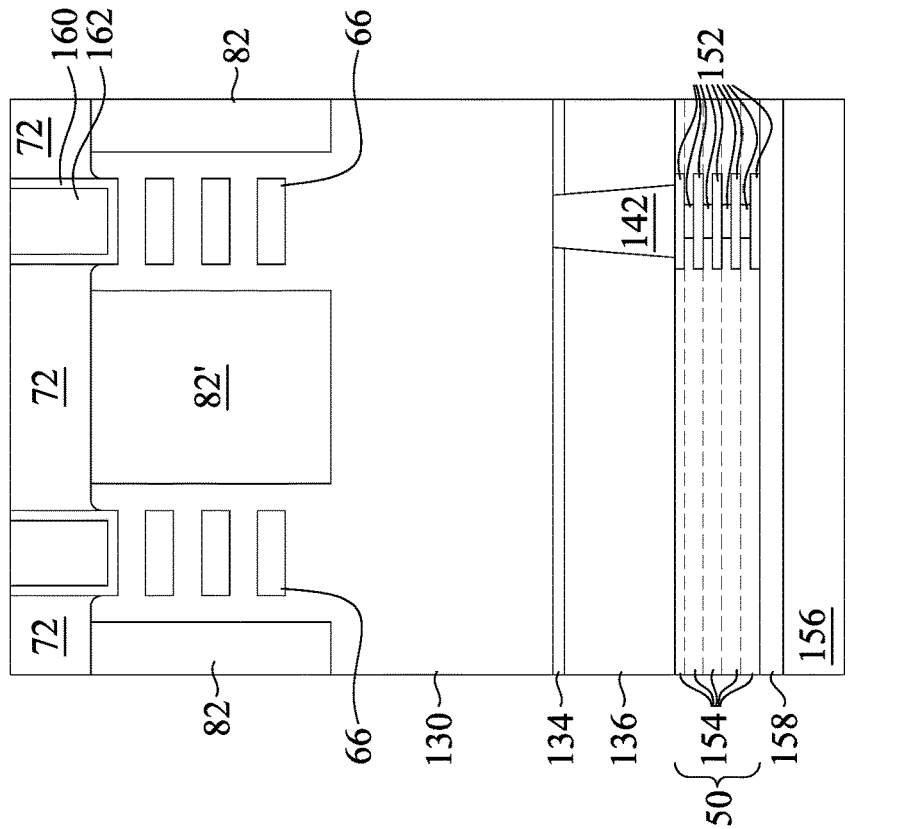

In FIGS. 32A-C, the dummy epitaxial materials 100, 102 are removed to form recesses 164. The dummy epitaxial materials 100, 102 may be removed by a suitable etching process, which may be an isotropic etching process, such as a wet etching process. The etching process may have a high etch selectivity to materials of the dummy epitaxial materials 100, 102. As such, the dummy epitaxial materials 100, 102 may be removed without significantly removing materials of the liner 160, the second dielectric layer 162, the STI regions 72, or the epitaxial source/drain regions 108. The recesses 164 may expose sidewalls of the STI regions 72, backside surfaces of the epitaxial source/drain regions 108, and sidewalls of liner 160.

Figure 33A:
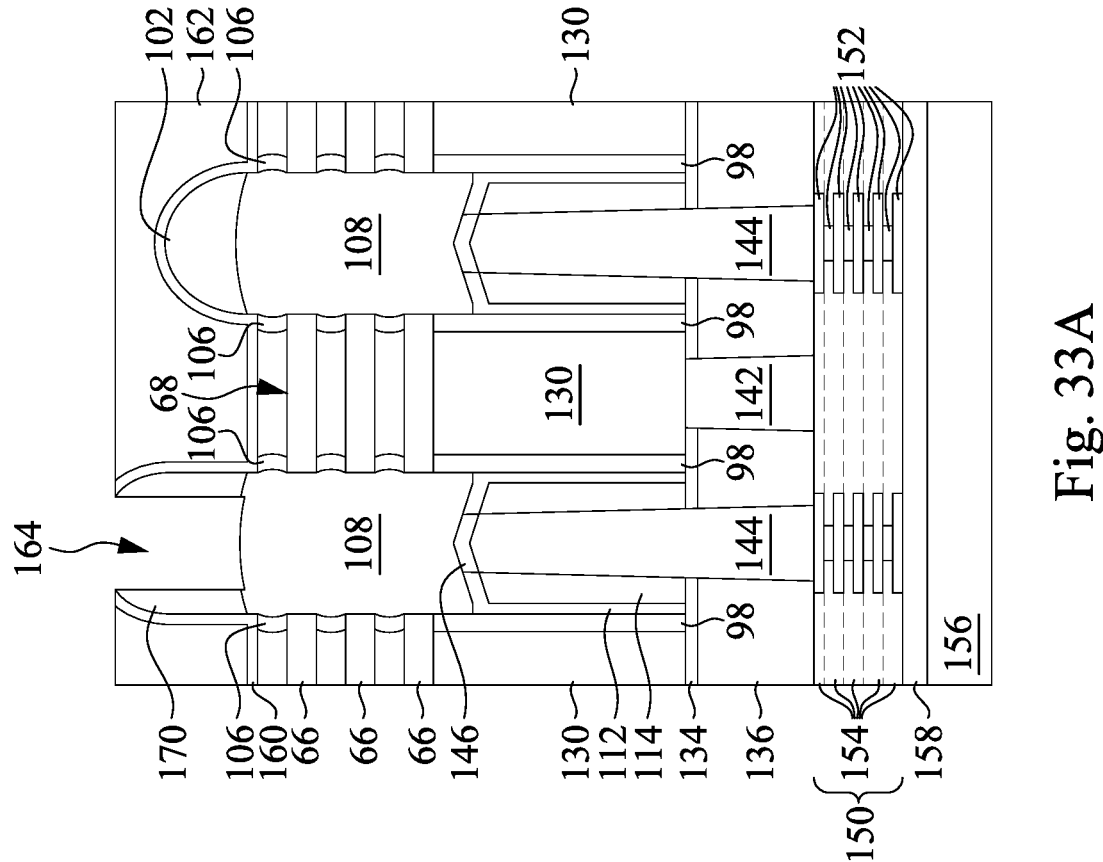
Figures 33B, 33C:
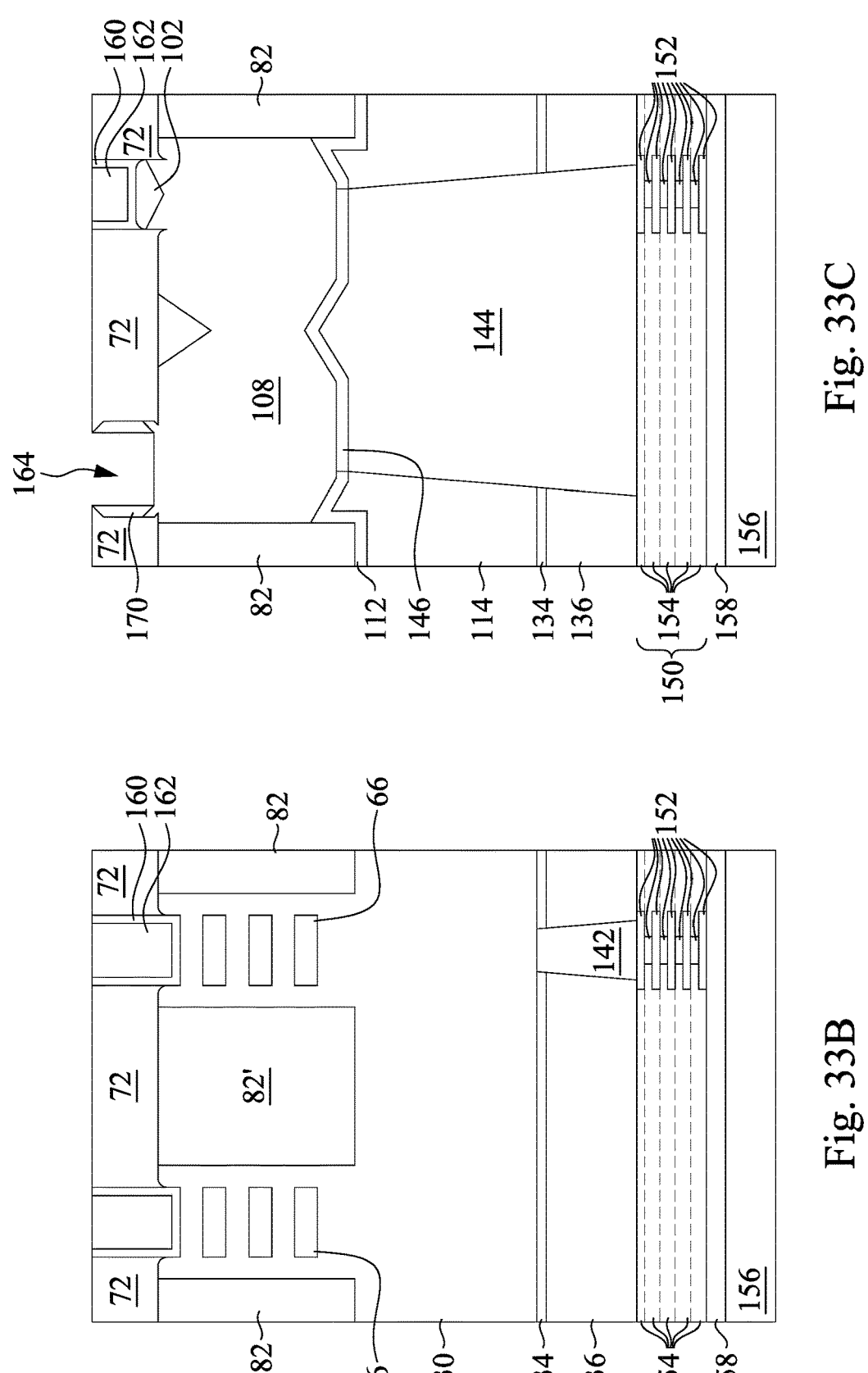

In FIGS. 33A-C, sidewall spacers 170 may be formed on sidewalls of the recesses 164. The sidewall spacers 170 may comprise a dielectric material, such as silicon oxide, silicon nitride, silicon oxynitride, silicon carbide, or the like. The sidewall spacers 170 may provide further insulation and reduce parasitic capacitance of subsequently formed backside source/drain contacts. As an example to form the sidewall spacers 170, a spacer layer may be deposited along sidewalls and a bottom surface of the recesses 164 using a suitable deposition process such as CVD, ALD, PVD, or the like. Subsequently, an anisotropic etching process may be used to remove lateral portions of the spacer layer, thereby forming the sidewalls spacers 170. The anisotropic etching process may include a dry etching process or the like as an example.

Figure 34A:
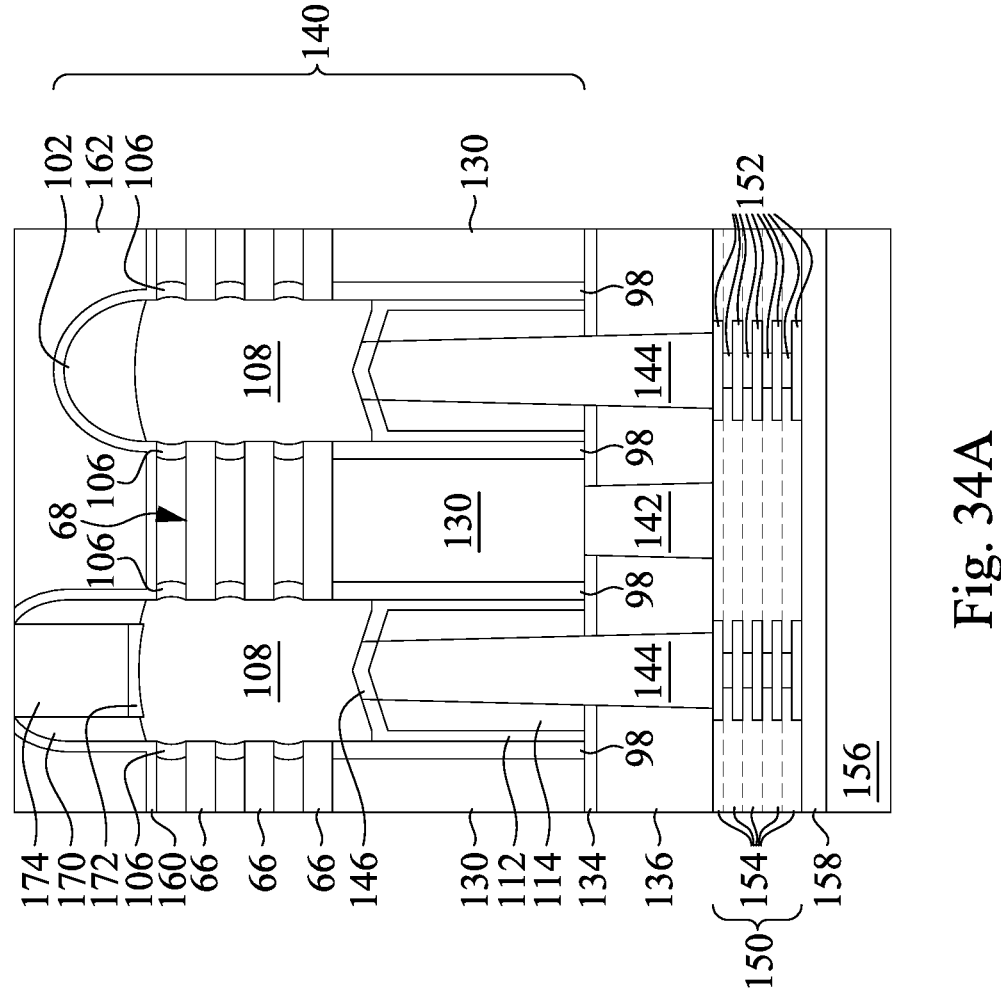
Figures 34B, 34C:
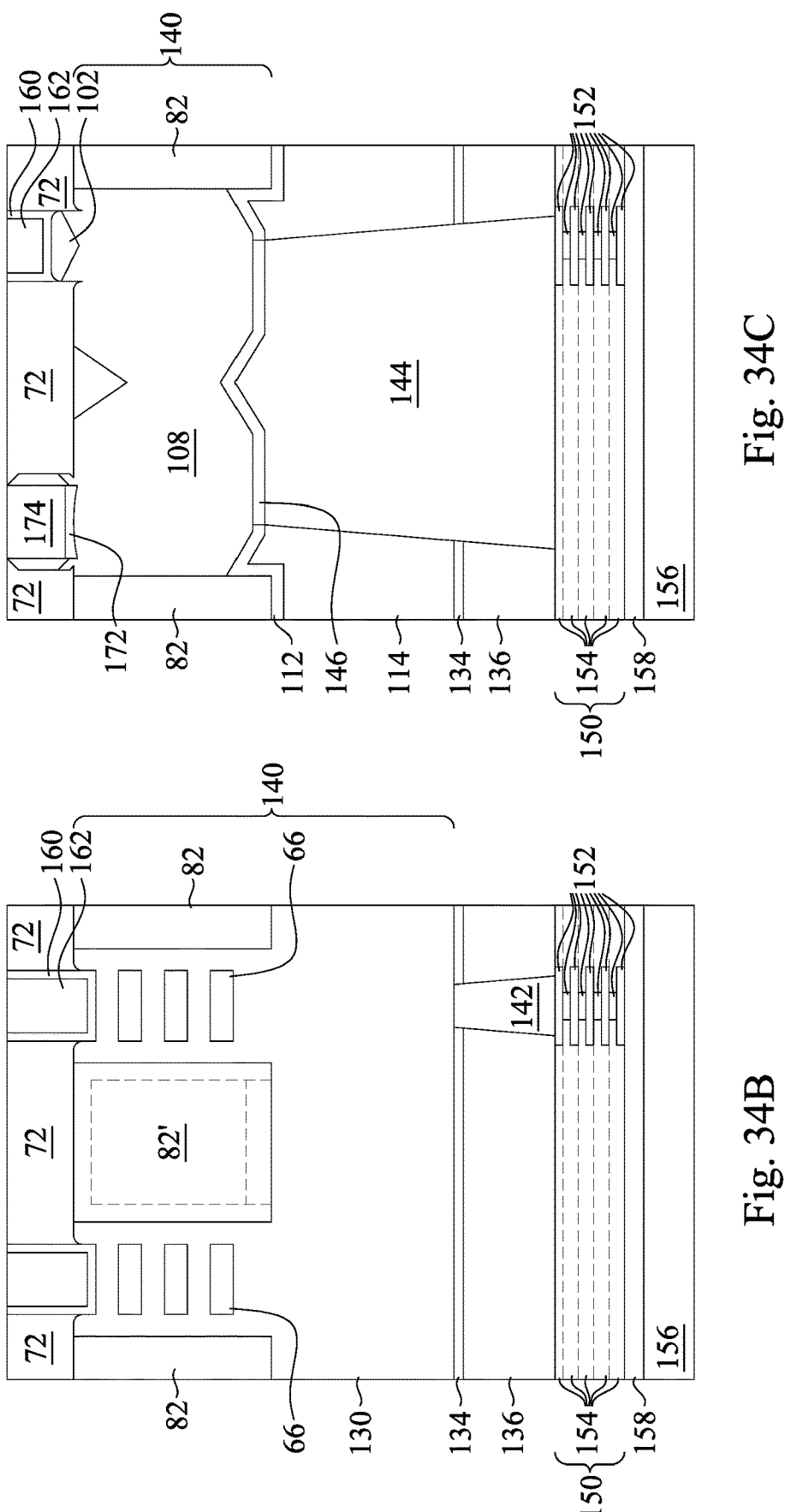

In FIGS. 34A-C, silicide regions 172 may then be formed in the recesses 164 on backsides of the epitaxial source/drain regions 108. The silicide regions 172 may be similar to the silicide regions 146, described above with respect to FIGS. 25A-C. For example, the second silicide regions 172 may be formed of a like material and using a like process as the first silicide regions 146.

Further, backside source/drain contacts 174 are formed in the recesses 164. The backside source/drain contacts 174 may extend through the dielectric layer 162 and the STI regions 72 and may be electrically coupled to the epitaxial source/drain regions 108 through the second silicide regions 172. The backside source/drain contacts 174 may be similar to the source/drain contacts 144, described above with respect to FIGS. 25A-C. For example, the backside source/drain contacts 174 may be formed of a like material and using a like process as the source/drain contacts 144. In various embodiments, contact resistance may be reduced without increasing a size of the backside source/drain contacts 174 by providing a merged epitaxial source/drain configuration, which reduces both epitaxy resistance and front-side contact resistance in the transistor device.

Figure 35A:
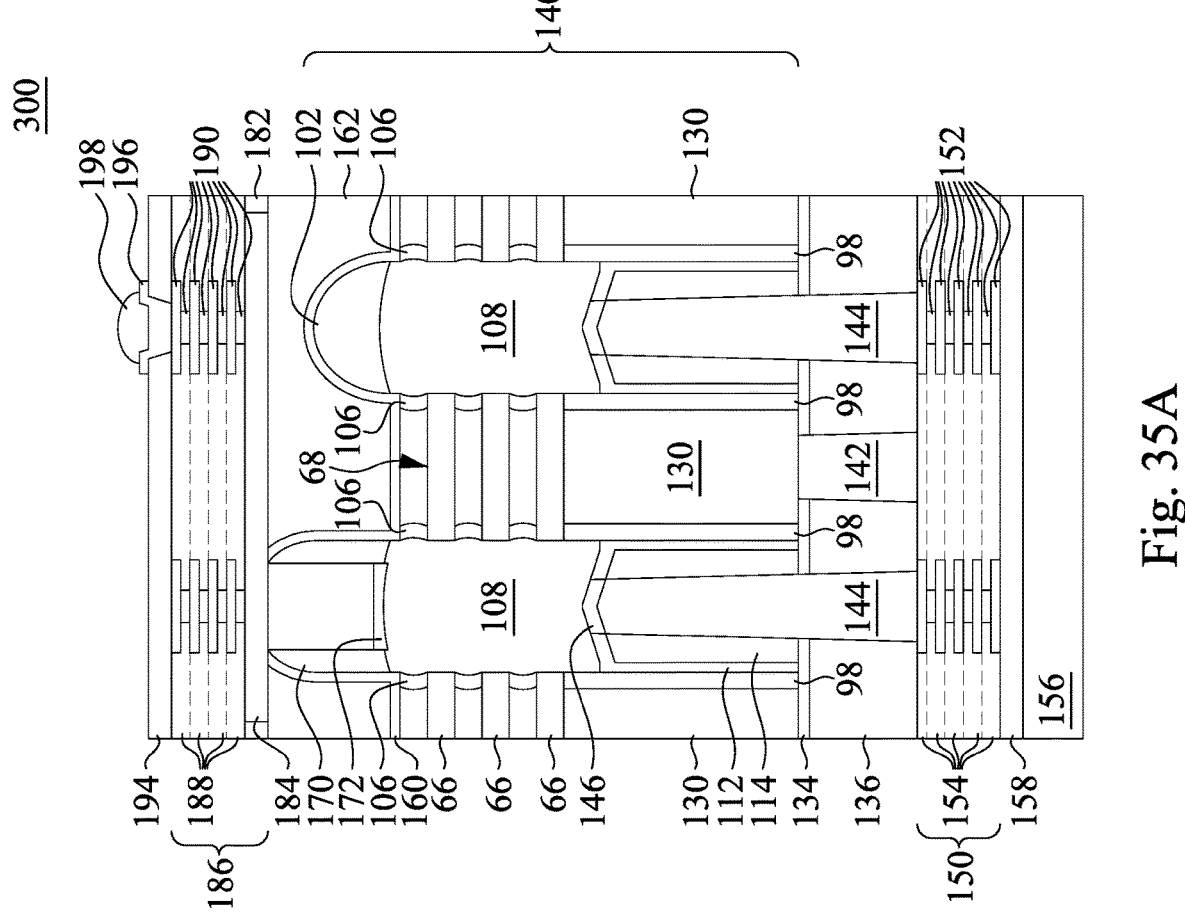
Figures 35B, 35C:
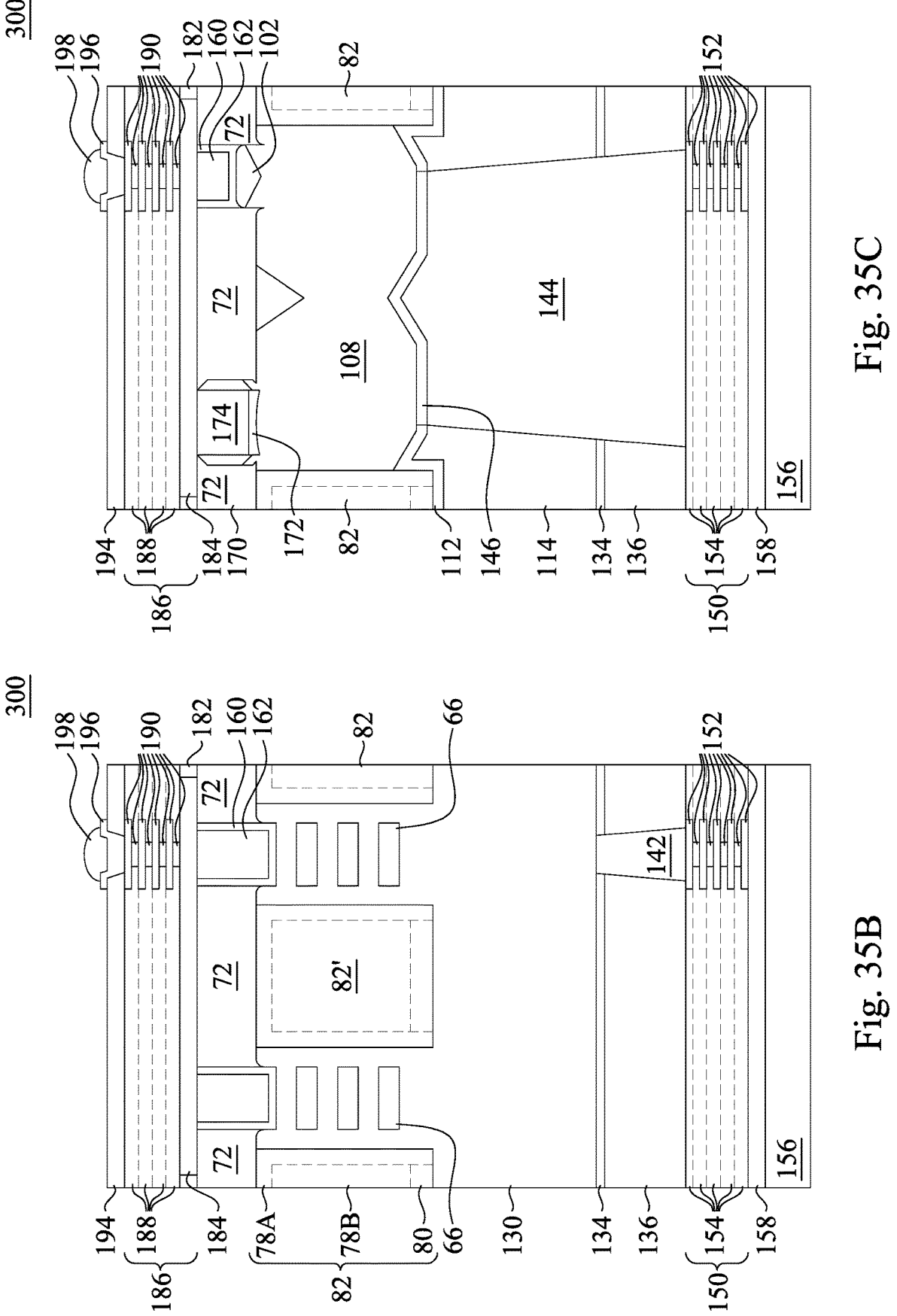

In FIGS. 35A-C, conductive lines 184 and a third dielectric layer 182 are formed over the second dielectric layer 162, the STI regions 72, and the backside source/drain contacts 174. The third dielectric layer 182 may be similar to the second dielectric layer 162. For example, third dielectric layer 182 may be formed of a like material and using a like process as the second dielectric layer 162.

The conductive lines 184 are formed in the third dielectric layer 182. Forming the conductive lines 184 may include patterning recesses in the third dielectric layer 182 using a combination of photolithography and etching processes, for example. A pattern of the recesses in the third dielectric layer 182 may correspond to a pattern of the conductive lines 184. The conductive lines 184 are then formed by depositing a conductive material in the recesses. In some embodiments, the conductive lines 184 comprise a metal layer, which may be a single layer or a composite layer comprising a plurality of sub-layers formed of different materials. In some embodiments, the conductive lines 184 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/ adhesion layer include titanium, titanium nitride, titanium oxide, tantalum, tantalum nitride, titanium oxide, or the like. The conductive lines 184 may be formed using, for example, CVD, ALD, PVD, plating or the like. The conductive lines 184 are physically and electrically coupled to the epitaxial source/drain regions 108 through the backside source/drain contacts 174 and the second silicide regions 172. A planarization process (e.g., a CMP, a grinding, an etch-back, or the like) may be performed to remove excess portions of the conductive lines 184 formed over the third dielectric layer 182.

In some embodiments, the conductive lines 184 are power rails, which are conductive lines that electrically connect the epitaxial source/drain regions 108 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 150 may be increased. Further, the backside of the semiconductor die may accommodate wider power rails, reducing resistance and increasing efficiency of power delivery to the nano-FETs. For example, a width of the conductive lines 184 may be at least twice a width of first level conductive lines (e.g., first conductive features 122) of the front-side interconnect structure 150.

Also illustrated in FIGS. 35A-C, remaining portions of a backside interconnect structure 186 are formed over the third dielectric layer 182 and the conductive lines 184. The backside interconnect structure 186 may be referred to as a backside interconnect structure because it is formed on a backside of the transistor structures 140 (e.g., a side of the transistor structures 140 opposite the front-side interconnect structure 150). The backside interconnect structure 186 may comprise the dielectric layer 162, the dielectric layer 182, the backside source/drain contacts 174, and the conductive lines 184. The backside interconnect structure 186 may further comprise stacked conductive features 190 formed in fourth dielectric layers 188. In various embodiments, the conductive features 190 and the dielectric layers 188 may be formed of a like material and using like processes as the conductive features 152 and the dielectric layers 154, respectively. The conductive features 190 may include routing lines (e.g., for routing to and from subsequently formed contact pads and external connectors). The conductive features 190 may further be patterned to include one or more embedded passive devices such as, resistors, capacitors, inductors, or the like. The conductive lines 190 may be integrated with the conductive lines 184 (e.g., a power rail) to provide circuits (e.g., power circuits) on the backside of the transistor devices 140.

A passivation layer 194, UBMs 196, and external connectors 198 are formed over the backside interconnect structure 186. The passivation layer 194 may comprise polymers such as PBO, polyimide, BCB, or the like. Alternatively, the passivation layer 194 may include non-organic dielectric materials such as silicon oxide, silicon nitride, silicon carbide, silicon oxynitride, or the like. The passivation layer 194 may be deposited by, for example, CVD, PVD, ALD, or the like.

The UBMs 196 are formed through the passivation layer 194 to the conductive lines 190 in the backside interconnect structure 186 and external connectors 198 are formed on the UBMs 196. The UBMs 196 may comprise one or more layers of copper, nickel, gold, or the like, which are formed by a plating process, or the like. The external connectors 198 (e.g., solder balls) are formed on the UBMs 196. The formation of the external connectors 198 may include placing solder balls on exposed portions of the UBMs 196 and reflowing the solder balls. In some embodiments, the formation of the external connectors 198 includes performing a plating step to form solder regions over the topmost conductive lines of the conductive features 190 and then reflowing the solder regions. The UBMs 196 and the external connectors 198 may be used to provide input/output connections to other electrical components, such as, other device dies, redistribution structures, printed circuit boards (PCBs), motherboards, or the like. The UBMs 196 and the external connectors 198 may also be referred to as backside input/output pads that may provide signal, supply voltage, and/or ground connections to the nano-FETs described above. Thus, a device 300 comprising a transistor devices 140, a front-side interconnect structure 150, and a backside interconnect structure 186 is formed.

Figure 36A:
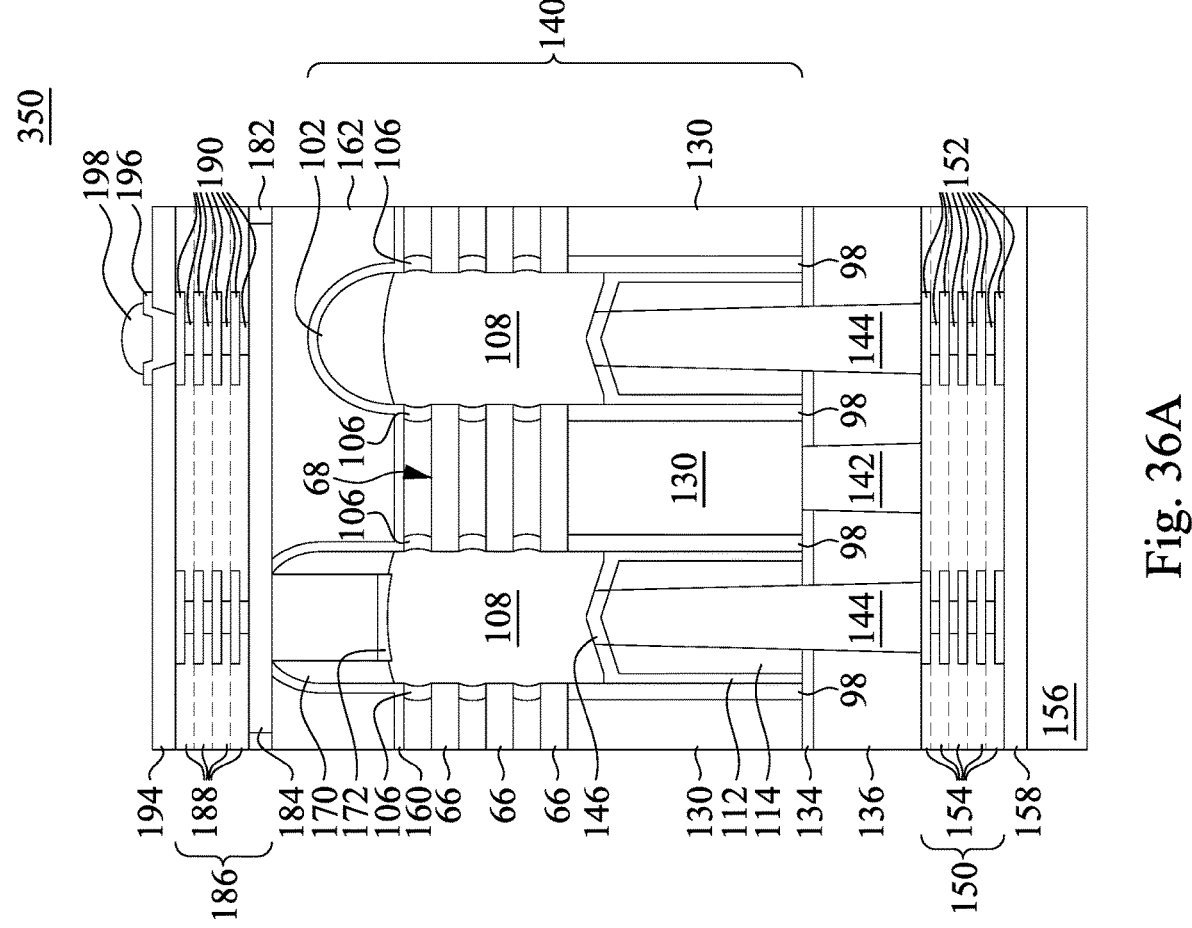
FIGS. 36A, 36B, 36C, and 36D are cross-sectional views of nano-FET devices and interconnect structures in accordance with some embodiments.
Figures 36B, 36C:
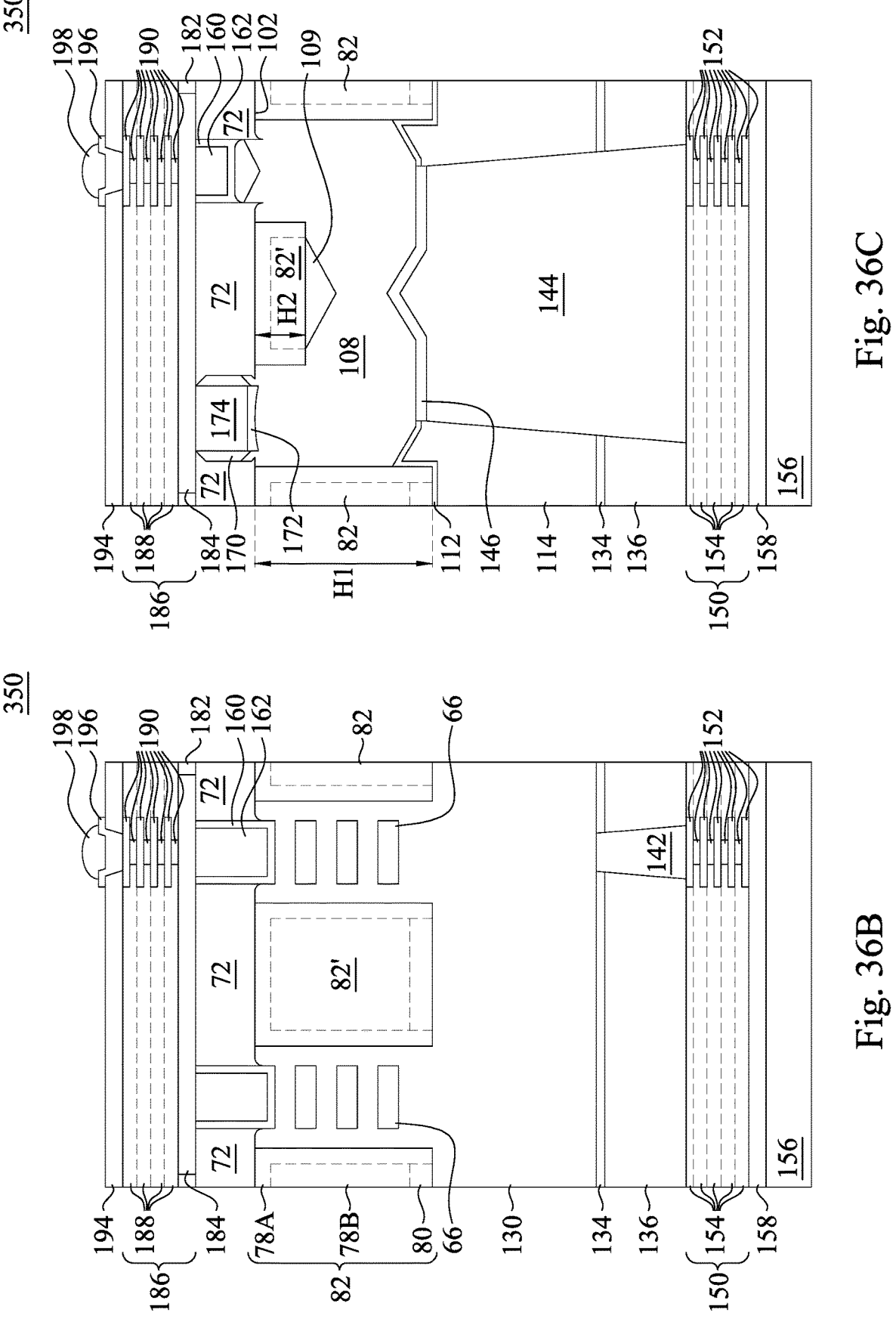
Figure 36D:
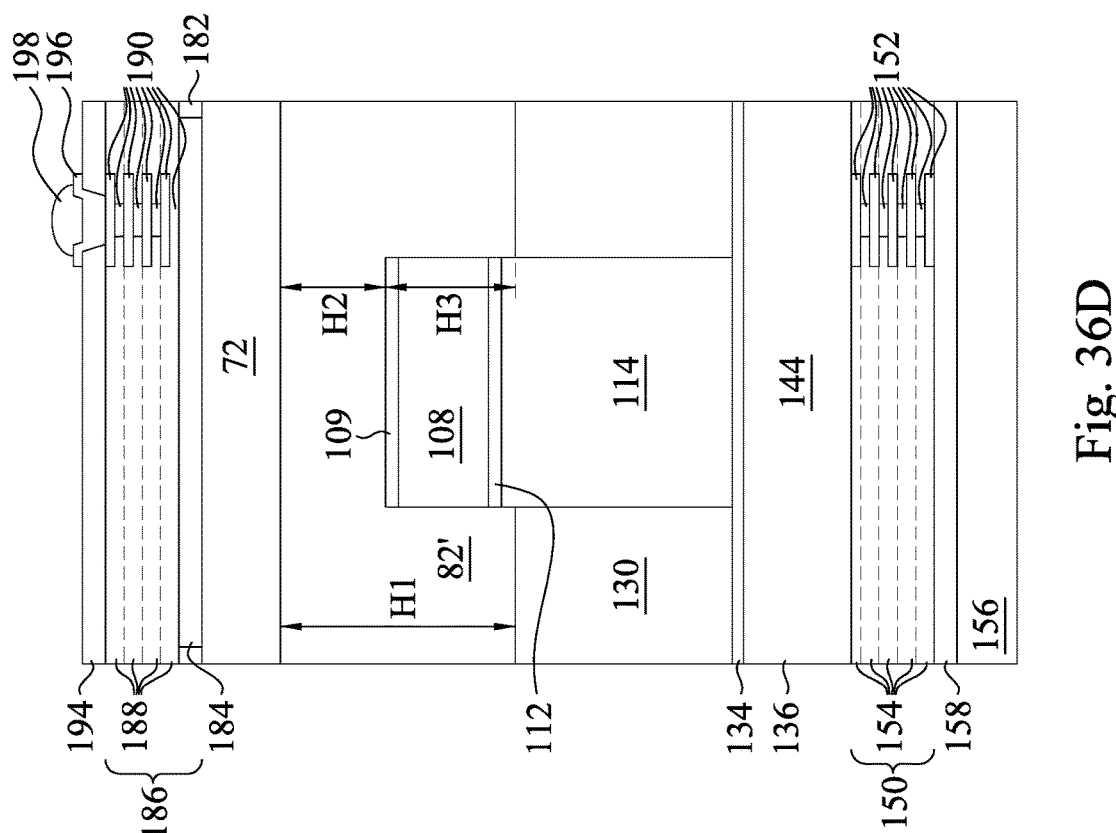

FIG. 36A-D illustrate cross-sectional views of a device 350 according to some alternative embodiments. FIG. 36A is a cross-sectional view illustrated along a similar cross-section as reference cross-section A-A' in FIG. 1. FIG. 36B is a cross-sectional view illustrated along a similar cross-section as reference cross-section B-B' in FIG. 1. FIG. 36C is a cross-sectional view illustrated along a similar cross-section as reference cross-section C-C' in FIG. 1. FIG. 36D is a cross-sectional view illustrated along a similar cross-section as reference cross-section D-D' in FIG. 1. Device 350 may be substantially similar to the device 300 where like reference numerals indicate like elements formed by like processes. However, in the device 350, the insulating fins 82' are not completely removed from the cross-section C-C'. Rather, the insulating fins 82' may be patterned such that a height of the insulating fins 82' may be reduced by a height H3 to a height H2 in the cross-section C-C'. The height H3 may be may be at least 50% of a full height H1 of the insulating fins 82/the patterned insulating fins 82'. For example, the insulating fins 82' may have a first region overlapping the gate stacks 130 and having the height H1, and the insulating fins 82' may further have a second region overlapping the epitaxial source/drain regions 108 and having the height H2. A ratio of the height H1 to a height H2 may be at least 2 to 1. By reducing a height of the insulating fins 82' in a location where the epitaxial source/drain regions 108 are formed, merged epitaxial source/drain regions 108 may still be formed across the insulating fin 82'. In some embodiments, an air gap 109 may be disposed between lateral surfaces of the epitaxial source/drain region 108 and the insulating fins 82'. As a result, epitaxy resistance and contact resistance may be advantageously reduced.

In various embodiments, backside source/drain contacts are made to electrically connect source/drain regions with an interconnect structure on a backside of a semiconductor chip. The backside interconnect structure may be routed for power supply lines and electrical ground lines with improved electrical performance. Insulating fins may be disposed between source/drain regions for source/drain profile control and to keep adjacent source/drain regions separate. Further, select insulating fins may be patterned prior to forming the source/drain regions so that merged source/drain regions may also be formed. As a result, device resistance can be reduced even when the backside contact has a relatively limited contact area.

In various embodiments, a semiconductor device includes a device layer comprising: a channel region; a gate stack over and along sidewalls of the channel region and a first insulating fin; and an epitaxial source/drain region adjacent the channel region. The epitaxial source/drain region extends through the first insulating fin. The semiconductor device further includes a front-side interconnect structure on a first side of the device layer; and a backside interconnect structure on a second side of the device layer opposite the first side of the device layer, wherein the backside interconnect structure comprises a backside source/drain contact that is electrically connected to the epitaxial source/drain region. Optionally, in some embodiments, the insulating fin comprises a first region overlapping the gate stack; and a second region overlapping the epitaxial source/drain region, wherein a height of the first region is greater than a height of the second region. Optionally, in some embodiments, a ratio of the height of the first region to the height of the second region is at least 2 to 1. Optionally, in some embodiments, the semiconductor device further includes a second insulating fin, wherein the gate stack is disposed along a top surface and first sidewalls of the second insulating fin; and a third insulating fin, wherein the gate stack is disposed along a top surface and first sidewalls of the third insulating fin, and wherein the epitaxial source/drain region extends from a second sidewall of the second insulating fin, through the first insulating fin, and to a second sidewall of the third insulating fin. Optionally, in some embodiments, the epitaxial source/drain region comprises: a first epitaxy region comprising a first facet; and a second epitaxy region comprising a second facet, wherein the second facet is merged with the first facet. Optionally, in some embodiments, the front-side interconnect structure comprises a source/drain contact electrically connected to the epitaxial source/drain region, wherein the source/drain contact overlaps the first epitaxy region and the second epitaxy region. Optionally, in some embodiments, wherein the first insulating fin comprises: a first dielectric material; a dielectric liner on sidewalls and a bottom surface of the first dielectric material; and a capping layer over the first dielectric material.

In various embodiments, a semiconductor device includes a first insulating fin and a second insulating fin; a gate electrode over and along sidewalls of the first insulating fin and the second insulating fin; a source/drain region between the first insulating fin and the second insulating fin, wherein the source/drain region comprises: a first epitaxy region comprising a first facet; and a second epitaxy region comprising a second facet merged with the first facet; a front-side source/drain contact electrically connected the source/drain region; and a backside source/drain contact electrically connected to the source/drain region, wherein source/drain region is disposed between the backside source/drain contact and the front-side source/drain contact. Optionally, in some embodiments, the semiconductor device further includes a third insulating fin between the first insulating fin and the second insulating fin, wherein the source/drain region extends between a first portion of the third insulating fin and a second portion of the third insulating fin. Optionally, in some embodiments, the first portion of the third insulating fin is connected to the second portion of the third insulating fin by a third portion of the third insulating fin, wherein a height of the third portion of the third insulating fin is less than a height of the first portion of the third insulating fin. Optionally, in some embodiments, a ratio of the height of the first portion of the third insulating fin to the height of the third portion of the third insulating fin is in a range of 2 to 1. Optionally, in some embodiments, the semiconductor device further includes a plurality of nanostructures adjacent the source/drain region, wherein the gate electrode surrounds each of the plurality of nanostructures.

In some embodiments, a method includes forming a shallow trench isolation (STI) region between a first semiconductor fin and a second semiconductor fin; forming a first insulating fin over the STI region; forming a dummy gate over the first semiconductor fin and a first portion of the first insulating fin; etching a first recess in a second portion of the first insulating fin; etching a second recess in the first semiconductor fin and a third recess in the second semiconductor fin, wherein the first recess connects the second recess to the third recess; and epitaxially growing a source/drain region in the first recess, the second recess, and the third recess. Optionally, in some embodiments, the method further includes forming a front-side source/drain contact electrically connected to the source/drain region; and forming a backside source/drain contact electrically connected to the source/drain region, wherein the source/drain region is disposed between the front-side source/drain contact and the backside source/drain contact. Optionally, in some embodiments, A the first recess extends completely through the first insulating fin. Optionally, in some embodiments, the first recess only extends partially through the first insulating fin. Optionally, in some embodiments, wherein a height of the first recess is at least half of a height of the first portion of the first insulating fin. Optionally, in some embodiments, the method further includes forming a second insulating fin, wherein the first semiconductor fin is disposed between the first insulating fin and the second insulating fin; and forming a third insulating fin, wherein the second semiconductor fin is disposed between the first insulating fin and the third insulating fin, and wherein epitaxially growing the source/drain region comprises epitaxially growing the source/drain region so that the source/drain region extends from a first sidewall of the second insulating fin a second sidewall of the third insulating fin. Optionally, in some embodiments, epitaxially growing the source/drain region comprises: epitaxially growing a first epitaxy region in the second recess; epitaxially growing a second epitaxy region in the third recess; and merging the first epitaxy region with the second epitaxy region in the first recess. Optionally, in some embodiments, the first semiconductor fin is spaced a first distance apart from the second semiconductor fin, and wherein a ratio of a width of the first semiconductor fin to the first distance is in a range of 2 to 4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a device layer comprising:
    a channel region;
    a gate stack over and along sidewalls of the channel region, the gate stack overlapping an upper surface and extending along sidewalls of a first insulating fin in a cross-sectional view, wherein the gate stack extends continuously from a topmost surface of the first insulating fin to a bottommost surface of the first insulating fin in the cross-sectional view; and an epitaxial source/drain region adjacent the channel region, wherein the epitaxial source/drain region extends through the first insulating fin;

a front-side interconnect structure on a first side of the device layer; and a backside interconnect structure on a second side of the device layer opposite the first side of the device layer, wherein the backside interconnect structure comprises a backside source/drain contact that is electrically connected to the epitaxial source/drain region, wherein the first insulating fin comprises:

a first region overlapped by the gate stack; and a second region overlapped by the epitaxial source/drain region, wherein a height of the first region is greater than a height of the second region.

2. The semiconductor device of claim 1, wherein a ratio of the height of the first region to the height of the second region is at least 2 to 1.

3. The semiconductor device of claim 1 further comprising:

a second insulating fin, wherein the gate stack is disposed along a top surface and first sidewalls of the second insulating fin; and a third insulating fin, wherein the gate stack is disposed along a top surface and first sidewalls of the third insulating fin, and wherein the epitaxial source/drain region extends from a second sidewall of the second insulating fin, through the first insulating fin, and to a second sidewall of the third insulating fin.

4. The semiconductor device of claim 1, wherein the epitaxial source/drain region comprises:

a first epitaxy region comprising a first facet; and a second epitaxy region comprising a second facet, wherein the second facet is merged with the first facet.

5. The semiconductor device of claim 4, wherein the front-side interconnect structure comprises a source/drain contact electrically connected to the epitaxial source/drain region, wherein the source/drain contact overlaps the first epitaxy region and the second epitaxy region.

6. The semiconductor device of claim 1, wherein the first insulating fin comprises:

a first dielectric material;

a dielectric liner on sidewalls and a bottom surface of the first dielectric material; and a capping layer over the first dielectric material.

7. A semiconductor device comprising:

a first insulating fin, a second insulating fin, and a third insulating fin over an isolation region, the third insulating fin being between the first insulating fin and the second insulating fin;

a gate stack over top surfaces of and extending along sidewalls of the first insulating fin and the second insulating fin, wherein the gate stack further overlaps a first region of the third insulating fin;

a source/drain region between the first insulating fin and the second insulating fin, wherein the source/drain region overlaps a second region of the third insulating fin, wherein a height of the first region of the third insulating fin is greater than a height of the second region of the third insulating fin, and wherein the source/drain region comprises:

a first epitaxy region comprising a first facet; and a second epitaxy region comprising a second facet merged with the first facet;

a front-side source/drain contact electrically connected to the source/drain region; and a backside source/drain contact extending through the isolation region and electrically connected to the source/drain region, wherein the source/drain region is disposed between the backside source/drain contact and the front-side source/drain contact.

8. The semiconductor device of claim 7, wherein a ratio of the height of the first region of the third insulating fin to the height of the second region of the third insulating fin is in a range of 2 to 1.

9. The semiconductor device of claim 7 further comprising a plurality of nanostructures adjacent the source/drain region, wherein the gate stack surrounds each of the plurality of nanostructures.

10. The semiconductor device of claim 7, wherein a bottom surface of the gate stack directly contacts the isolation region.

11. The semiconductor device of claim 7, wherein the source/drain region directly overlaps an upper surface of the isolation region between the first insulating fin and the second insulating fin.

12. The semiconductor device of claim 7, wherein the source/drain region extends from a sidewall of the first region of the third insulating fin to a sidewall of a third region of the third insulating fin, wherein a height of the third region of the third insulating fin is greater than the height of the second region of the third insulating fin.

13. A semiconductor device comprising:

a first plurality of vertically stacked nanostructures;

a second plurality of vertically stacked nanostructures;

a first insulating fin between the first plurality of vertically stacked nanostructures and the second plurality of vertically stacked nanostructures;

a gate stack over and along sidewalls of the first insulating fin, wherein the gate stack extends between the first insulating fin and the first plurality of vertically stacked nanostructures, wherein the gate stack extends between the first insulating fin and the second plurality of vertically stacked nanostructures, the gate stack further being disposed around the first plurality of vertically stacked nanostructures and the second plurality of vertically stacked nanostructures; and a first source/drain region comprising:

a first epitaxy region along sidewalls of the first plurality of vertically stacked nanostructures; and a second epitaxy region along sidewalls of the second plurality of vertically stacked nanostructures, wherein the first epitaxy region is merged with the second epitaxy region, wherein a first portion of the first insulating fin that is under the first source/drain region is shorter than a second portion of the first insulating fin that is under the gate stack.

14. The semiconductor device of claim 13 further comprising a second source/drain region comprising:

a third epitaxy region, wherein the first plurality of vertically stacked nanostructures extends between the first epitaxy region and the third epitaxy region; and a fourth epitaxy region, wherein the second plurality of vertically stacked nanostructures extends between the second epitaxy region and the fourth epitaxy region, wherein the third epitaxy region is merged with the fourth epitaxy region.

15. The semiconductor device of claim 13, further comprising:

a front-side source/drain contact electrically coupled to the first source/drain region, wherein the front-side source/drain contact overlaps the first epitaxy region and the second epitaxy region.

16. The semiconductor device of claim 13 further comprising a backside source/drain contact electrically coupled to the first source/drain region, wherein the backside source/drain contact overlaps the first epitaxy region without overlapping the second epitaxy region.

17. The semiconductor device of claim 13 further comprising:

a second insulating fin and a third insulating fin, wherein the gate stack is disposed over and extends along sidewalls of the second insulating fin and the third insulating fin, and wherein the first source/drain region contacts the second insulating fin and the third insulating fin.

18. The semiconductor device of claim 13, wherein the first source/drain region overlaps the first insulating fin.

19. The semiconductor device of claim 13, wherein a ratio of a height of the first portion of the first insulating fin to a height of the second portion of the first insulating fin is in a range of 2 to 1.

20. The semiconductor device of claim 13 further comprising an air gap between the first portion of the first insulating fin and the first source/drain region.

\* \* \* \* \*